US011631690B2

(12) United States Patent
Okina

(10) Patent No.: US 11,631,690 B2
(45) Date of Patent: Apr. 18, 2023

(54) THREE-DIMENSIONAL MEMORY DEVICE INCLUDING TRENCH-ISOLATED MEMORY PLANES AND METHOD OF MAKING THE SAME

(71) Applicant: SANDISK TECHNOLOGIES LLC, Addison, TX (US)

(72) Inventor: Teruo Okina, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 160 days.

(21) Appl. No.: 17/122,296

(22) Filed: Dec. 15, 2020

(65) Prior Publication Data

US 2022/0189984 A1 Jun. 16, 2022

(51) Int. Cl.
| | | |
|---|---|---|
| H10B 43/50 | (2023.01) | |
| H10B 41/27 | (2023.01) | |
| H10B 41/41 | (2023.01) | |
| H10B 41/50 | (2023.01) | |
| H10B 43/27 | (2023.01) | |

(Continued)

(52) U.S. Cl.
CPC .... *H01L 27/11575* (2013.01); *H01L 23/5226* (2013.01); *H01L 24/08* (2013.01); *H01L 24/80* (2013.01); *H01L 25/0657* (2013.01); *H01L 25/18* (2013.01); *H01L 27/11529* (2013.01); *H01L 27/11548* (2013.01); *H01L 27/11556* (2013.01); *H01L 27/11573* (2013.01); *H01L 27/11582* (2013.01); *H01L 2224/08145* (2013.01); *H01L 2224/80895* (2013.01);

(Continued)

(58) Field of Classification Search
None
See application file for complete search history.

(56) References Cited

U.S. PATENT DOCUMENTS

| 5,555,519 A | 9/1996 | Takashima et al. |
| 5,915,167 A | 6/1999 | Leedy |

(Continued)

FOREIGN PATENT DOCUMENTS

CN 1218960 6/1999

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Telly D Green
(74) *Attorney, Agent, or Firm* — The Marbury Law Group PLLC

(57) ABSTRACT

A three-dimensional memory device includes a first three-dimensional memory plane including first alternating stacks of first insulating layers and first word lines, and first bit lines electrically connected first vertical semiconductor channels, and a second three-dimensional memory plane including second alternating stacks of second insulating layers and second word lines and second bit lines electrically connected to second vertical channels. An inter-array backside trench laterally extend between the first three-dimensional memory plane and the second three-dimensional memory plane, and filled with an inter-array backside insulating material portion that provides electrical isolation between the three-dimensional memory planes.

20 Claims, 41 Drawing Sheets

(51) Int. Cl.
  *H10B 43/40* (2023.01)
  *H01L 25/065* (2023.01)
  *H01L 25/18* (2023.01)
  *H01L 23/00* (2006.01)
  *H01L 23/522* (2006.01)
  *H01L 27/11575* (2017.01)
  *H01L 27/11556* (2017.01)
  *H01L 27/11529* (2017.01)
  *H01L 27/11548* (2017.01)
  *H01L 27/11582* (2017.01)
  *H01L 27/11573* (2017.01)

(52) U.S. Cl.
  CPC ............ *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 5,917,744 A | 6/1999 | Kirihata et al. |
| 5,966,315 A | 10/1999 | Muller et al. |
| 6,829,154 B1 | 12/2004 | Kang |
| 8,760,957 B2 | 6/2014 | Lee et al. |
| 9,633,742 B2 | 4/2017 | Desai et al. |
| 9,786,681 B1 | 10/2017 | Ariyoshi |
| 9,853,038 B1 | 12/2017 | Cui |
| 9,953,992 B1 * | 4/2018 | Ogawa ............... H01L 27/11556 |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,304,852 B1 | 5/2019 | Cui et al. |
| 10,622,367 B1 | 4/2020 | Nishikawa et al. |
| 10,629,616 B1 | 4/2020 | Kai et al. |
| 10,734,080 B2 | 8/2020 | Chibvongdoze et al. |
| 10,741,535 B1 | 8/2020 | Nishikawa et al. |
| 10,854,619 B2 | 12/2020 | Chibvongodze et al. |
| 10,879,260 B2 * | 12/2020 | Uryu ............... H01L 25/0657 |
| 2013/0070506 A1 | 3/2013 | Kajigaya |
| 2013/0258772 A1 | 10/2013 | Lee et al. |
| 2015/0078080 A1 | 3/2015 | Lee |
| 2015/0193299 A1 | 7/2015 | Hyun et al. |
| 2016/0012903 A1 | 1/2016 | Desai et al. |
| 2017/0287926 A1 | 10/2017 | Ariyoshi |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0151497 A1 | 5/2018 | Makala et al. |
| 2019/0252396 A1 | 8/2019 | Mushiga et al. |
| 2020/0098771 A1 | 3/2020 | Nishikawa et al. |
| 2020/0227397 A1 * | 7/2020 | Yada ................ H01L 27/11565 |
| 2020/0258816 A1 * | 8/2020 | Okina ................ H01L 25/0657 |
| 2020/0258817 A1 * | 8/2020 | Okina ............... H01L 27/11573 |
| 2020/0279861 A1 * | 9/2020 | Uryu ....................... G11C 5/025 |
| 2021/0358936 A1 * | 11/2021 | Takuma ................ H01L 23/562 |
| 2021/0358941 A1 * | 11/2021 | Kajiwara .......... H01L 21/76816 |

OTHER PUBLICATIONS

U.S. Appl. No. 16/829,591, filed Mar. 25, 2020, SanDisk Technologies LLC.
U.S. Appl. No. 16/829,667, filed Mar. 25, 2020, SanDisk Technologies LLC.
U.S. Appl. No. 16/876,370, filed May 18, 2020, SanDisk Technologies LLC.
U.S. Appl. No. 17/036,070, filed Sep. 29, 2020, SanDisk Technologies LLC.

* cited by examiner

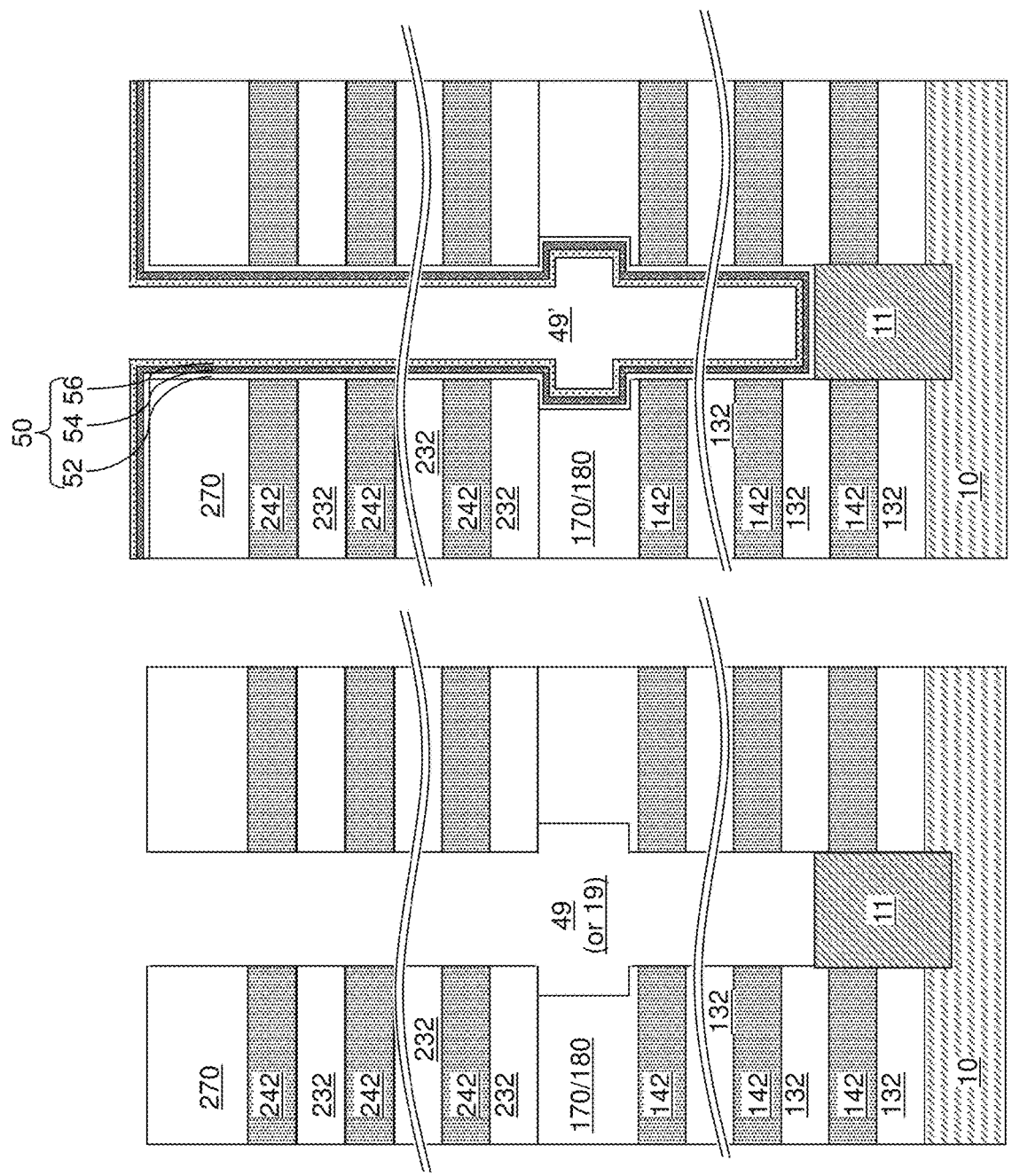

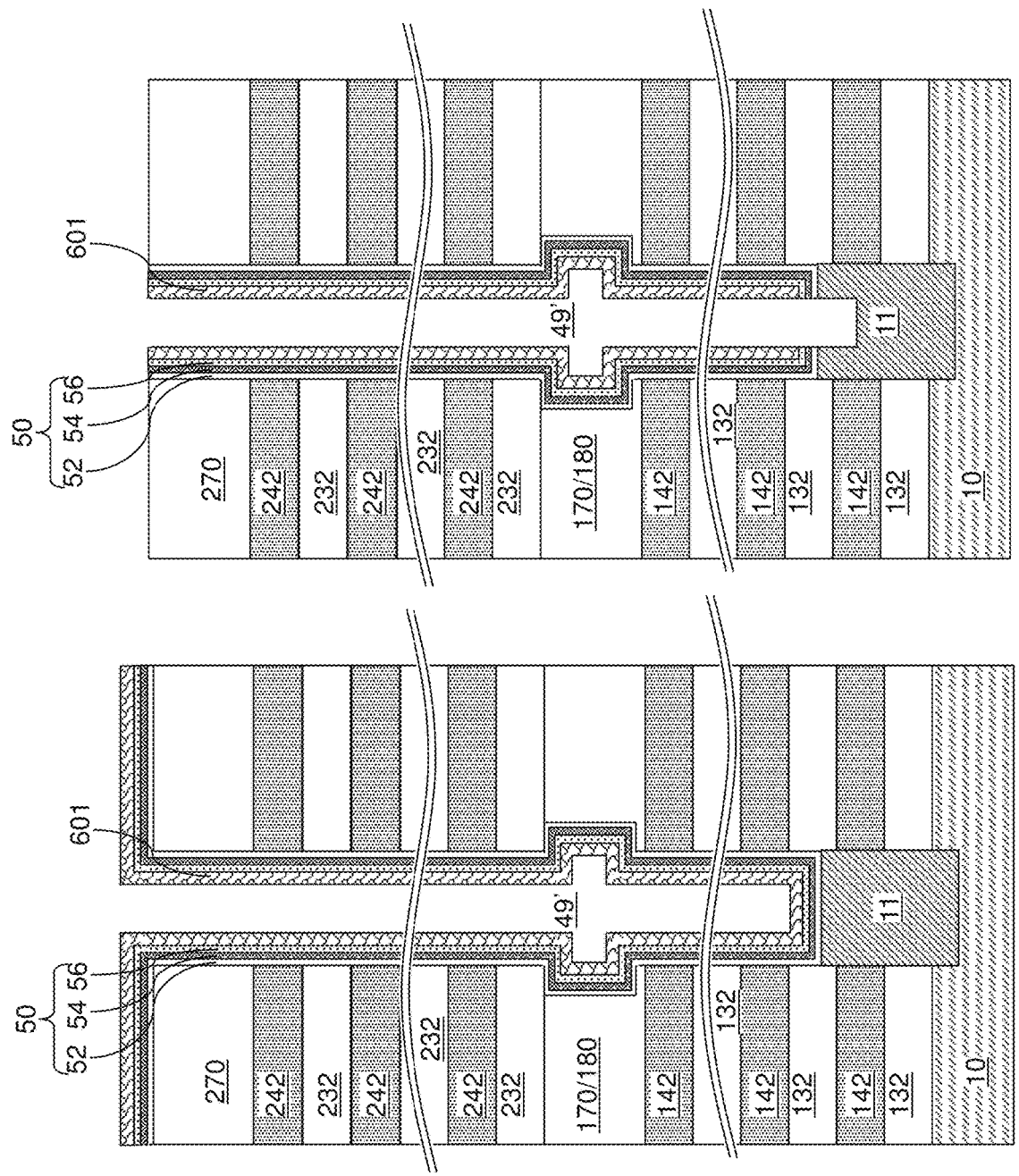

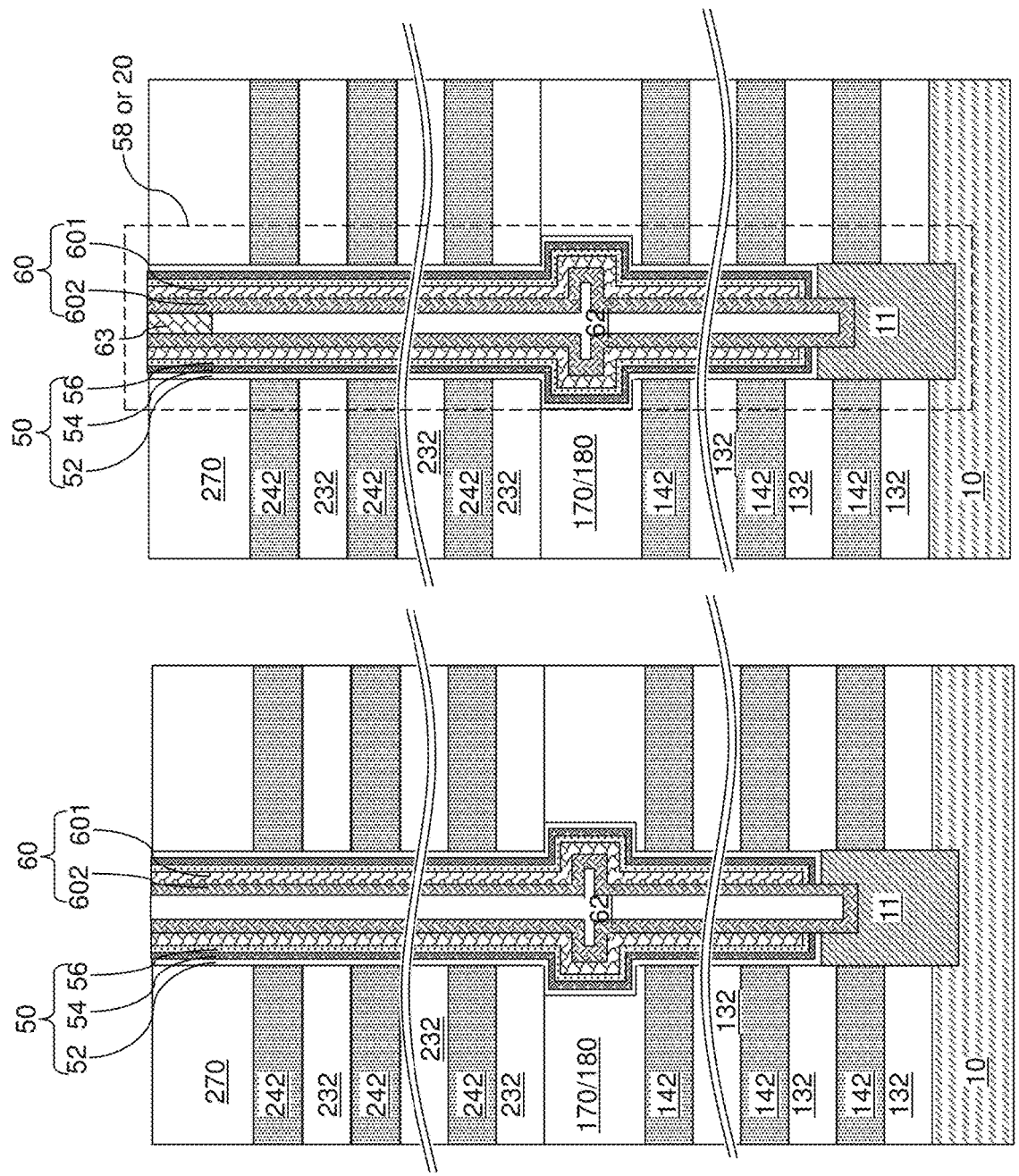

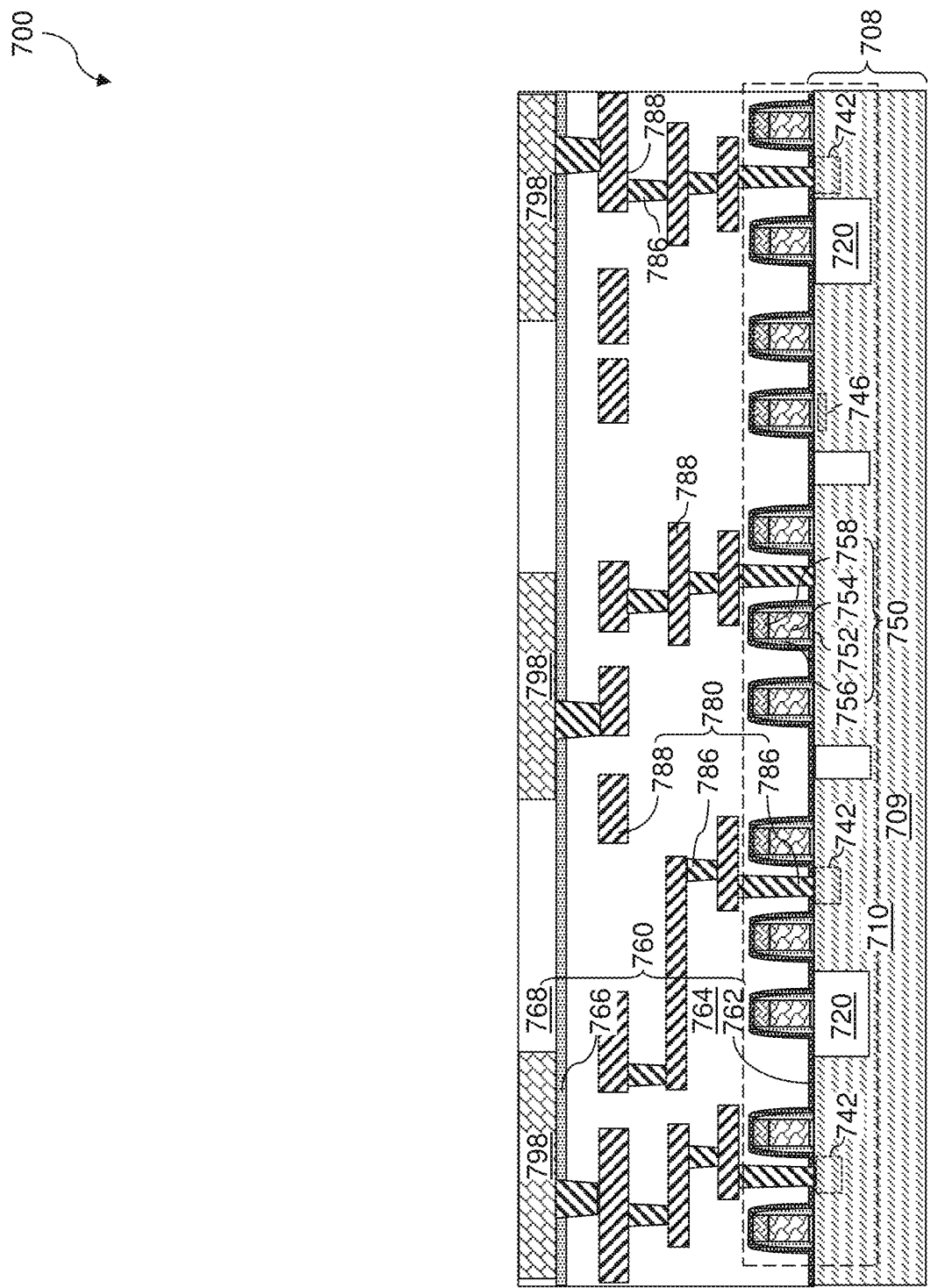

THREE-DIMENSIONAL MEMORY DEVICE INCLUDING TRENCH-ISOLATED MEMORY PLANES AND METHOD OF MAKING THE SAME

FIELD

The present disclosure relates generally to the field of semiconductor devices and specifically to a three-dimensional memory device containing multiple three-dimensional memory planes that are laterally isolated by trenches and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a three-dimensional memory device is provided, which comprises: a first three-dimensional memory plane including first alternating stacks of first insulating layers and first word lines, first memory openings vertically extending through a respective one of the first alternating stacks and filled with first memory opening fill structures including a respective first vertical semiconductor channel and first memory film, and first bit lines overlying the first alternating stacks, extending over an area of the first alternating stacks, and electrically connected to a respective subset of the first vertical semiconductor channels; a second three-dimensional memory plane including second alternating stacks of second insulating layers and second word lines, second memory openings vertically extending through a respective one of the second alternating stacks and filled with second memory opening fill structures including a respective second vertical semiconductor channel and second memory film, and second bit lines overlying the second alternating stacks, extending over the area of the second alternating stacks and electrically connected to a respective subset of the second vertical semiconductor channels and electrically isolated from each of the first vertical semiconductor channels and the first bit lines; and an inter-array backside trench laterally extending along a word line direction between the first three-dimensional memory plane and the second three-dimensional memory plane, and filled with an inter-array backside trench fill structure comprising an inter-array backside insulating material portion.

According to another aspect of the present disclosure, a method of forming a three-dimensional memory device is provided, which comprises: forming a vertically alternating sequence of continuous insulating layers and continuous sacrificial material layers over a substrate; forming memory openings through the vertical alternating sequence; forming memory opening fill structures in the memory openings, wherein the memory opening fill structures comprises a respective vertical semiconductor channel and memory film; dividing the vertically alternating sequence into a first memory plane comprising first alternating stacks of first insulating layers and first sacrificial material layers that are laterally spaced apart by first backside trenches, and a second memory plane comprising second alternating stacks of second insulating layers and second sacrificial material layers that are laterally spaced apart by second backside trenches, wherein the first alternating stacks and the second alternating stacks are laterally spaced apart by an inter-array backside trench, and wherein a first subset of the memory opening fill structures vertically extends through a respective one of the first alternating stacks and a second subset of the memory opening fill structures vertically extends through a respective one of the second alternating stacks; replacing the first sacrificial material layers and the second sacrificial material layers with first word lines and second word lines, respectively; and forming first bit lines and second bit lines over the first alternating stacks and the second alternating stacks, wherein the first bit lines are electrically connected to a respective subset of the first vertical semiconductor channels and electrically isolated from the second vertical semiconductor channels, and second bit lines are electrically connected to a respective subset of the second vertical semiconductor channels and electrically isolated from the first vertical semiconductor channels.

BRIEF DESCRIPTION OF THE DRAWINGS

FIGS. 9A-9H are sequential vertical cross-sectional views of an inter-tier memory opening during formation of a memory opening fill structure according to an embodiment of the present disclosure.

FIG. 17A is a vertical cross-sectional view of a logic die according to the first embodiment of the present disclosure.

DETAILED DESCRIPTION

Figure 1A:
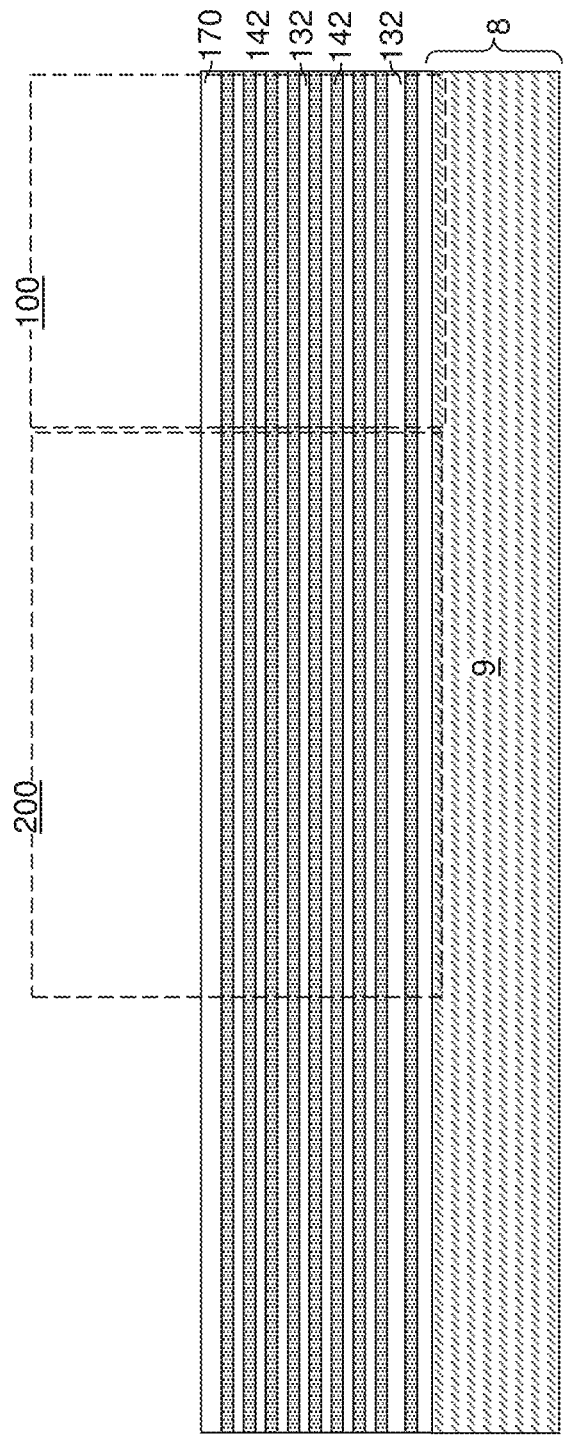
FIG. 1A is a vertical cross-sectional view of a first exemplary structure after formation of a first vertically alternating sequence of first-tier insulating layers and first-tier sacrificial material layers according to the first embodiment of the present disclosure.

Typically, electrical isolation between neighboring pairs of three-dimensional memory planes is provided by forming a dummy staircase region filled with a large dielectric material portion between the neighboring pair of memory planes. This configuration requires a large isolation area between the neighboring pair of memory planes.

According to an aspect of the present disclosure, a backside trench extending in the word line direction and having a relatively narrow width can be employed to provide electrical isolation between neighboring pairs of memory planes. The backside trench can be filled with an backside insulating spacer concurrently with formation of additional backside insulating spacers in additional backside trenches that extend in the word line direction and provide lateral isolation between memory blocks comprising alternating stacks of insulating layers and electrically conductive layers (e.g., word lines and select lines) within each three-dimensional memory plane. A cut region extending in the word line direction is provided over the backside trench at the level of bit lines such that bit lines do not cross over the boundary between the neighboring pair of memory planes, and each group of bit lines is formed entirely within an area of a respective memory plane. The embodiments of the present disclosure are directed to a three-dimensional memory device containing multiple three-dimensional memory planes that are laterally isolated by trenches and methods of making the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
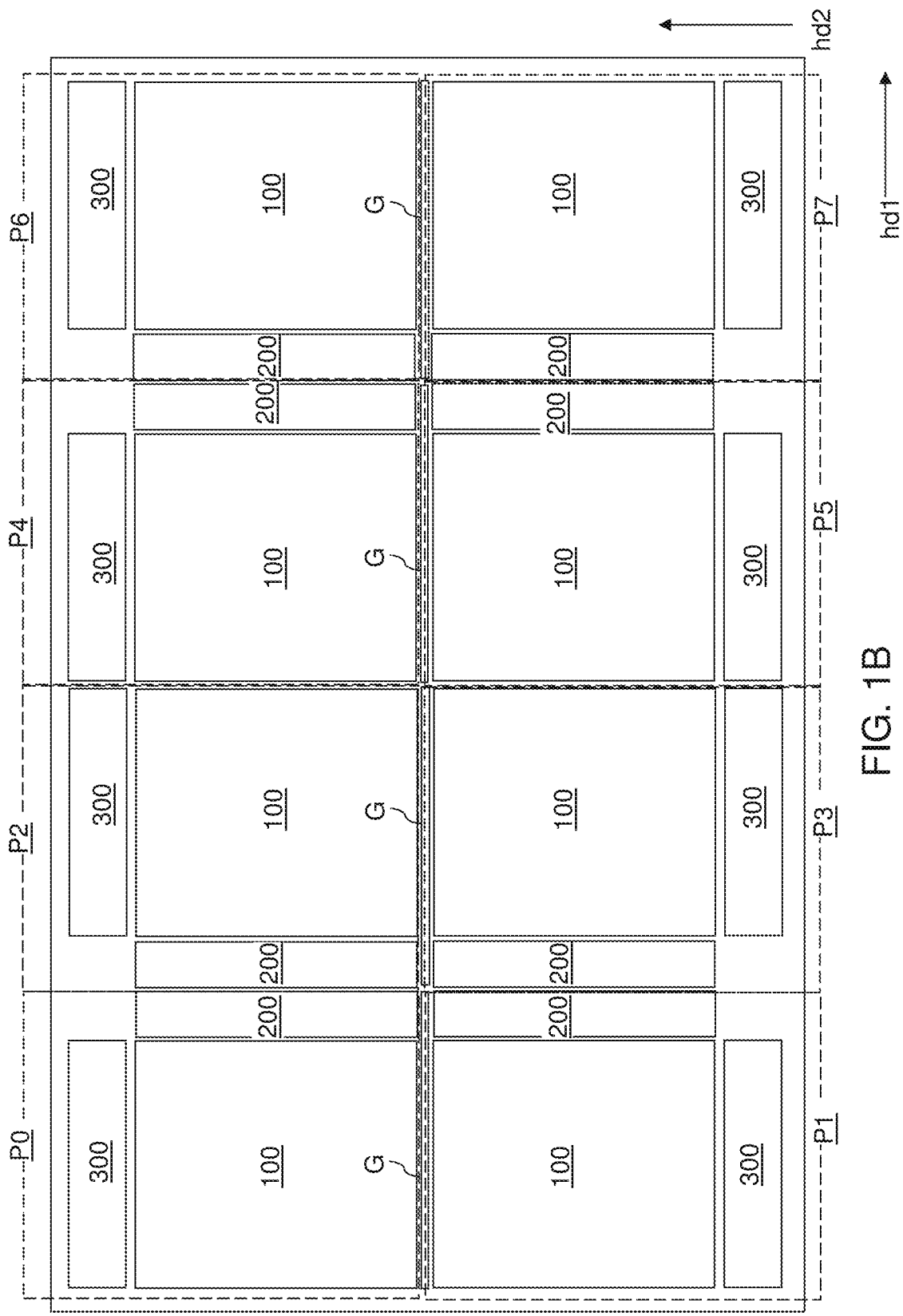
FIG. 1B illustrates a layout of a semiconductor die within the first exemplary structure of FIG. 1A in a plan view.

Referring to FIGS. 1A and 1B, a first exemplary structure according to a first embodiment of the present disclosure is illustrated. The first exemplary structure includes a substrate 8 containing a semiconductor material layer 9 at least at an upper portion thereof. In one embodiment, the semiconductor material layer 9 may be a single crystalline semiconductor material layer or a doped well in a semiconductor substrate, such as a silicon wafer. In another embodiment, the substrate 8 may include a substrate semiconductor layer (not shown) with semiconductor devices (not shown) thereupon, and lower-level dielectric material layers (not shown) embedding lower-level metal interconnect structures (not shown) and located above the semiconductor devices. In this case, the semiconductor material layer 9 may be formed over the lower-level dielectric material layers. The semiconductor material layer 9 may have a doping of a first conductivity type, which may be p-type or n-type. The semiconductor material layer 9 may include a single crystalline semiconductor material or a polycrystalline semiconductor material (such as polysilicon or a polycrystalline silicon-germanium alloy).

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A vertically alternating sequence of first material layers and second material layers is subsequently formed. Each first material layer can include a first material, and each second material layer can include a second material that is different from the first material. In case at least another vertically alternating sequence of material layers is subsequently formed over the vertically alternating sequence of the first material layers and the second material layers, the vertically alternating sequence is herein referred to as a first vertically alternating sequence. The level of the first vertically alternating sequence is herein referred to as a first-tier level, and the level of the vertically alternating sequence to be subsequently formed immediately above the first-tier level is herein referred to as a second-tier level, etc.

The first vertically alternating sequence can include first-tier insulating layers 132 as the first material layers, and first-tier sacrificial material layers 142 as the second material layers. In one embodiment, each first-tier insulating layer 132 can include a first insulating material, and each first-tier sacrificial material layer 142 can include a first sacrificial material. An alternating plurality of first-tier insulating layers 132 and first-tier sacrificial material layers 142 is formed over the semiconductor material layer 9. As used herein, a "sacrificial material" refers to a material that is removed during a subsequent processing step.

The first vertically alternating sequence (132, 142) can include first-tier insulating layers 132 composed of the first material, and first-tier sacrificial material layers 142 composed of the second material, which is different from the first material. The first material of the first-tier insulating layers 132 can be at least one insulating material. Insulating materials that can be employed for the first-tier insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first-tier insulating layers 132 can be silicon oxide.

The second material of the first-tier sacrificial material layers 142 is a sacrificial material that can be removed selective to the first material of the first-tier insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first-tier sacrificial material layers 142 may comprise an insulating material, a semiconductor material, or a conductive material. The second material of the first-tier sacrificial material layers 142 can be subsequently replaced with electrically conductive electrodes which can function, for example, as control gate electrodes of a vertical NAND device. In one embodiment, the first-tier sacrificial material layers 142 can be material layers that comprise silicon nitride.

In one embodiment, the first-tier insulating layers 132 can include silicon oxide, and sacrificial material layers can include silicon nitride sacrificial material layers. The first material of the first-tier insulating layers 132 can be deposited, for example, by chemical vapor deposition (CVD). For example, if silicon oxide is employed for the first-tier insulating layers 132, tetraethylorthosilicate (TEOS) can be employed as the precursor material for the CVD process. The second material of the first-tier sacrificial material layers 142 can be formed, for example, CVD or atomic layer deposition (ALD).

The thicknesses of the first-tier insulating layers 132 and the first-tier sacrificial material layers 142 can be in a range from 20 nm to 50 nm, although lesser and greater thicknesses can be employed for each first-tier insulating layer 132 and for each first-tier sacrificial material layer 142. The number of repetitions of the pairs of a first-tier insulating layer 132 and a first-tier sacrificial material layer 142 can be in a range from 2 to 1,024, and typically from 8 to 256, although a greater number of repetitions can also be employed. In one embodiment, each first-tier sacrificial material layer 142 in the first vertically alternating sequence (132, 142) can have a uniform thickness that is substantially invariant within each respective first-tier sacrificial material layer 142. Each layer within the first vertically alternating sequence (132, 142) can be a continuous material layer without any opening therethrough. As such, the first vertically alternating sequence (132, 142) can include a vertically alternating sequence of continuous insulating layers and continuous sacrificial material layers.

A first insulating cap layer 170 is subsequently formed over the stack (132, 142). The first insulating cap layer 170 includes a dielectric material, which can be any dielectric material that can be employed for the first-tier insulating layers 132. In one embodiment, the first insulating cap layer 170 includes the same dielectric material as the first-tier insulating layers 132. The thickness of the first insulating cap layer 170 can be in a range from 20 nm to 300 nm, although lesser and greater thicknesses can also be employed.

Generally, the substrate semiconductor layer 9 and the material layers thereupon can be employed to form a memory die. The memory die may include a plurality of planes (P0-P7). The exemplary layout illustrated in FIG. 1B includes eight planes (P0-P7), which can be independently operated within a memory die. Each plane (P0-P7) can include a respective three-dimensional memory array containing plural blocks upon completion of the memory die. Each plane (P0-P7) can include a respective memory array region 100, a respective contact region 200, and a respective peripheral region 300. A gap region G can be provided between neighboring pairs of planes (P0-P7). In one embodiment, the gap region G can laterally extend along a first horizontal direction (i.e., word line direction) hd1, and neighboring pairs of planes (P0 and P1; P2 and P3; P4 and P5; P6 and P7) that neighbor along the second horizontal direction (e.g., bit line direction) hd2 can be laterally spaced apart by the gap region G along a second horizontal direction hd2 that is perpendicular to the first horizontal direction hd1. According to an aspect of the present disclosure, the width of each gap region G can be the same as the width of a respective backside trench to be subsequently formed between adjacent blocks in the same memory plane. In an illustrative example, the width of each gap region G may be in a range from 300 nm to 3,000 nm, although lesser and greater widths may also be employed. Neighboring pairs of planes (P0 and P2; P4 and P6; P1 and P3; P5 and P7) that neighbor along the first horizontal direction hd1 can be laterally spaced apart by the respective contact region 200.

Figure 2:
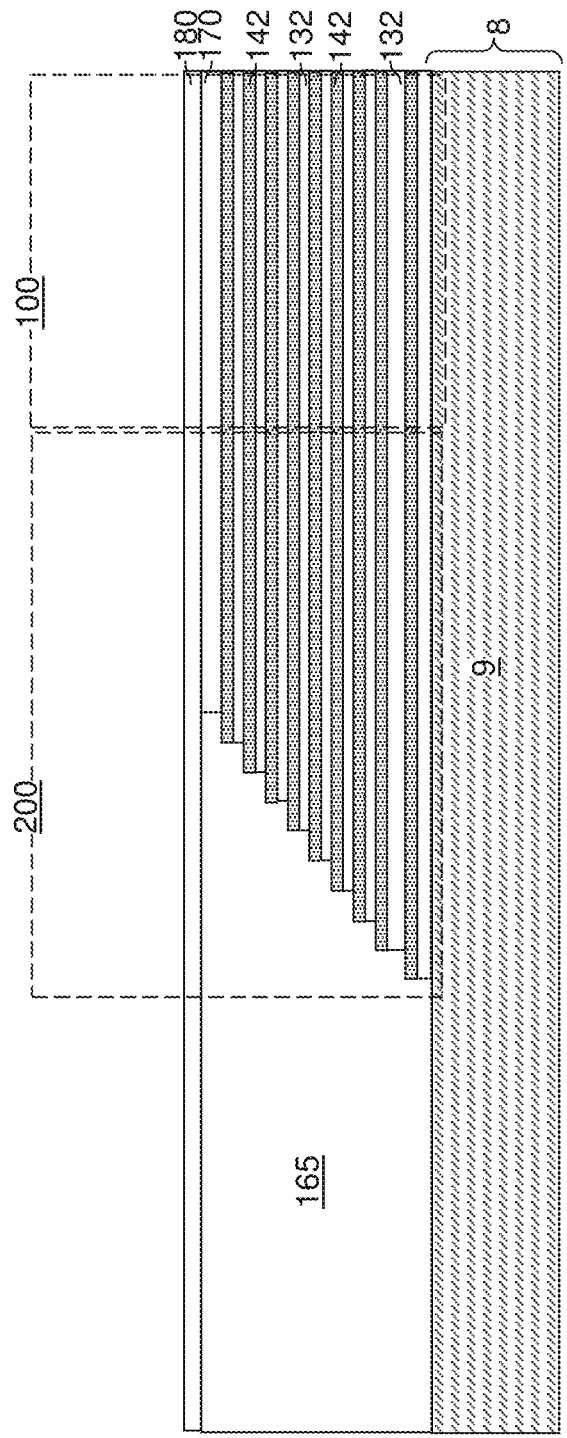
FIG. 2 is a vertical cross-sectional view of the first exemplary structure after patterning of first stepped surfaces on the first vertically alternating sequence and formation of a first retro-stepped dielectric material portion according to an embodiment of the present disclosure.

Referring to FIG. 2, the first insulating cap layer 170 and the first vertically alternating sequence (132, 142) can be patterned to form first stepped surfaces in the contact region 200. The contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first-tier insulating layer 132 and a first-tier sacrificial material layer 142 located directly underneath the bottom surface of the etched cavity within the etched area. The first stepped surfaces continuously extend from a bottommost layer within the first vertically alternating sequence (132, 142) to a topmost layer within the first vertically alternating sequence (132, 142). The cavity overlying the first stepped surfaces is herein referred to as a first stepped cavity.

A dielectric material, such as a silicate glass, can be deposited in the first stepped cavity. The dielectric material is subsequently planarized to provide a planar surface within a horizontal plane including a top surface of the first insulating cap layer. A continuous remaining portion of the dielectric material overlying the first stepped surfaces and filling the first stepped cavity is herein referred to as a first retro-stepped dielectric material portion 165, which comprises, and can consist of, the first silicate glass material. As used herein, a "retro-stepped" element refers to an element that has stepped surfaces and a horizontal cross-sectional area that increases monotonically as a function of a vertical distance from a top surface of a substrate on which the element is present. The first vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as a silicate glass material. The thickness of the inter-tier dielectric layer 180 can be in a range from 30 nm to 300 nm, although lesser and greater thicknesses can also be employed. In one embodiment, the inter-tier dielectric layer 180 can include a silicate glass that provides a greater etch rate in hydrofluoric acid than undoped silicate glass. For example, the inter-tier dielectric layer 180 can include borosilicate glass.

The combination of all material portions formed over the top surface of the semiconductor material layer 9 and underneath the inter-tier dielectric layer 180 constitutes a first-tier structure (132, 142, 165). The first-tier structure (132, 142, 165) comprises a first vertically alternating sequence of first-tier insulating layers 132 and first-tier sacrificial material layers 142 and a first retro-stepped dielectric material portion 165 overlying, and contacting, first stepped surfaces of the first vertically alternating sequence (132, 142). The first stepped surfaces continuously extend from a bottommost layer within the first vertically alternating sequence (132, 142) to a topmost layer within the first vertically alternating sequence (132, 142) and contacts vertical surfaces and horizontal bottom surfaces of the first retro-stepped dielectric material portion 165.

Figure 3A:
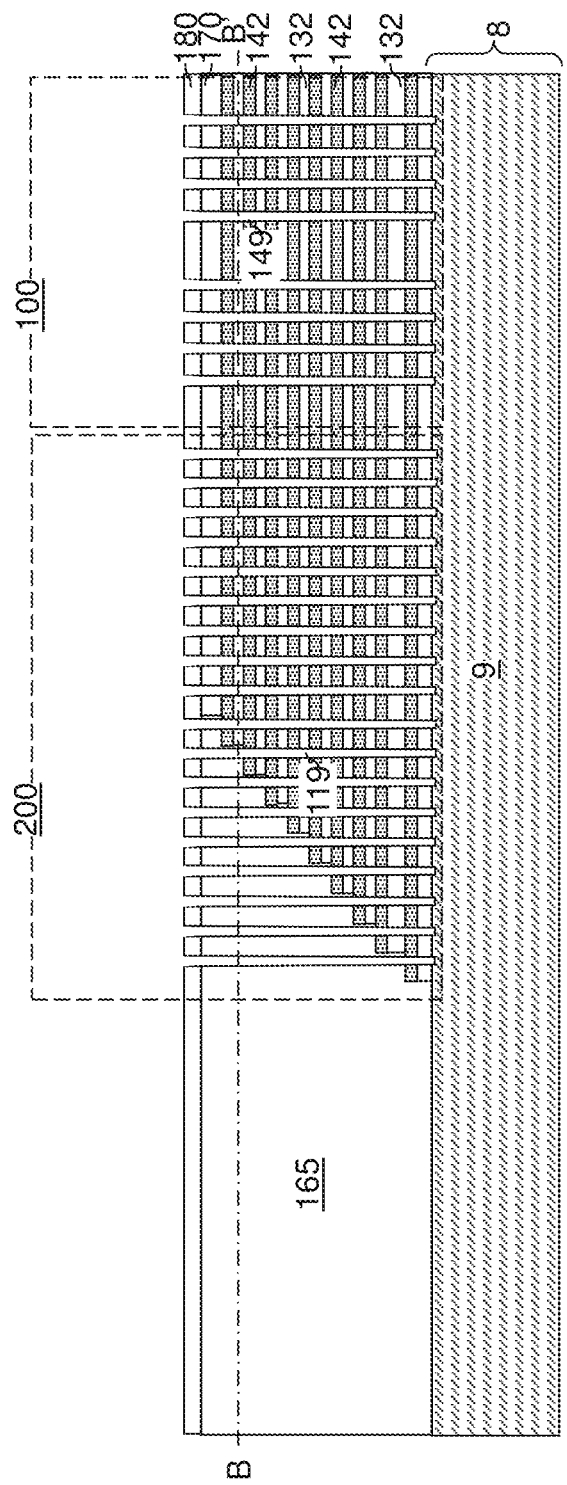
FIG. 3A is a vertical cross-sectional view of the first exemplary structure after formation of first-tier memory openings and first-tier support openings according to an embodiment of the present disclosure.
Figure 3B:
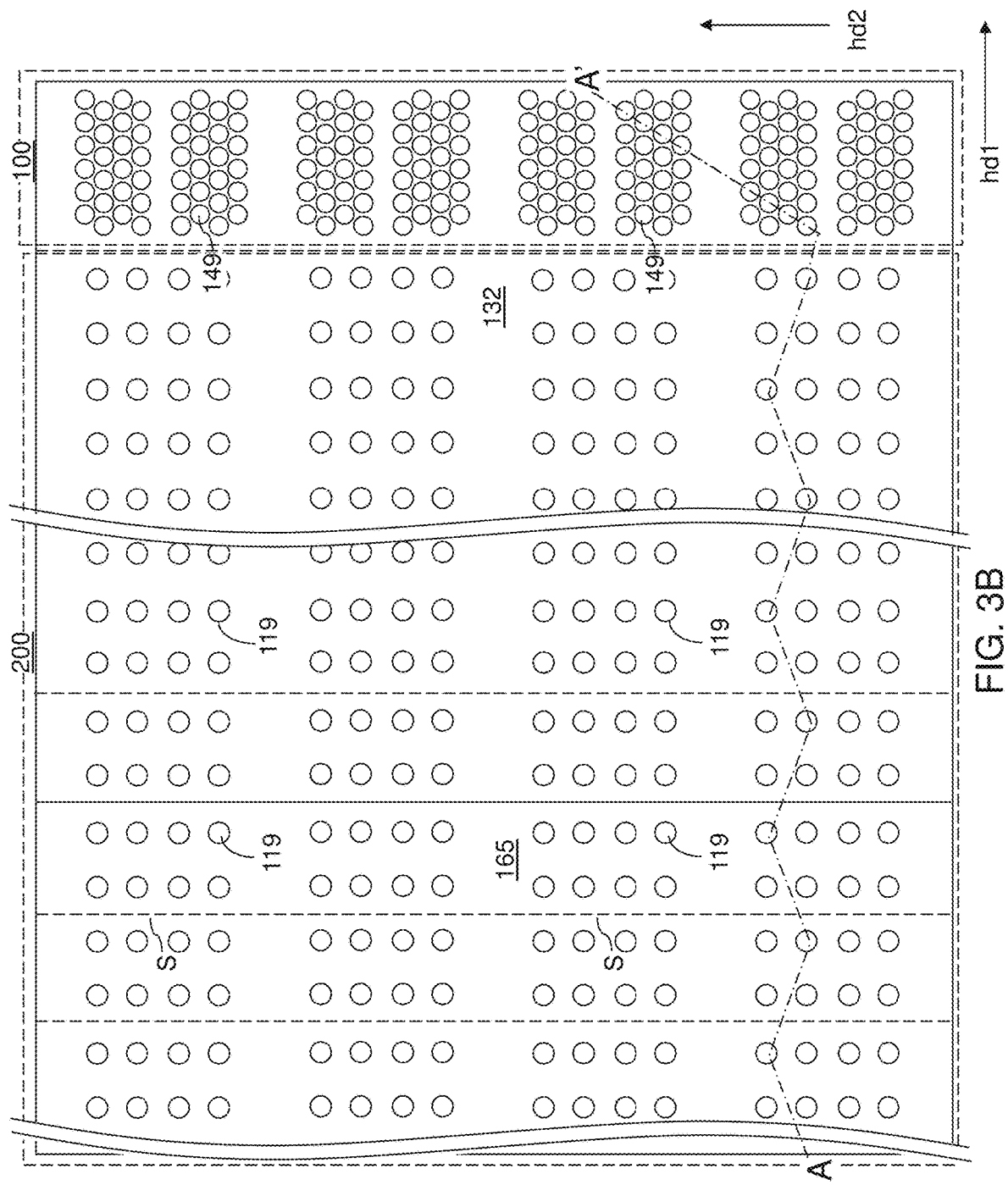
FIG. 3B is a horizontal cross-sectional view of the first exemplary structure along the horizontal plane B-B' in FIG. 3A. The hinged vertical plane A-A' corresponds to the plane of the vertical cross-sectional view of FIG. 3A.

Referring to FIGS. 3A and 3B, first-tier memory openings 149 and first-tier support openings 119 can be formed. Locations of steps S in the first vertically alternating sequence (132, 142) are illustrated as dotted lines in FIG. 3B. The first-tier memory openings 149 and the first-tier support openings 119 extend through the first vertically alternating sequence (132, 142) at least to a top surface of the semiconductor material layer 9. The first-tier memory openings 149 can be formed in the memory array region 100 at locations at which memory stack structures including vertical stacks of memory elements are to be subsequently formed. The first-tier support openings 119 can be formed in the contact region 200. The first-tier support openings 119 can be formed within a first area of the first stepped surfaces at which the first retro-stepped dielectric material portion 165 contacts the first vertically alternating sequence (132, 142) and within a second area of the contact region 200 in which second stepped surfaces of a second vertically alternating sequence are to be subsequently formed. The second area of the contact region 200 is located between the first area of the word line contact region and the memory array region 100.

For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first vertically alternating sequence (132, 142) by at least one anisotropic etch that employs the patterned lithographic material stack as an etch mask. Portions of the first insulating cap layer 170 (and the optional inter-tier dielectric layer 180), and the first vertically alternating sequence (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first vertically alternating sequence (132, 142) forms the first-tier memory openings 149 and the first-tier support openings 119.

In one embodiment, the chemistry of the anisotropic etch process employed to etch through the materials of the first vertically alternating sequence (132, 142) can alternate to optimize etching of the first and second materials in the first vertically alternating sequence (132, 142). The anisotropic etch can be, for example, a series of reactive ion etches or a single etch (e.g., $CF_4/O_2/Ar$ etch). The sidewalls of the first-tier memory openings 149 and the support openings 119. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first-tier insulating layers 132 (that can include undoped silicate glass), an isotropic etch (such as a wet etch employing HF) can be employed to expand the lateral dimensions of the first-tier memory openings at the level of the inter-tier dielectric layer 180.

Figure 4:
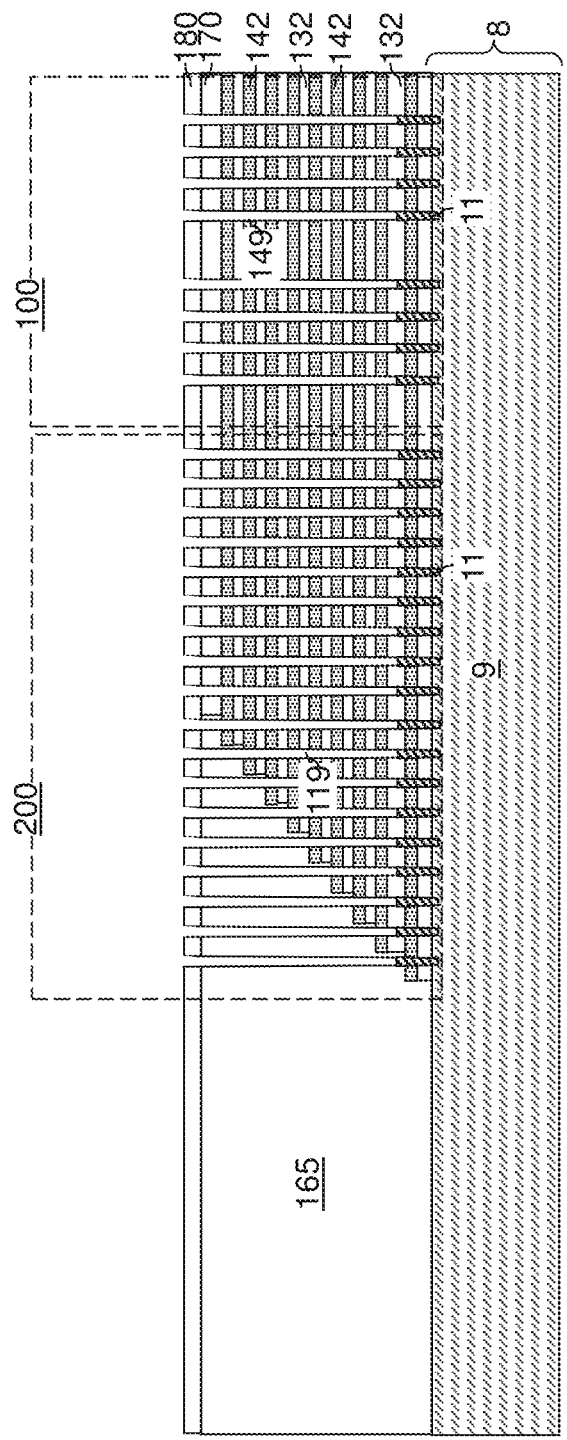
FIG. 4 is a vertical cross-sectional view of the first exemplary structure after formation of an optional pedestal channel portion in each of the first-tier memory openings and first-tier support openings according to an embodiment of the present disclosure.

Referring to FIG. 4, pedestal channel portions 11 may be optionally formed at the bottom of each of the first-tier memory openings 149 and the first-tier support openings 119. The pedestal channel portions 11 may be formed by a selective semiconductor deposition process that deposits a doped semiconductor material having a doping of a first conductivity type. If the pedestal channel portions 11 are formed, top surfaces of the pedestal channel portions 11 can be formed at, or above, the horizontal plane including the top surface of the bottommost first-tier sacrificial material layer 142 and the horizontal plane including the bottom surface of the first-tier sacrificial material layer 42 that is most proximal to the bottommost first-tier sacrificial material layer 142 (i.e., the second-from-the-bottom second-tier sacrificial material layer 142).

Figure 5A:
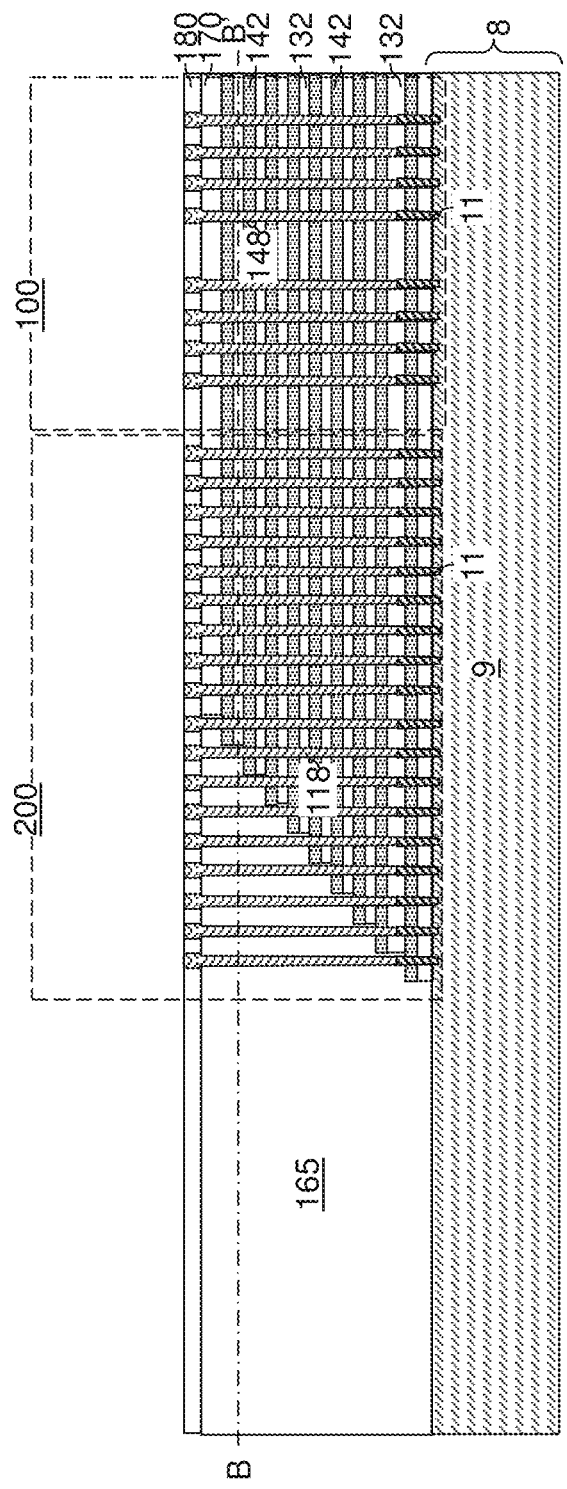
FIG. 5A is a vertical cross-sectional view of the first exemplary structure after formation of first-tier sacrificial memory opening fill structures and first-tier sacrificial support structures according to an embodiment of the present disclosure.
Figure 5B:
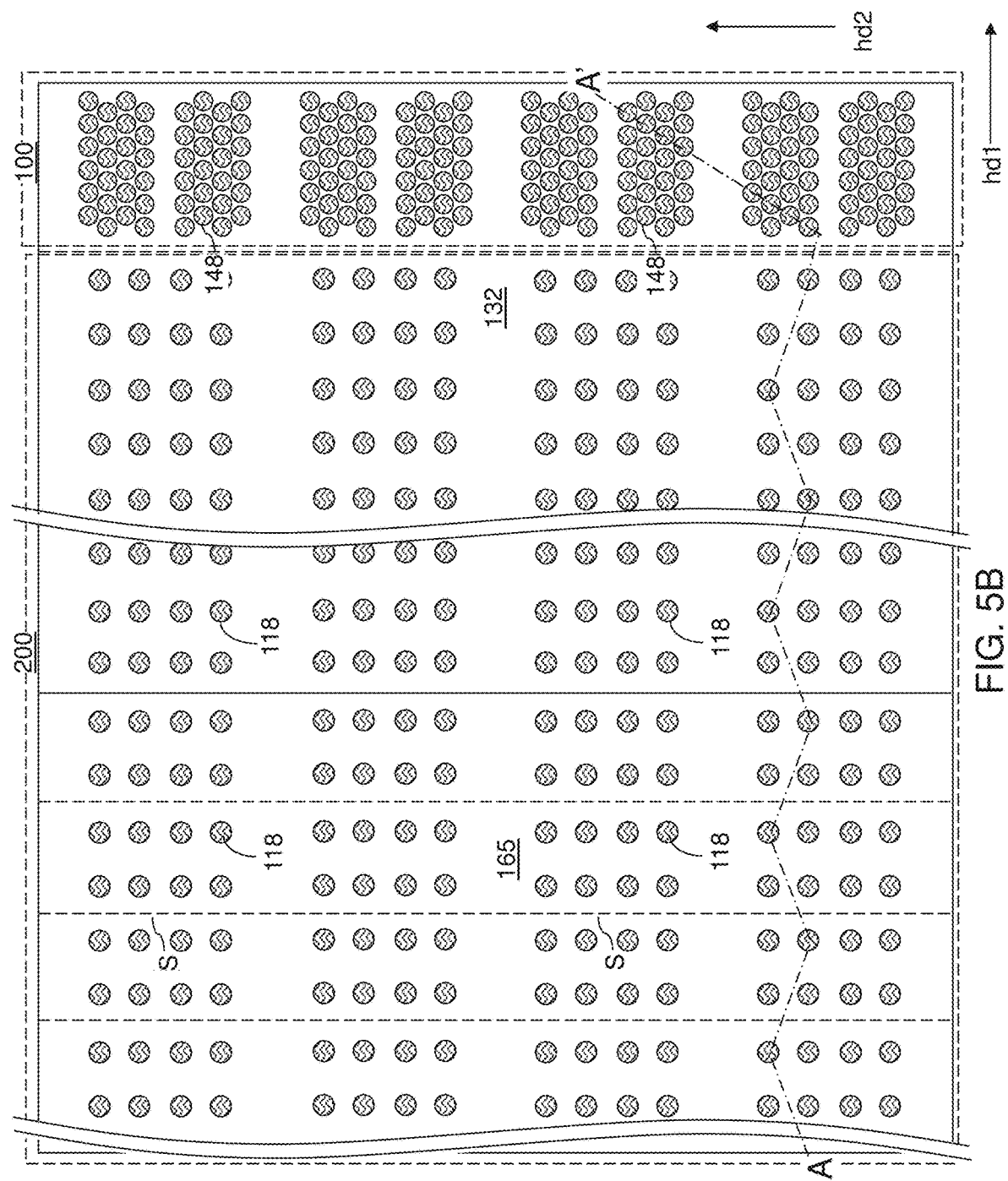
FIG. 5B is a horizontal cross-sectional view of the first exemplary structure along the horizontal plane B-B' in FIG. 5A. The hinged vertical plane A-A' corresponds to the plane of the vertical cross-sectional view of FIG. 5A.

Referring to FIGS. 5A and 5B, first-tier sacrificial memory opening fill structures 148 can be formed in the first-tier memory openings 149, and first-tier sacrificial support structures 118 can be formed in the first-tier support openings 119. For example, a fill material layer including a fill material is deposited in the first-tier memory openings 149 and the first-tier support openings 119.

Figure 6:
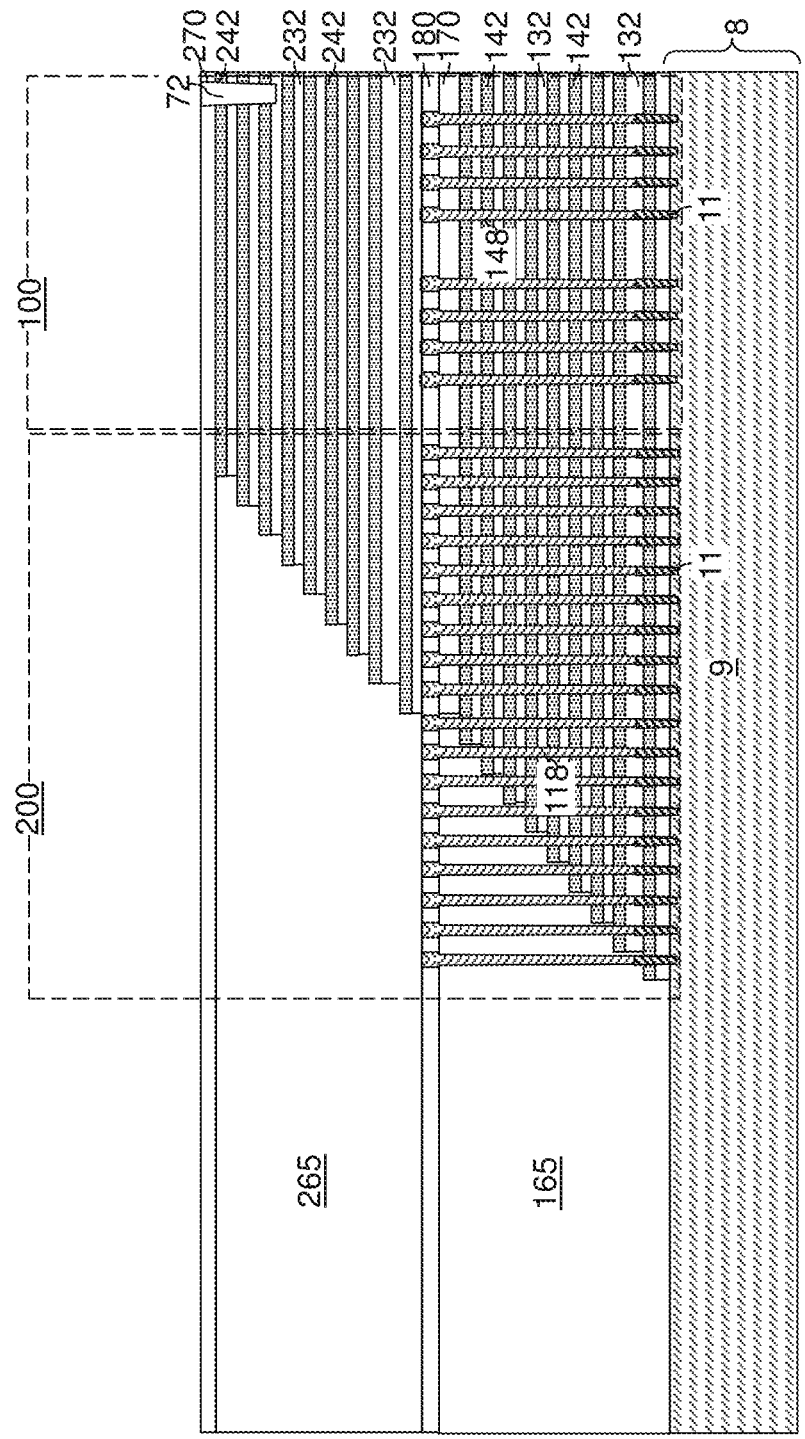
FIG. 6 is a vertical cross-sectional view of the first exemplary structure after formation of a second vertically alternating sequence of second-tier insulating layers and second-tier sacrificial material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional vertically alternating sequence of insulating layers and sacrificial material layers, which can be sacrificial material layers. For example, a second vertically alternating sequence (232, 242) of material layers can be subsequently formed on the top surface of the first vertically alternating sequence (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first-tier insulating layer 132, and the fourth material can be the same as the second material of the first-tier sacrificial material layers 142.

In one embodiment, the third material layers can be second-tier insulating layers 232 and the fourth material layers can be second-tier sacrificial material layers 242 that provide vertical spacing between each vertically neighboring pair of the second-tier insulating layers 232. In one embodiment, the third material layers and the fourth material layers can be second-tier insulating layers 232 and second-tier sacrificial material layers 242, respectively. The third material of the second-tier insulating layers 232 may be at least one insulating material. The fourth material of the second-tier sacrificial material layers 242 may be a sacrificial material that can be removed selective to the third material of the second-tier insulating layers 232. The second-tier sacrificial material layers 242 may comprise an insulating material, a semiconductor material, or a conductive material. The fourth material of the second-tier sacrificial material layers 242 can be subsequently replaced with electrically conductive electrodes which can function, for example, as control gate electrodes of a vertical NAND device.

In one embodiment, each second-tier insulating layer 232 can include a second insulating material, and each second-tier sacrificial material layer 242 can include a second sacrificial material. In this case, the second stack (232, 242) can include an alternating plurality of second-tier insulating layers 232 and second-tier sacrificial material layers 242. The third material of the second-tier insulating layers 232 can be deposited, for example, by chemical vapor deposition (CVD). The fourth material of the second-tier sacrificial material layers 242 can be formed, for example, CVD or atomic layer deposition (ALD).

The third material of the second-tier insulating layers 232 can be at least one insulating material. Insulating materials that can be employed for the second-tier insulating layers 232 can be any material that can be employed for the first-tier insulating layers 132. The fourth material of the second-tier sacrificial material layers 242 is a sacrificial material that can be removed selective to the third material of the second-tier insulating layers 232. Sacrificial materials that can be employed for the second-tier sacrificial material layers 242 can be any material that can be employed for the first-tier sacrificial material layers 142. In one embodiment, the second insulating material can be the same as the first insulating material, and the second sacrificial material can be the same as the first sacrificial material.

The thicknesses of the second-tier insulating layers 232 and the second-tier sacrificial material layers 242 can be in a range from 20 nm to 50 nm, although lesser and greater thicknesses can be employed for each second-tier insulating layer 232 and for each second-tier sacrificial material layer 242. The number of repetitions of the pairs of a second-tier insulating layer 232 and a second-tier sacrificial material layer 242 can be in a range from 2 to 1,024, and typically from 8 to 256, although a greater number of repetitions can also be employed. In one embodiment, each second-tier sacrificial material layer 242 in the second stack (232, 242) can have a uniform thickness that is substantially invariant within each respective second-tier sacrificial material layer 242.

The second vertically alternating sequence (232, 242) can be patterned to form second stepped surfaces in the second stepped area within the contact region 200. The second stepped area is more proximal to the memory array region 100 than the first stepped area including the first stepped surfaces is to the memory array region. The second stepped surfaces can be formed, for example, by forming a mask layer with an opening therein, etching a cavity within a topmost second-tier sacrificial material layer 242 and a topmost second-tier insulating layer 232, and iteratively expanding the etched area and vertically recessing the cavity by etching each pair of a first-tier insulating layer 132 and a first-tier sacrificial material layer 142 located directly underneath the bottom surface of the etched cavity within the etched area. The second stepped surfaces continuously extend from a bottommost layer within the second vertically alternating sequence (232, 242) to a topmost layer within the first vertically alternating sequence (132, 142). The cavity overlying the second stepped surfaces is herein referred to as a first stepped cavity.

A dielectric material such as silicon oxide can be deposited over the second stepped surfaces. Portions of the dielectric material that overlie the second vertically alternating sequence (232, 242) can be removed by a planarization process such as a chemical mechanical planarization (CMP) process. A continuous remaining portion of the dielectric material overlying the second stepped surfaces and filling the second stepped cavity is herein referred to as a second retro-stepped dielectric material portion 265. The second vertically alternating sequence (232, 242) and the second retro-stepped dielectric material portion 265 collectively constitute a second-tier structure, which is an in-process structure that is subsequently modified. The second stepped surfaces continuously extend from a bottommost layer within the second vertically alternating sequence (232, 242) to a topmost layer within the second vertically alternating sequence (232, 242) and contacts vertical surfaces and horizontal bottom surfaces of the second retro-stepped dielectric material portion 265.

A second insulating cap layer 270 can be subsequently formed over the second vertically alternating sequence (232, 242). The second insulating cap layer 270 includes a dielectric material that is different from the material of the second-tier sacrificial material layers 242. In one embodiment, the second insulating cap layer 270 can include silicon oxide.

Optionally, drain-select-level isolation structures 72 can be formed through a subset of layers in an upper portion of the second vertically alternating sequence (232, 242). The second-tier sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide.

Figure 7A:
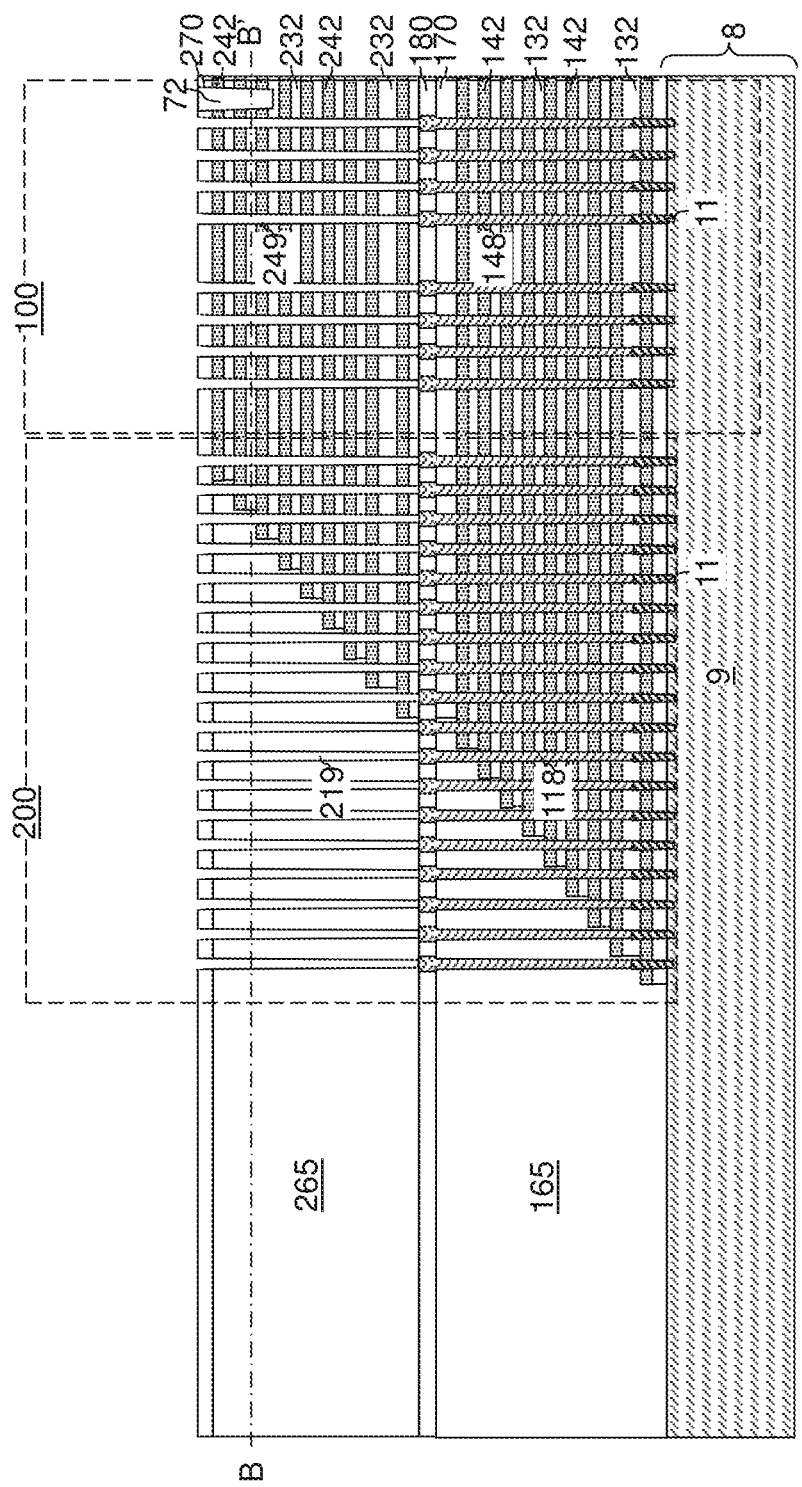
FIG. 7A is a vertical cross-sectional view of the first exemplary structure after formation of second-tier memory openings and second-tier support openings according to an embodiment of the present disclosure.
Figure 7B:
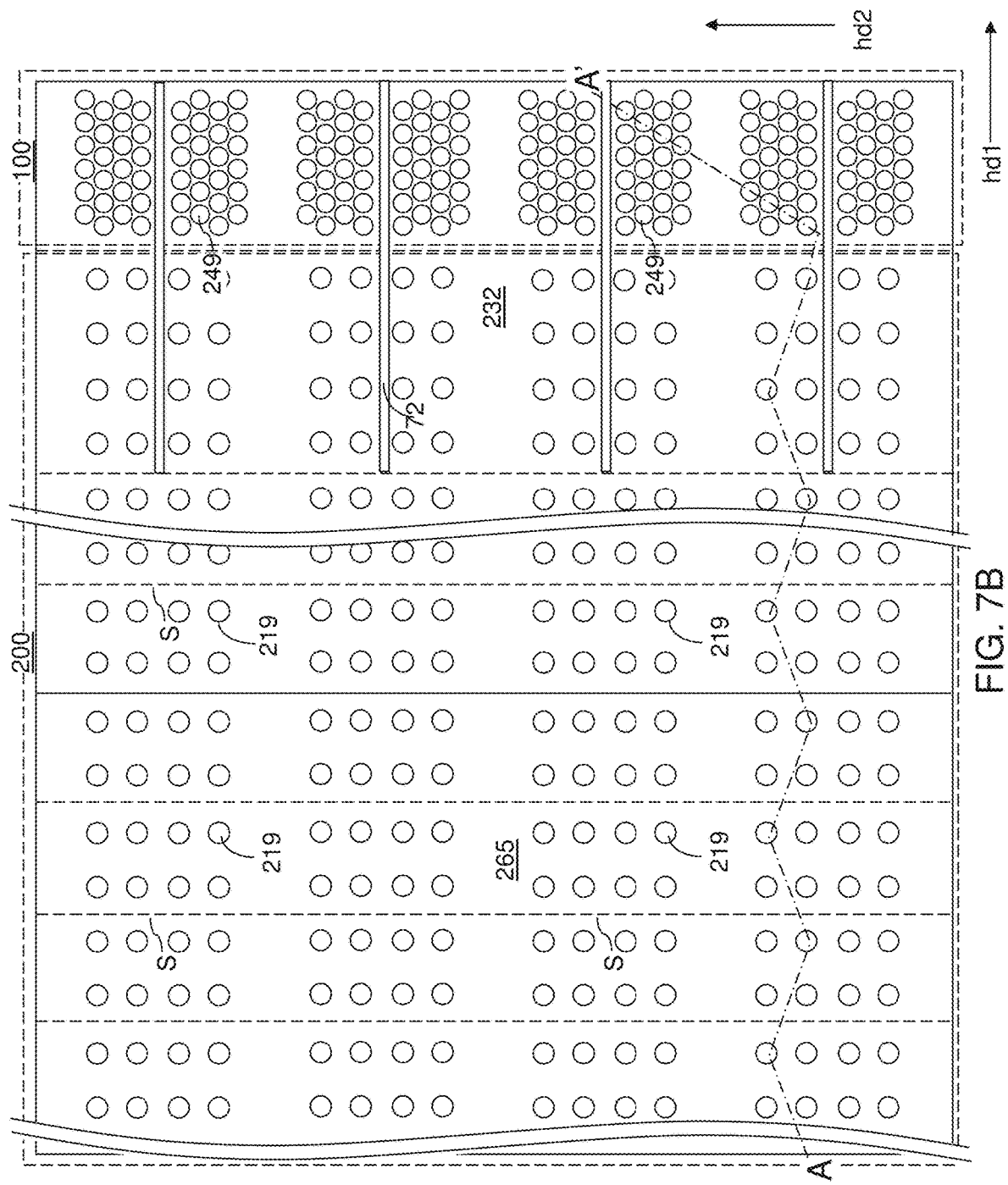
FIG. 7B is a horizontal cross-sectional view of the first exemplary structure along the horizontal plane B-B' in FIG. 7A. The hinged vertical plane A-A' corresponds to the plane of the vertical cross-sectional view of FIG. 7A.

Referring to FIGS. 7A and 7B, second-tier memory openings 249 and second tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the first-tier sacrificial support structures 118, i.e., the pattern of the first-tier memory openings 149 and the first-tier support openings 119. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second vertically alternating sequence (232, 242) can alternate to optimize etching of the alternating material layers in the second vertically alternating sequence (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying first-tier sacrificial support structure 118 can be physically exposed at the bottom of each second-tier support opening 219.

Figure 8:
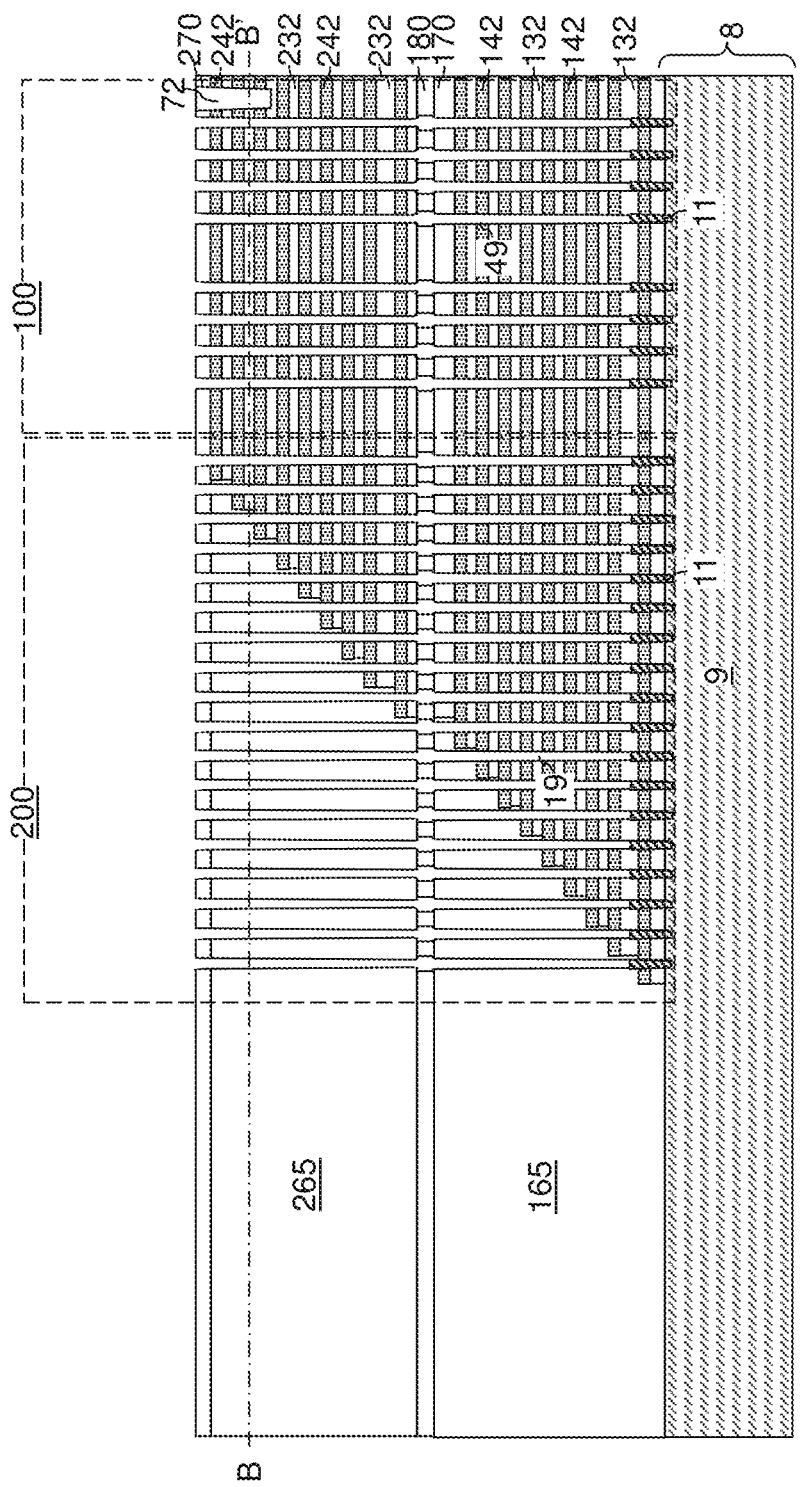
FIG. 8 is a vertical cross-sectional view of the first exemplary structure after formation of inter-tier memory openings and inter-tier support openings according to an embodiment of the present disclosure.

Referring to FIG. 8, an etch process can be performed after the top surfaces of the sacrificial memory opening fill portions 148 and the first-tier sacrificial support structures 118 are physically exposed. The etch process removes the sacrificial material of the sacrificial memory opening fill portions 148 and the first-tier sacrificial support structures 118 selective to the materials of the second vertically alternating sequence (232, 242) and the first vertically alternating sequence (132, 142) (e.g., $C_4F_8/O_2/Ar$ etch). The etch process may include an anisotropic etch process or an isotropic etch process.

Upon removal of the sacrificial memory opening fill portions 148, each vertically adjoining pair of a second-tier memory opening 249 and a first-tier memory opening 149 forms a continuous cavity that extends through the first vertically alternating sequence (132, 142) and the second vertically alternating sequence (232, 242), which is herein referred to as an inter-tier memory opening 49, or a memory opening 49. Likewise, upon removal of the first-tier sacrificial support structures 118, each vertically adjoining pair of a second-tier support opening 219 and a first-tier support opening 119 forms a continuous cavity that extends through the first vertically alternating sequence (132, 142) and the second vertically alternating sequence (232, 242), which is herein referred to as an inter-tier support opening 19, or a support opening 19. A top surface of the semiconductor material layer 9 can be physically exposed at the bottom of each memory opening and at the bottom of each support openings. Locations of steps S in the first vertically alternating sequence (132, 142) and the second vertically alternating sequence (232, 242) are illustrated as dotted lines.

Generally, at least one vertically alternating sequence of continuous insulating layers and continuous sacrificial material layers can be formed over a substrate. Memory openings 49 are formed through the at least one vertical alternating sequence.

FIGS. 9A-9H provide sequential cross-sectional views of a memory opening 49 or a support opening 19 during formation of a memory opening fill structure 58 or a primary support pillar structure 20. While a structural change in a memory opening 49 is illustrated in FIGS. 9A-9H, it is understood that the same structural change occurs in each memory openings 49 and in each of the support openings 19 during the same set of processing steps.

Referring to FIG. 9A, a memory opening 49 in the exemplary device structure of FIG. 14 is illustrated. The memory opening 49 extends through the first-tier structure and the second-tier structure. Likewise, each support opening 19 extends through the first-tier structure and the second-tier structure. A pedestal channel portion 11 may, or may not, be present within each memory opening 49 and within each support opening 19. A cavity 49' is present in the unfilled portion of the memory opening 49 (or of the support opening) above the pedestal channel portion 11.

Referring to FIG. 9B, a stack of layers including a blocking dielectric layer 52, a charge storage layer 54, and a tunneling dielectric layer 56 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen.

In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof.

The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric silicon compound, such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof.

The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material).

Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed.

The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Referring to FIG. 9C, an optional first semiconductor channel layer 601 can be deposited by a conformal deposition process. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the semiconductor material layer 9 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figures 9E, 9F:
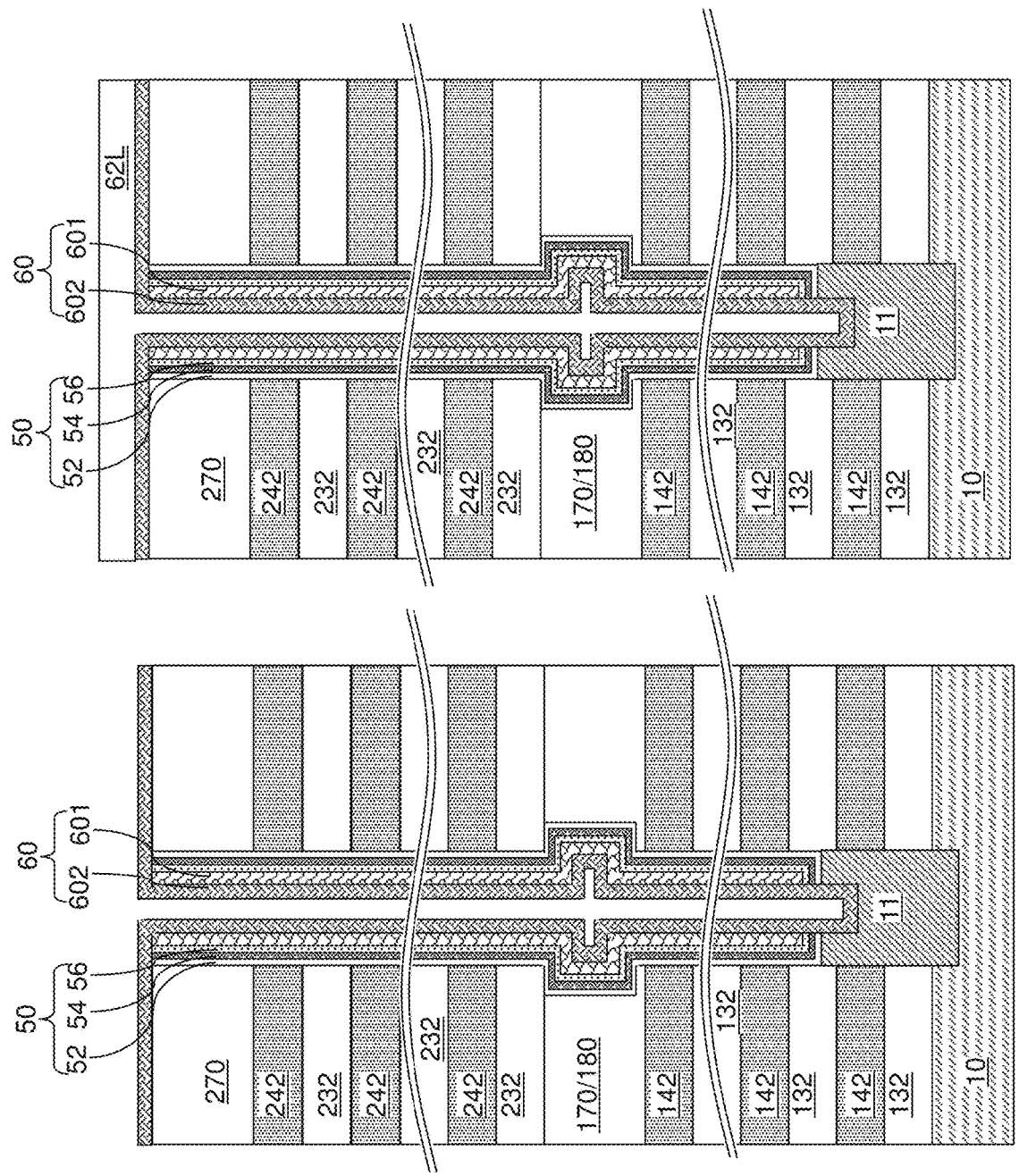

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a primary support pillar structure 20.

The first-tier structure (132, 142, 170, 165), the second-tier structure (232, 242, 270, 265), the inter-tier dielectric layer 180, the memory opening fill structures 58, and the primary support pillar structures 20 collectively constitute a memory-level assembly. The memory-level assembly is formed over the semiconductor material layer 9 such that the semiconductor material layer 9 includes horizontal semiconductor channels electrically connected to vertical semiconductor channels 60 within the memory stack structures 55.

Figure 10A:
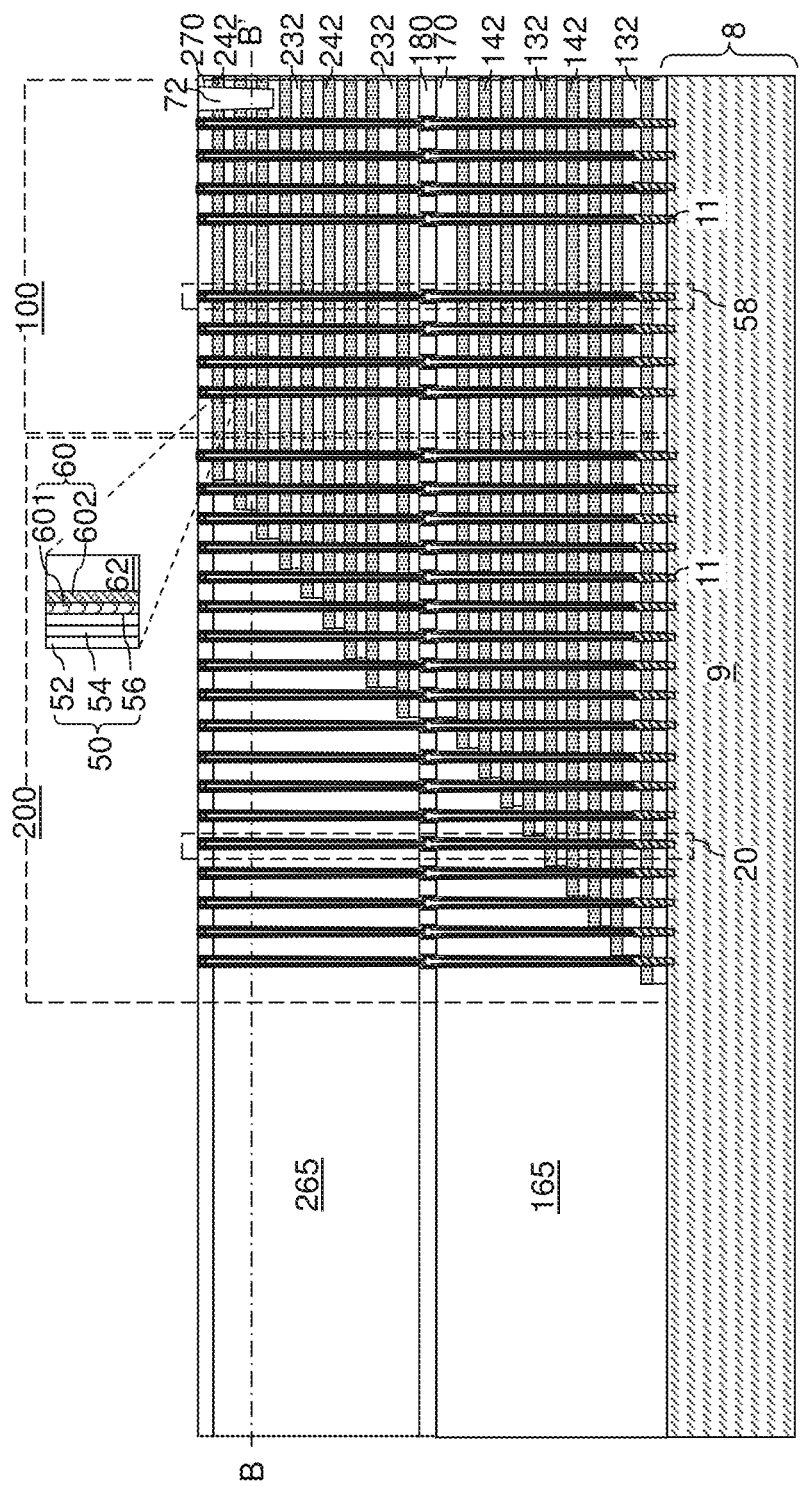
FIG. 10A is a vertical cross-sectional view of the first exemplary structure after formation of memory opening fill structures and primary support pillar structures according to an embodiment of the present disclosure.
Figure 10B:
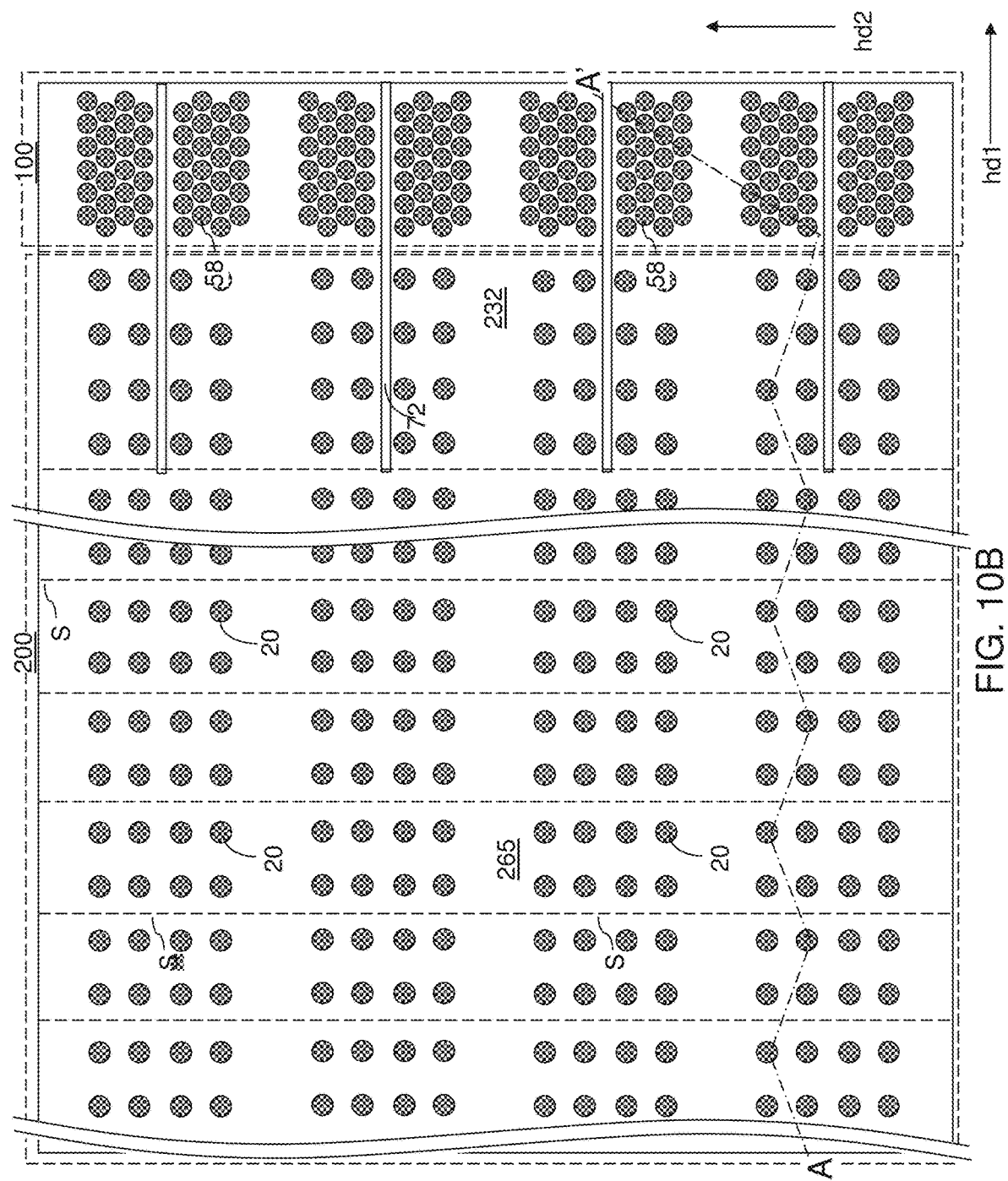
FIG. 10B is a horizontal cross-sectional view of the first exemplary structure along the horizontal plane B-B' in FIG. 10A. The hinged vertical plane A-A' corresponds to the plane of the vertical cross-sectional view of FIG. 10A.

Referring to FIGS. 10A and 10B, the first exemplary structure is illustrated after formation of a memory opening fill structure 58 within each memory opening 49 and formation of a primary support pillar structure 20 within each support opening 19. Each memory opening fill structure 58 comprises a respective vertical semiconductor channel 60.

Figure 11A:
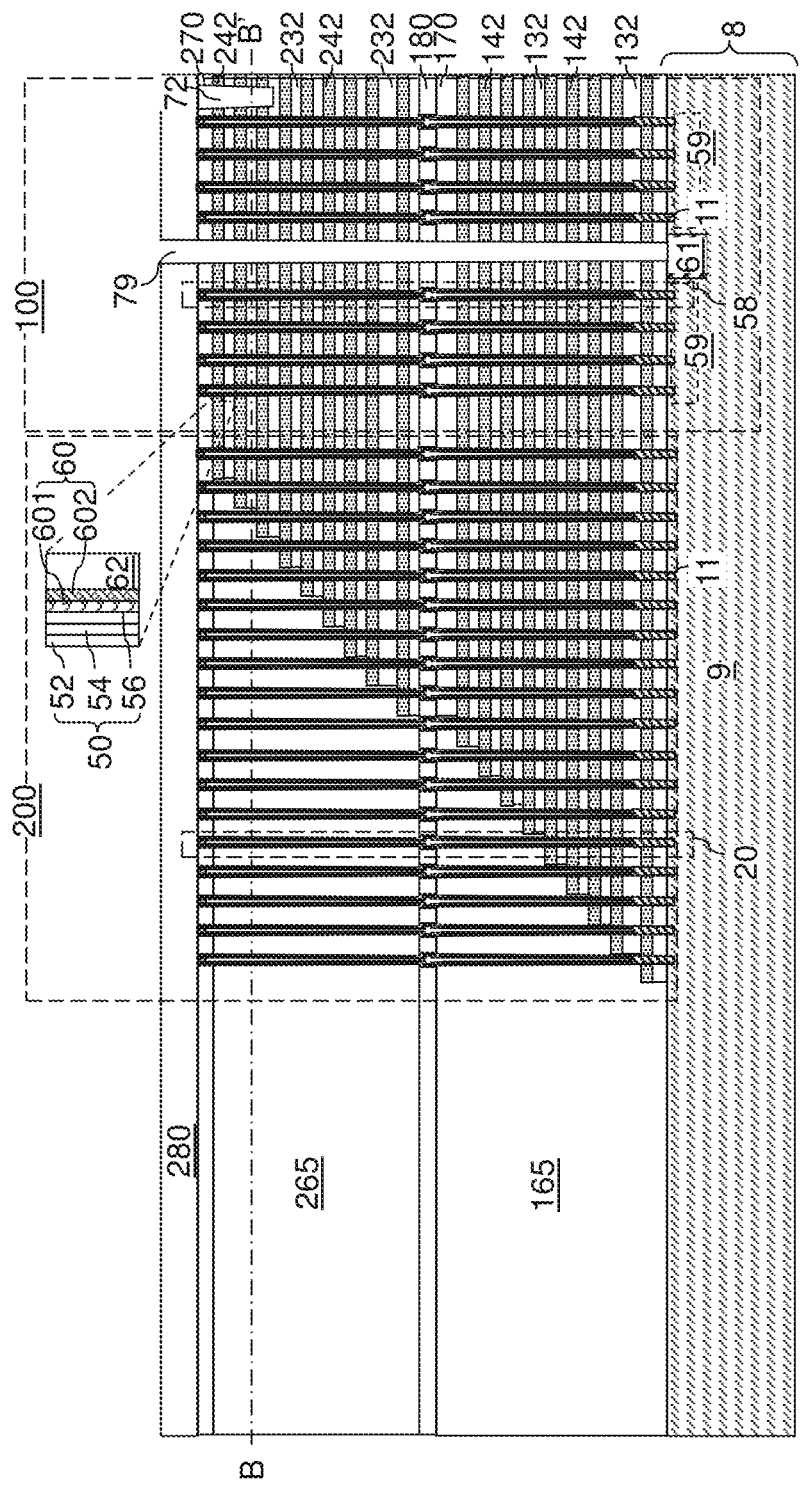
FIG. 11A is a vertical cross-sectional view of the first exemplary structure after formation of backside trenches and source regions according to an embodiment of the present disclosure.
Figure 11B:
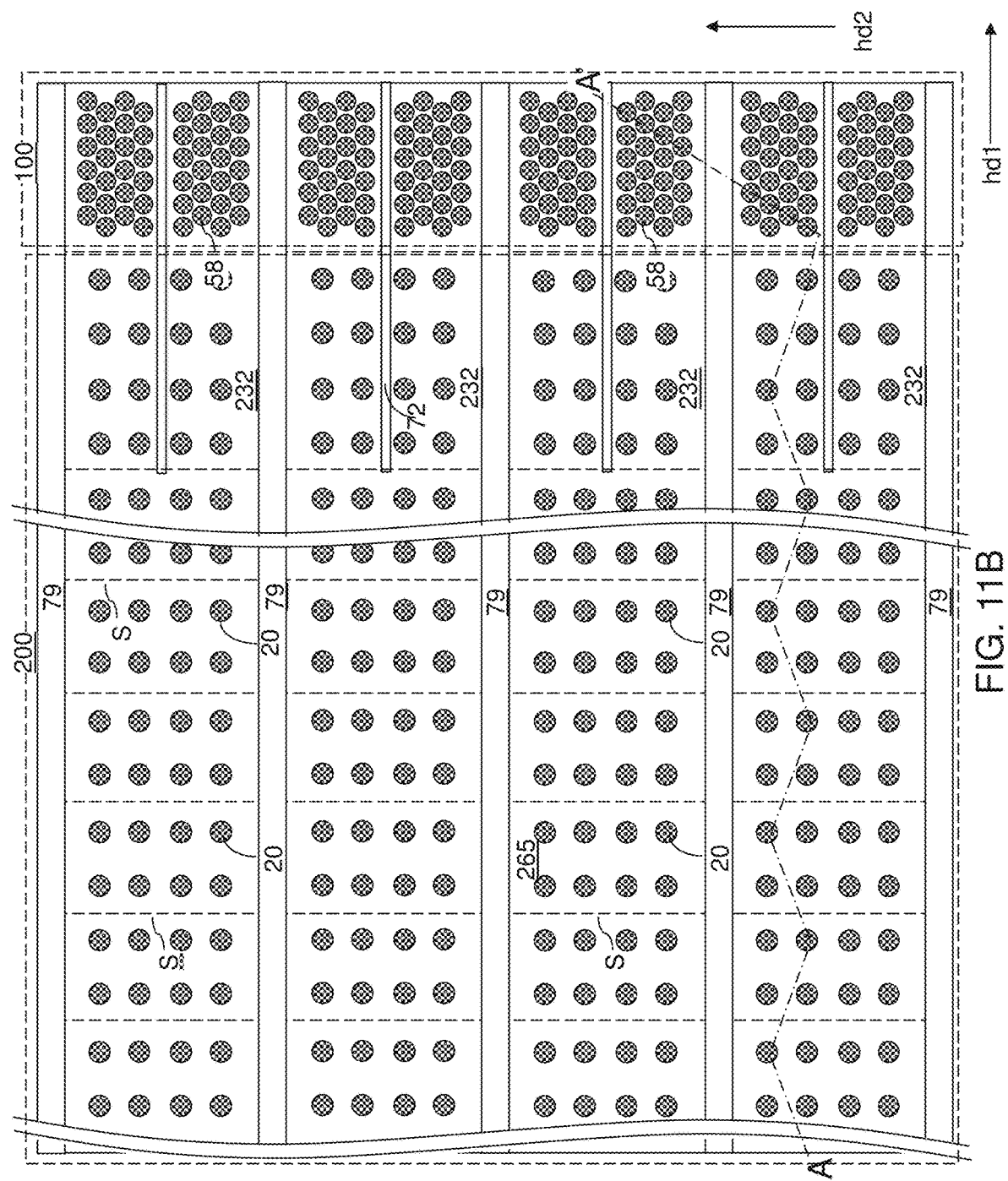
FIG. 11B is a horizontal cross-sectional view of the first exemplary structure along the horizontal plane B-B' in FIG. 11A. The hinged vertical plane A-A' corresponds to the plane of the vertical cross-sectional view of FIG. 11A.
Figure 11C:
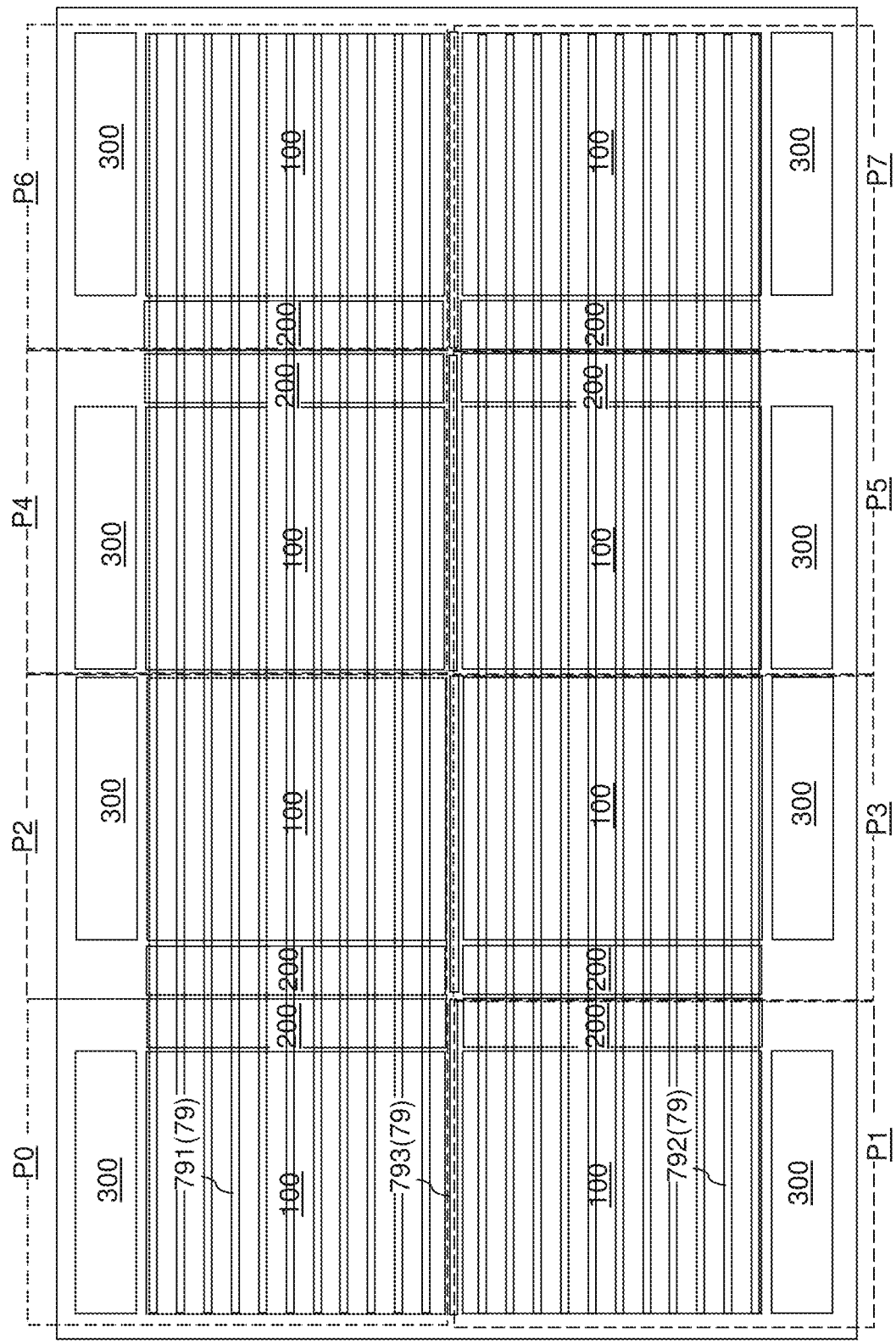
FIG. 11C illustrates a layout of the semiconductor die within the first exemplary structure of FIGS. 11A and 11B in a plan view.

Referring to FIGS. 11A-11C, a first contact-level dielectric layer 280 can be formed over the memory-level assembly. The first contact-level dielectric layer 280 is formed at a contact level through which various contact via structures are subsequently formed to the drain regions 63 and the various electrically conductive layers that replaces the sacrificial material layers (142, 242) in subsequent processing steps.

Backside trenches 79 are subsequently formed through the first contact-level dielectric layer 280 and the memory-level assembly. For example, a photoresist layer can be applied and lithographically patterned over the first contact-level dielectric layer 280 to form elongated openings that extend along a first horizontal direction hd1. An anisotropic etch is performed to transfer the pattern in the patterned photoresist layer through the first contact-level dielectric layer 280 and the memory-level assembly to a top surface of the semiconductor material layer 9. The photoresist layer can be subsequently removed, for example, by ashing.

The backside trenches 79 extend along the first horizontal direction hd1, and thus, are elongated along the first horizontal direction hd1. The backside trenches 79 can be laterally spaced from each other along a second horizontal direction hd2, which can be perpendicular to the first horizontal direction hd1. The backside trenches 79 can extend through the memory array region (e.g., a memory plane) 100 and the contact region 200 within each plane (P0-P7).

In one embodiment, the backside trenches 79 can laterally extend along the first horizontal direction (i.e., word line direction) hd1, and are laterally spaced apart along the second horizontal direction (i.e., bit line direction) hd2. In one embodiment, the planes (P0-P7) may be arranged such that each even-numbered plane (P0, P2, P4, P6) is laterally spaced from a respective odd-numbered plane (P1, P3, P5, P7) by a respective backside trench 79, which is herein referred to as an inter-array backside trench 793. Generally, the backside trenches 79 may include first backside trenches 791 laterally extending through a respective one of the even-numbered planes (P0, P2, P4, P6), second backside trenches 792 laterally extending through a respective one of the odd-numbered planes (P1, P3, P5, P7), and inter-array backside trenches 793 formed within a respective gap region G (illustrated in FIG. 1B). The first and second backside trenches (791, 792) separate memory blocks within each respective plane. Generally, the first backside trenches 791, the second backside trenches 792, and the inter-array backside trenches 793 can be formed simultaneously by forming a patterned etch mask layer (not shown) over the at least one vertically alternating sequence continuous insulating layers (132, 232) and continuous sacrificial material layers (142, 242), and by anisotropically etching unmasked portions of the at least one vertically alternating sequence by performing an anisotropic etch process. In one embodiment, the patterned etch mask layer may be a patterned photoresist layer. In one embodiment, the first backside trenches 791, the second backside trenches 792, and the inter-array backside trenches 793 may have a same width along the second horizontal direction hd2. In one embodiment, the first backside trenches 791, the second backside trenches 792, and the inter-array backside trenches 793 may be formed as a periodic one-dimensional array that is repeated along the second horizontal direction hd2 with periodicity.

The portions of the continuous insulating layers (132, 232) that are divided by the first backside trenches 791 are herein referred to as first insulating layers (132, 232). The portions of the continuous insulating layers (132, 232) that are divided by the second backside trenches 792 are herein referred to as second insulating layers (132, 232). The portions of the continuous sacrificial material layers (142, 242) that are divided by the first backside trenches 791 are herein referred to as first sacrificial material layers (142, 242). The portions of the continuous sacrificial material layers (142, 242) that are divided by the second backside trenches 792 are herein referred to as second sacrificial material layers (142, 242).

Generally, the vertically alternating sequence of continuous insulating layers (132, 232) and continuous sacrificial material layers (142, 242) are separated into first alternating stacks of first insulating layers (132, 232) and first sacrificial material layers (142, 242) that are laterally spaced apart by the first backside trenches 791, and second alternating stacks of second insulating layers (132, 232) and second sacrificial material layers (142, 242) that are laterally spaced apart by second backside trenches 792. The first alternating stacks and the second alternating stacks are laterally spaced apart by an inter-array backside trench 793. A first subset of the memory opening fill structures 58 vertically extends through a respective one of the first alternating stacks, and a second subset of the memory opening fill structures 58 vertically extends through a respective one of the second alternating stacks.

Dopants of a second conductivity type, which is the opposite of the first conductivity type of the semiconductor material layer 9, can be implanted into a surface portion of the semiconductor material layer 9 to form a source region 61 underneath the bottom surface of each backside trench 79.

Figure 12A:
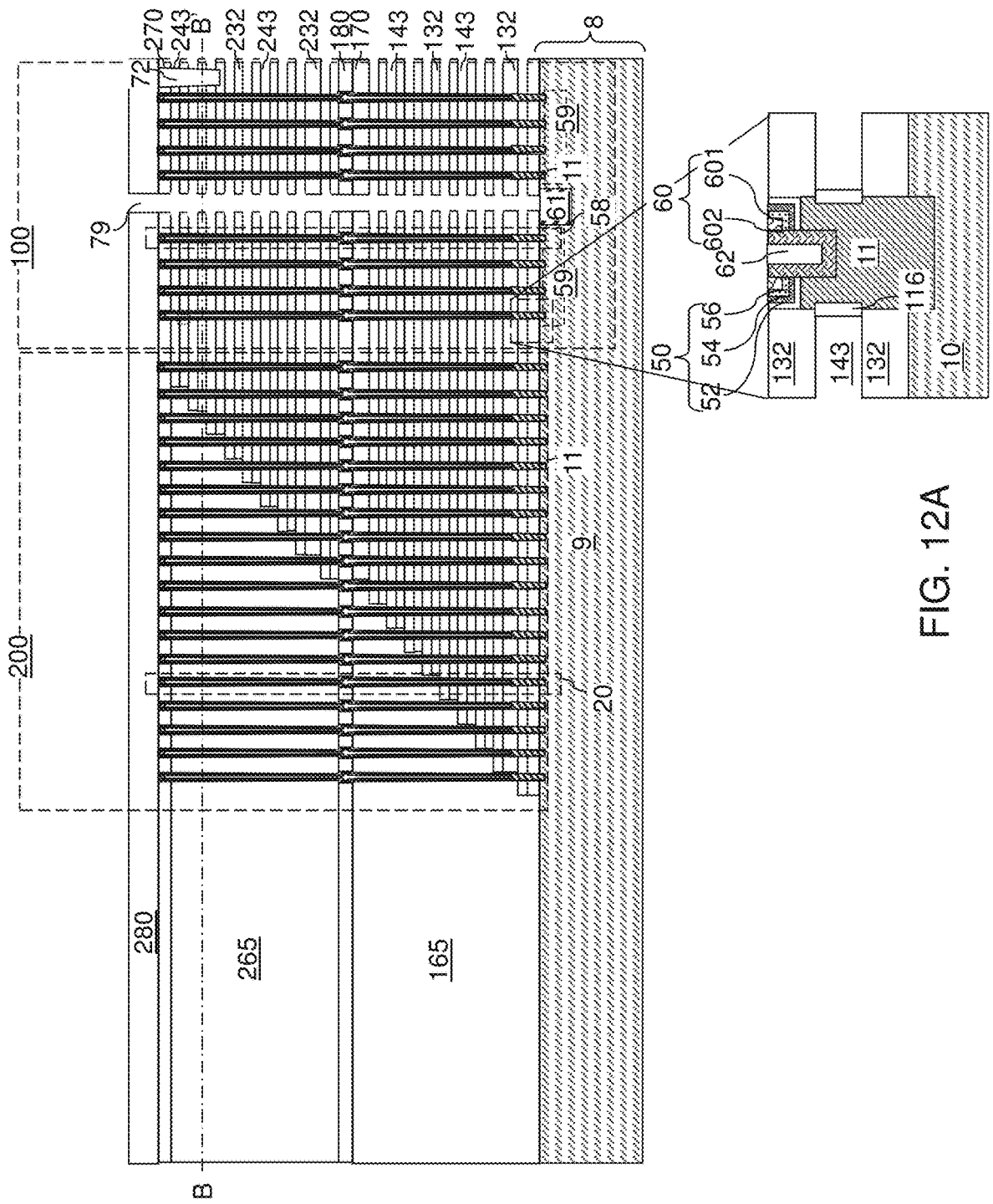
FIG. 12A is a vertical cross-sectional view of the first exemplary structure after formation of backside recesses according to an embodiment of the present disclosure.
Figure 12B:
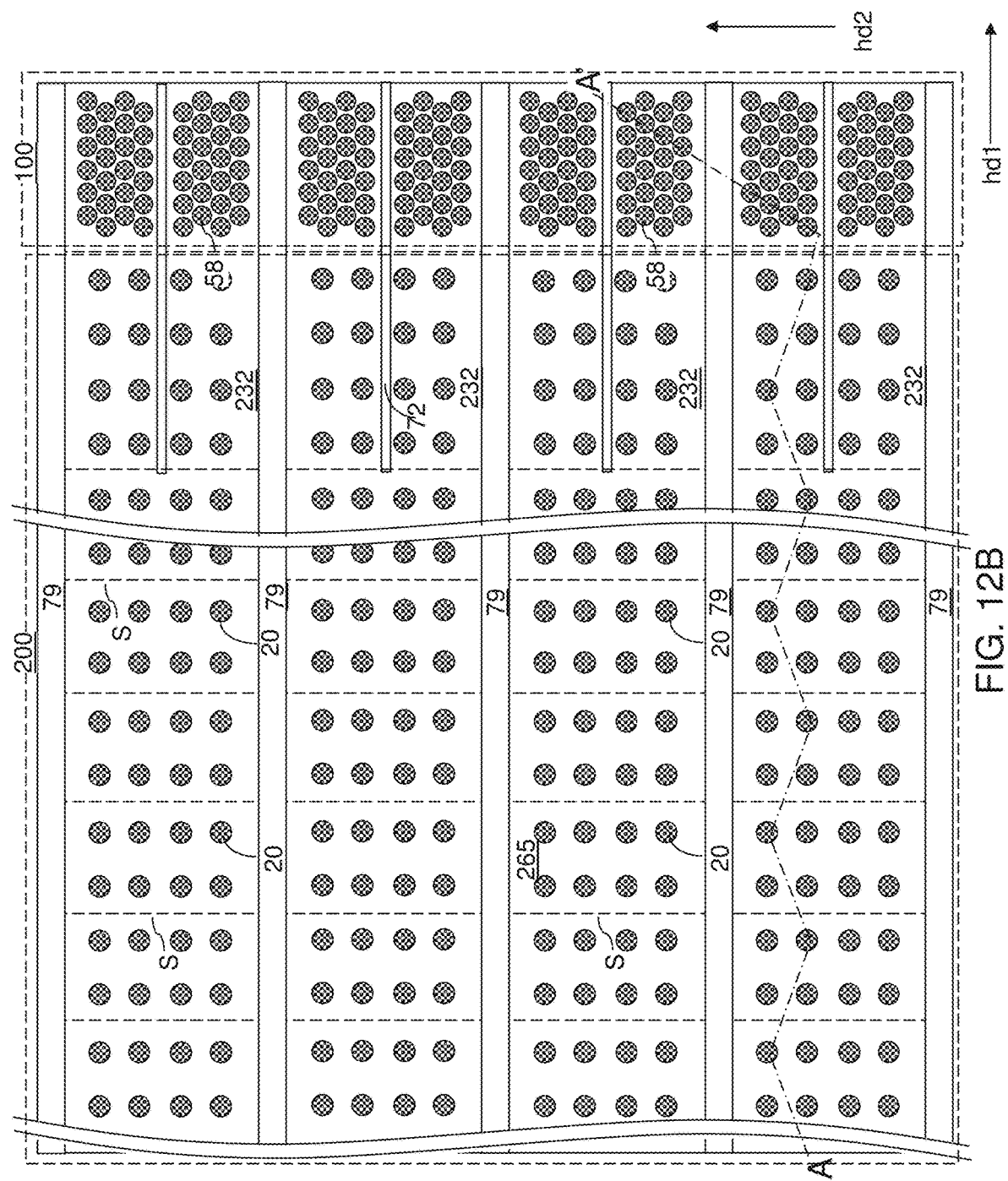
FIG. 12B is a horizontal cross-sectional view of the first exemplary structure along the horizontal plane B-B' in FIG. 12A. The hinged vertical plane A-A' corresponds to the plane of the vertical cross-sectional view of FIG. 12A.

Referring to FIGS. 12A and 12B, an etchant that selectively etches the materials of the first and second-tier sacrificial material layers (142, 242) with respect to the materials of the first and second-tier insulating layers (132, 232), the first and second insulating cap layers (170, 270), and the material of the outermost layer of the memory films 50 can be introduced into the backside trenches 79, for example, employing an isotropic etch process. First backside recesses 143 are formed in volumes from which the first-tier sacrificial material layers 142 are removed. Second backside recesses 243 are formed in volumes from which the second-tier sacrificial material layers 242 are removed. In one embodiment, the first and second-tier sacrificial material layers (142, 242) can include silicon nitride, and the materials of the first and second-tier insulating layers (132, 232), can be silicon oxide. In another embodiment, the first and second-tier sacrificial material layers (142, 242) can include a semiconductor material such as germanium or a silicon-germanium alloy, and the materials of the first and second-tier insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second-tier sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess. A plurality of first backside recesses 143 can be formed in the volumes from which the material of the first-tier sacrificial material layers 142 is removed. A plurality of second backside recesses 243 can be formed in the volumes from which the material of the second-tier sacrificial material layers 242 is removed. Each of the first and second backside recesses (143, 243) can extend substantially parallel to the top surface of the substrate, which may be a top surface of the semiconductor material layer 9. A backside recess (143, 243) can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second-tier sacrificial material layers (142, 242). Further, a top surface of the semiconductor material layer 9 can be physically exposed at the bottom of each backside trench 79. An annular dielectric spacer 116 can be formed around each pedestal channel portion 11 by oxidation of a physically exposed peripheral portion of the pedestal channel portions 11. Further, a semiconductor oxide potion (not shown) can be formed from each physically exposed surface portion of the semiconductor material layer 9 concurrently with formation of the annular dielectric spacers.

Figure 13:
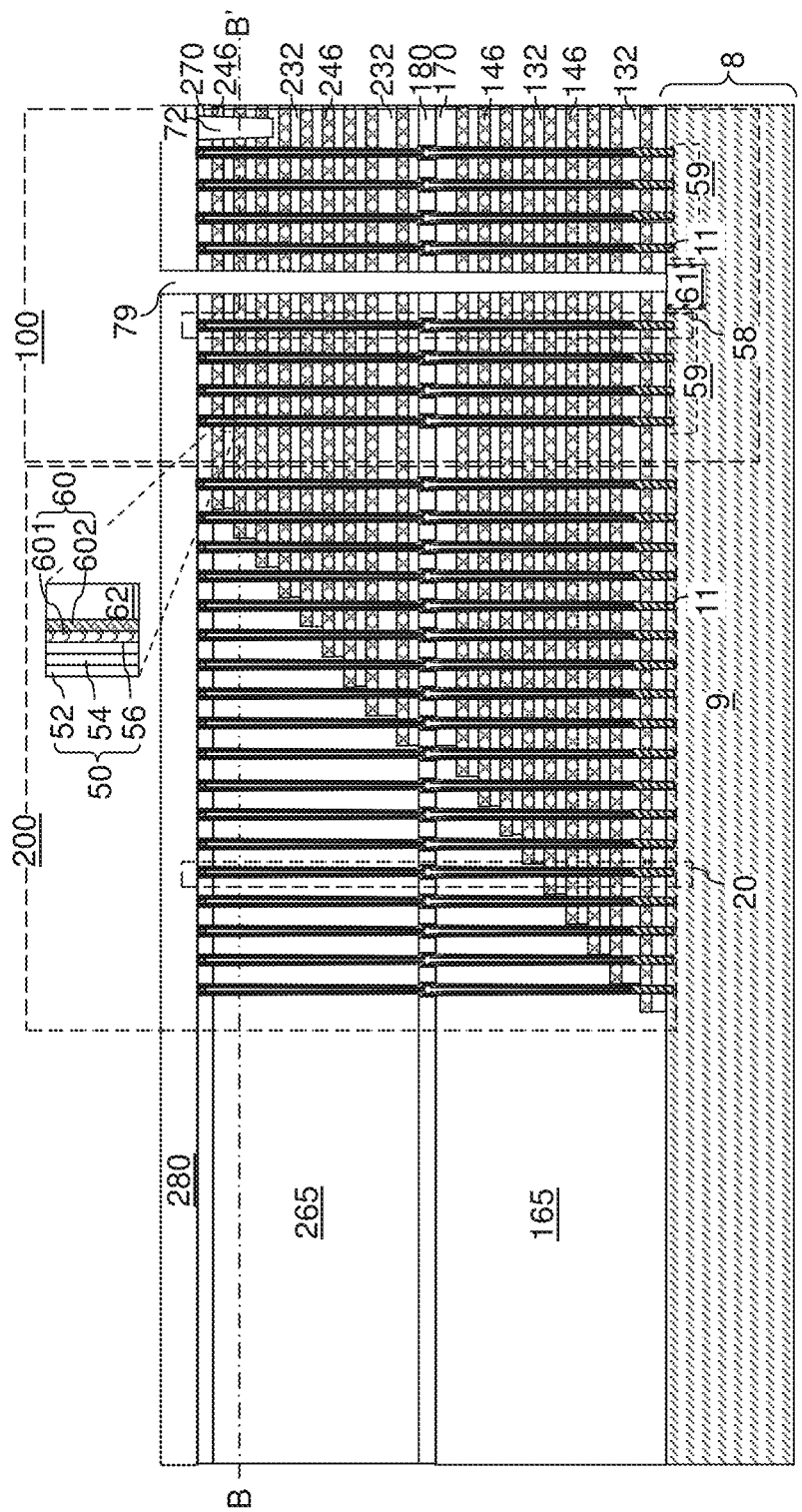
FIG. 13 is a vertical cross-sectional view of the first exemplary structure after replacement of sacrificial material layers with electrically conductive according to an embodiment of the present disclosure.

Referring to FIG. 13, a backside blocking dielectric layer (not shown) can be optionally deposited in the backside recesses and the backside trenches 79 and over the first contact-level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside trench 79, and over the first contact-level dielectric layer 280. The at least one conductive material can include at least one metallic material, i.e., an electrically conductive material that includes at least one metallic element.

A plurality of first-tier electrically conductive layers 146 can be formed in the plurality of first backside recesses 143, a plurality of second-tier electrically conductive layers 246 can be formed in the plurality of second backside recesses 243, and a continuous metallic material layer (not shown) can be formed on the sidewalls of each backside trench 79 and over the first contact-level dielectric layer 280. Thus, the first and second-tier sacrificial material layers (142, 242) can be replaced with the first and second conductive material layers (146, 246), respectively. Specifically, each first-tier sacrificial material layer 142 can be replaced with an optional portion of the backside blocking dielectric layer and a first-tier electrically conductive layer 146, and each second-tier sacrificial material layer 242 can be replaced with an optional portion of the backside blocking dielectric layer and a second-tier electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact-level dielectric layer 280, for example, by an anisotropic or isotropic etch. Each remaining portion of the deposited metallic material in the first backside recesses constitutes a first-tier electrically conductive layer 146. Each remaining portion of the deposited metallic material in the second backside recesses constitutes a second-tier electrically conductive layer 246. Each electrically conductive layer (146, 246) can be a conductive line structure.

A subset of the second-tier electrically conductive layers 246 located at the levels of the drain-select-level isolation structures 72 constitutes drain select gate electrodes. A subset of the first-tier electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The memory-level assembly is located over the semiconductor material layer 9. The memory-level assembly includes at least one vertically alternating sequence (132, 146, 232, 246) and memory stack structures 55 vertically extending through the at least one vertically alternating sequence (132, 146, 232, 246). Each alternating stack (132, 146, 232, 246) includes alternating layers of respective insulating layers (132, 232) and respective electrically conductive layers (146, 246). Each alternating stack (132, 146, 232, 246) comprises a staircase region that includes terraces in which each underlying electrically conductive layer (146, 246) extends farther along the first horizontal direction hd1 than any overlying electrically conductive layer (146, 246) in the memory-level assembly. Generally, the first sacrificial material layers 142 and the second sacrificial material layers 242 can be replaced with the first electrically conductive layers 146 and the second electrically conductive layers 246, respectively. The area within each plane between two backside trenches 79 may comprise one memory block.

Figure 14A:
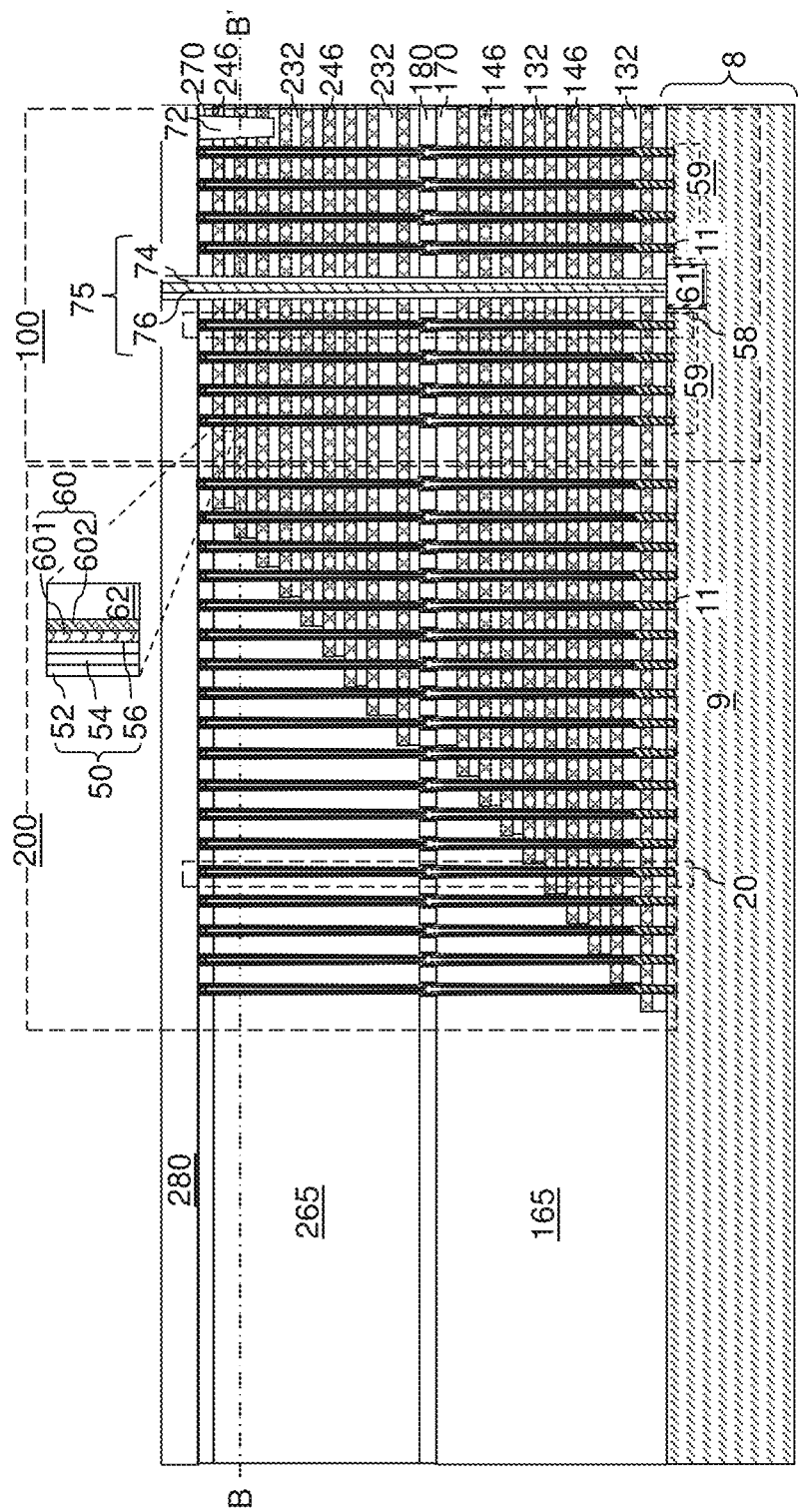
FIG. 14A is a vertical cross-sectional view of the first exemplary structure after formation of backside insulating spacers and backside via structures according to an embodiment of the present disclosure.
Figure 14B:
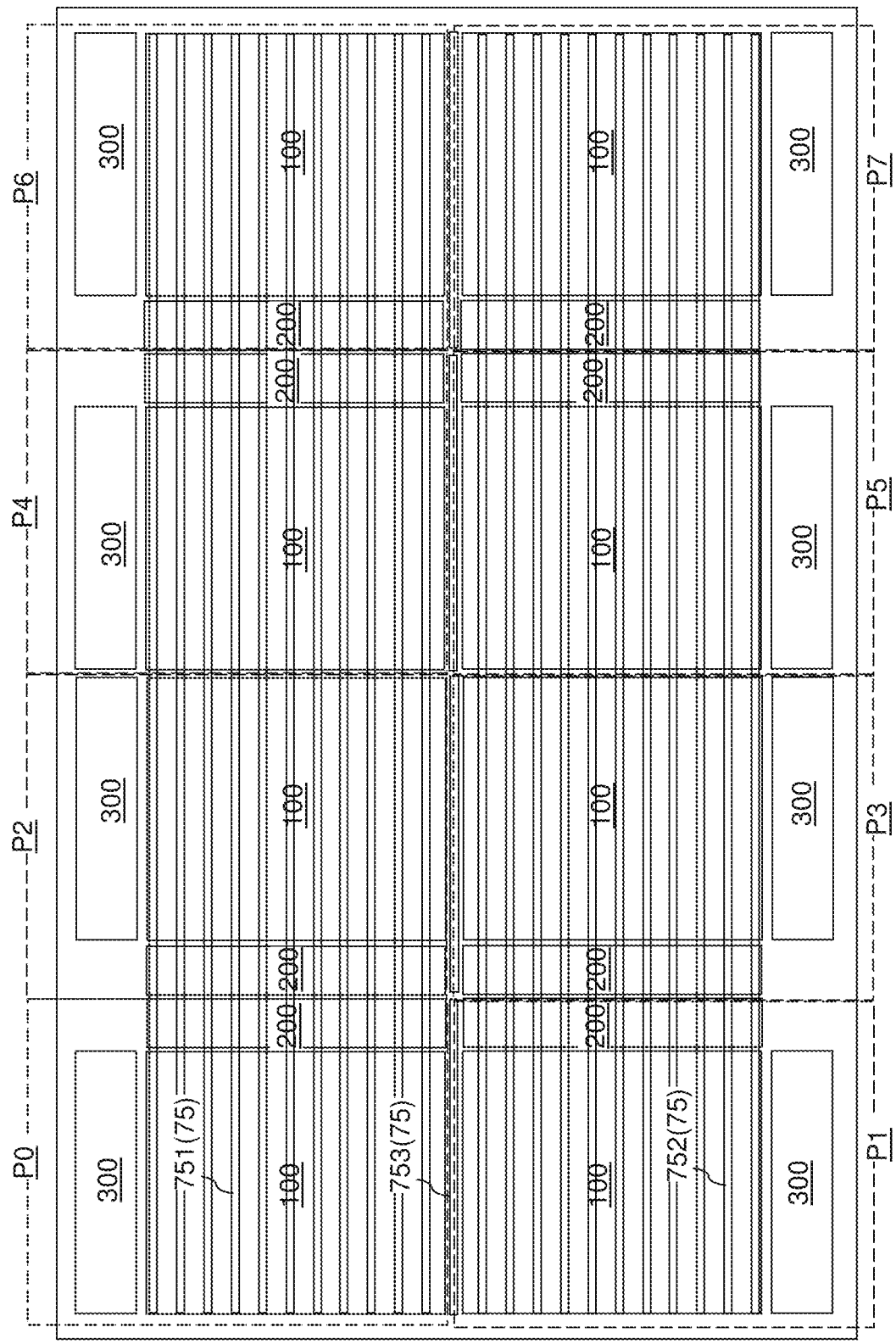
FIG. 14B illustrates a layout of the semiconductor die within the first exemplary structure of FIG. 14A in a plan view.

Referring to FIGS. 14A-14B, a conformal insulating material layer can be deposited in the backside trenches 79, and can be anisotropically etched to form backside insulating spacers 74. The backside insulating spacers 74 include an insulating material such as silicon oxide, silicon nitride, and/or a dielectric metal oxide. A cavity laterally extending along the first horizontal direction hd1 is present within each backside insulating spacer 74.

A backside conductive via structure 76 can be formed in the remaining volume of each backside trench 79, for example, by deposition of at least one conductive material and removal of excess portions of the deposited at least one conductive material from above a horizontal plane including the top surface of the first contact-level dielectric layer 280 by a planarization process such as chemical mechanical planarization or a recess etch. The backside conductive via structure 76 are electrically insulated in all lateral directions, and are laterally elongated along the first horizontal direction hd1. As such, the backside conductive via structure 76 are laterally elongated along the first horizontal direction hd1. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5. Each contiguous combination of an backside insulating spacer 74 and a backside conductive via structure 76 constitutes a backside trench fill structure 75 that fills a respective one of the backside trenches 79.

The backside trench fill structures 75 can include first backside trench fill structures 751 filling the first backside trenches 791, second backside trench fill structures 752 filling the second backside trenches 792, and inter-array backside trench fill structures 753 filling the inter-array backside trenches 793. Generally, the first backside trench fill structures 751, the second backside trench fill structures 752, and the inter-array backside trench fill structure 752 can be formed by depositing at least a dielectric material and optionally a conductive material (such as a metallic material) within the first backside trenches 791, the second backside trenches 792, and the inter-array backside trenches 793 simultaneously. An inter-array backside insulating material portion (such as an backside insulating spacer 74) can be deposited within each inter-array backside trench 793 directly on a sidewall of one of the first alternating stacks of a first plane including a first three-dimensional memory array, and directly on a sidewall of one of the second alternating stacks of a second plane including a second three-dimensional memory array.

Figure 15A:
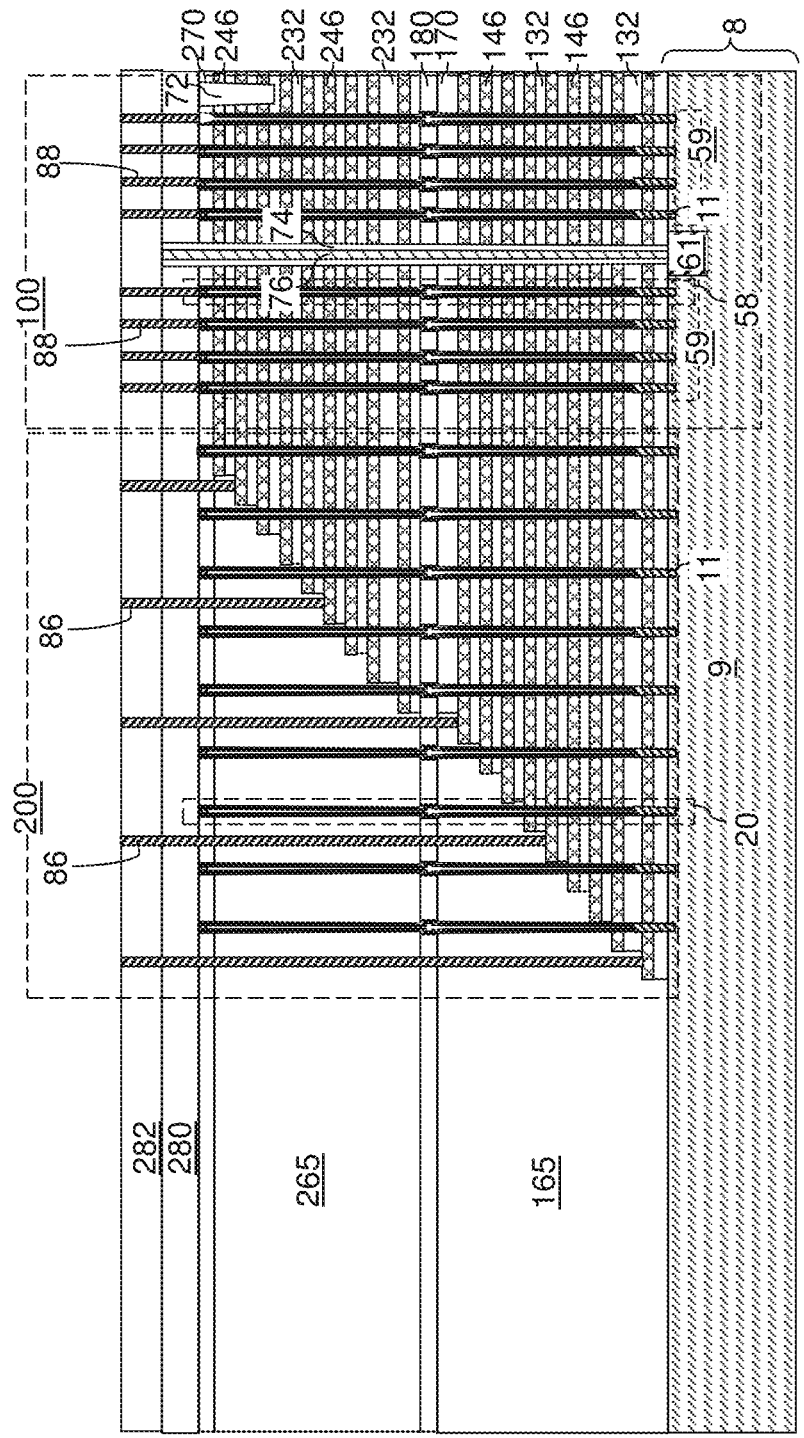
FIG. 15A is a vertical cross-sectional view of the first exemplary structure after formation of drain contact via cavities and word line contact via cavities according to an embodiment of the present disclosure.
Figure 15B:
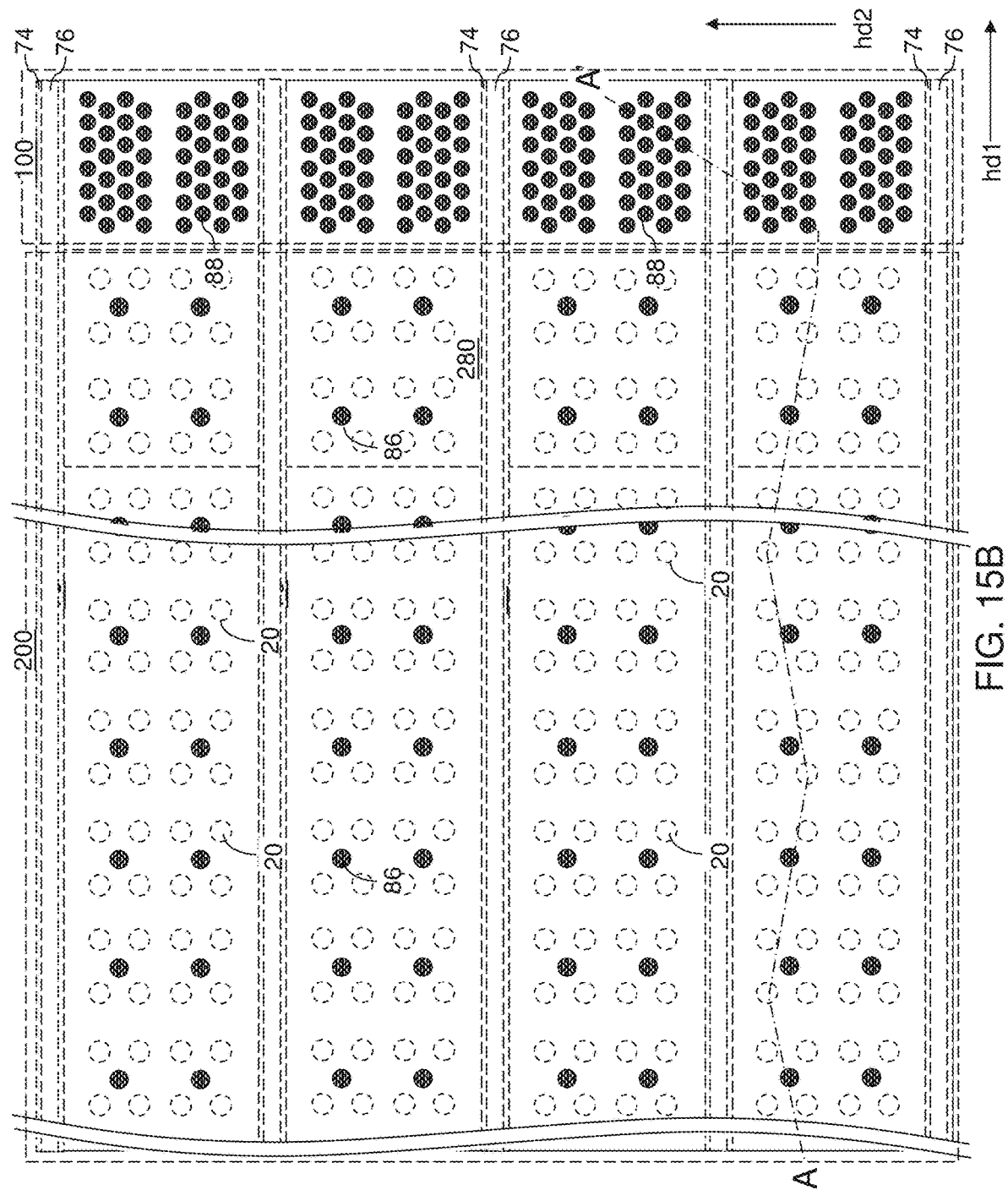
FIG. 15B is a horizontal cross-sectional view of the first exemplary structure along the horizontal plane B-B' in FIG. 15A. The hinged vertical plane A-A' corresponds to the plane of the vertical cross-sectional view of FIG. 15A.

Referring to FIGS. 15A and 15B, a second contact-level dielectric layer 282 can be optionally formed over the first contact-level dielectric layer 280. The second contact-level dielectric layer 282 includes a dielectric material such as silicon oxide or silicon nitride. The thickness of the second contact-level dielectric layer 282 can be in a range from 30 nm to 300 nm, although lesser and greater thicknesses can also be employed.

A photoresist layer (not shown) can be applied over the second contact-level dielectric layer 282, and can be lithographically patterned to form openings at locations at which various contact via structures are to be subsequently formed. The openings in the photoresist layer include word line contact openings that overlie horizontal surfaces of the first and second stepped surfaces in the contact region 200. Further, the openings in the photoresist layer include drain contact openings that overlie top surfaces of the memory stack structures 55.

A reactive ion etch process is performed to transfer the pattern of the openings in the photoresist layer through underlying dielectric material layers. Contact via cavities are formed through underlying dielectric material portions (282, 280, 270, 265, 165). The contact via cavities include drain contact via cavities that are formed through the second contact-level dielectric layer 282, the first contact-level dielectric layer 280, and the second insulating cap layer 270 above top surfaces of the drain regions 63 within the memory stack structures 55. Top surfaces of the drain regions 63 are physically exposed at the bottom of the drain contact via cavities. The contact via cavities further include word line contact via cavities that are formed through the second contact-level dielectric layer 282, the first contact-level dielectric layer 280, the second insulating cap layer 270, and the second and first retro-stepped dielectric material portions (165, 265) by the anisotropic etch process. Top surfaces of the first and second-tier electrically conductive layers (146, 246) are physically exposed at bottom regions of the word line contact via cavities.

At least one conductive material can be deposited in the contact via cavities. Excess portions of the at least one conductive material can be removed from above a horizontal plane including the top surface of the second contact-level dielectric layer 282 by a planarization process such as a recess etch process or a chemical mechanical planarization (CMP) process. Each remaining portion of the at least one conductive material in the word line contact via cavities constitutes a layer contact via structure 86, and each remaining portion of the at least one conductive material in the drain contact via cavities constitutes a drain contact via structure 88.

First contact via structures 86 within a first subset of the layer contact via structures 86 vertically extend through the second retro-stepped dielectric material portion 265 and the first retro-stepped dielectric material portion 165 and contact a top surface of a respective one of the first-tier electrically conductive layers 146. Second contact via structures 86 within a second subset of the layer contact via structures 86 vertically extend through the second retro-stepped dielectric material portion 265 and contact a top surface of a respective one of the second-tier electrically conductive layers 246.

Figure 16A:
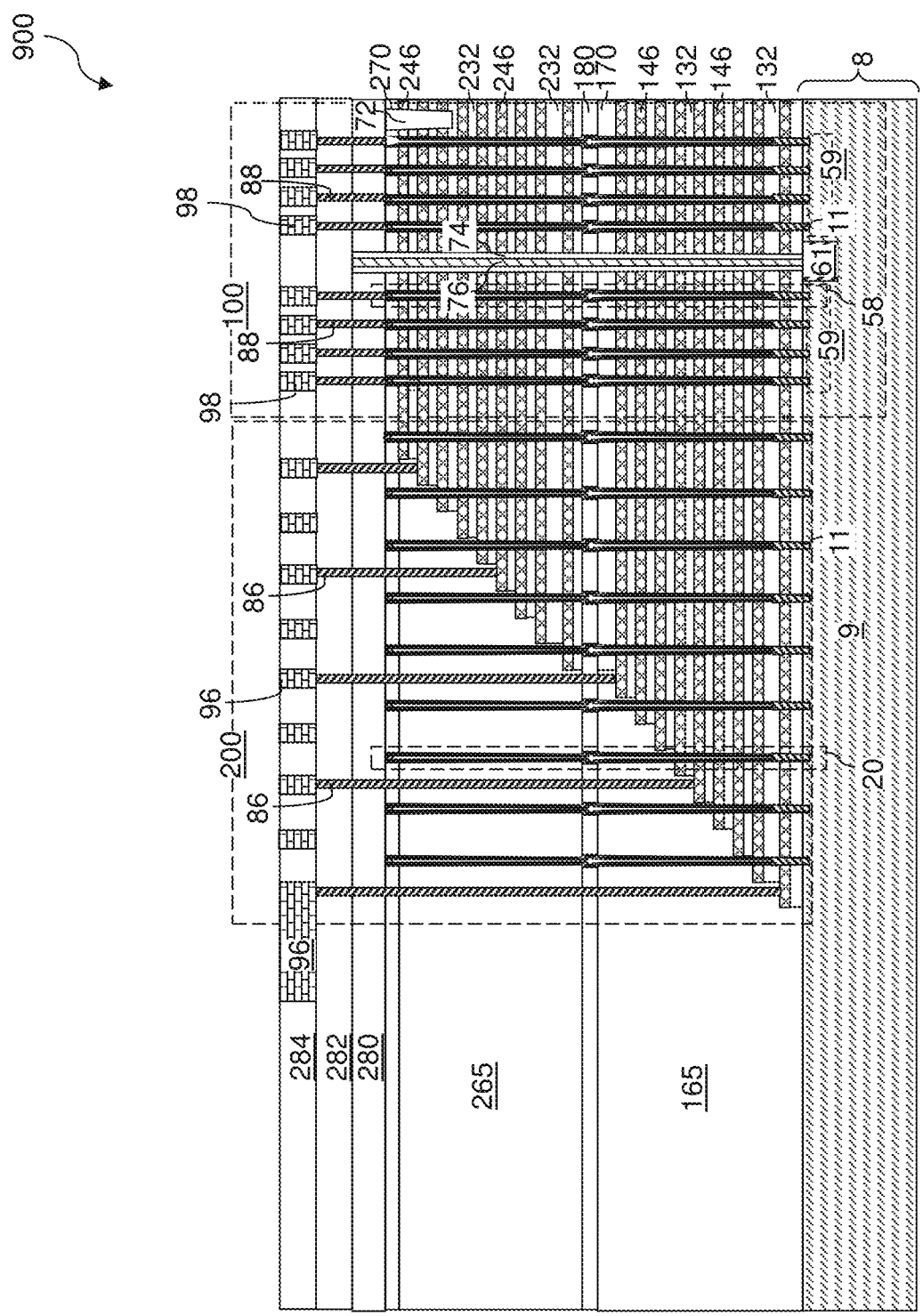
FIG. 16A is a vertical cross-sectional view of the first exemplary structure after formation of bit-line-level metal interconnect structures according to an embodiment of the present disclosure.
Figure 16B:
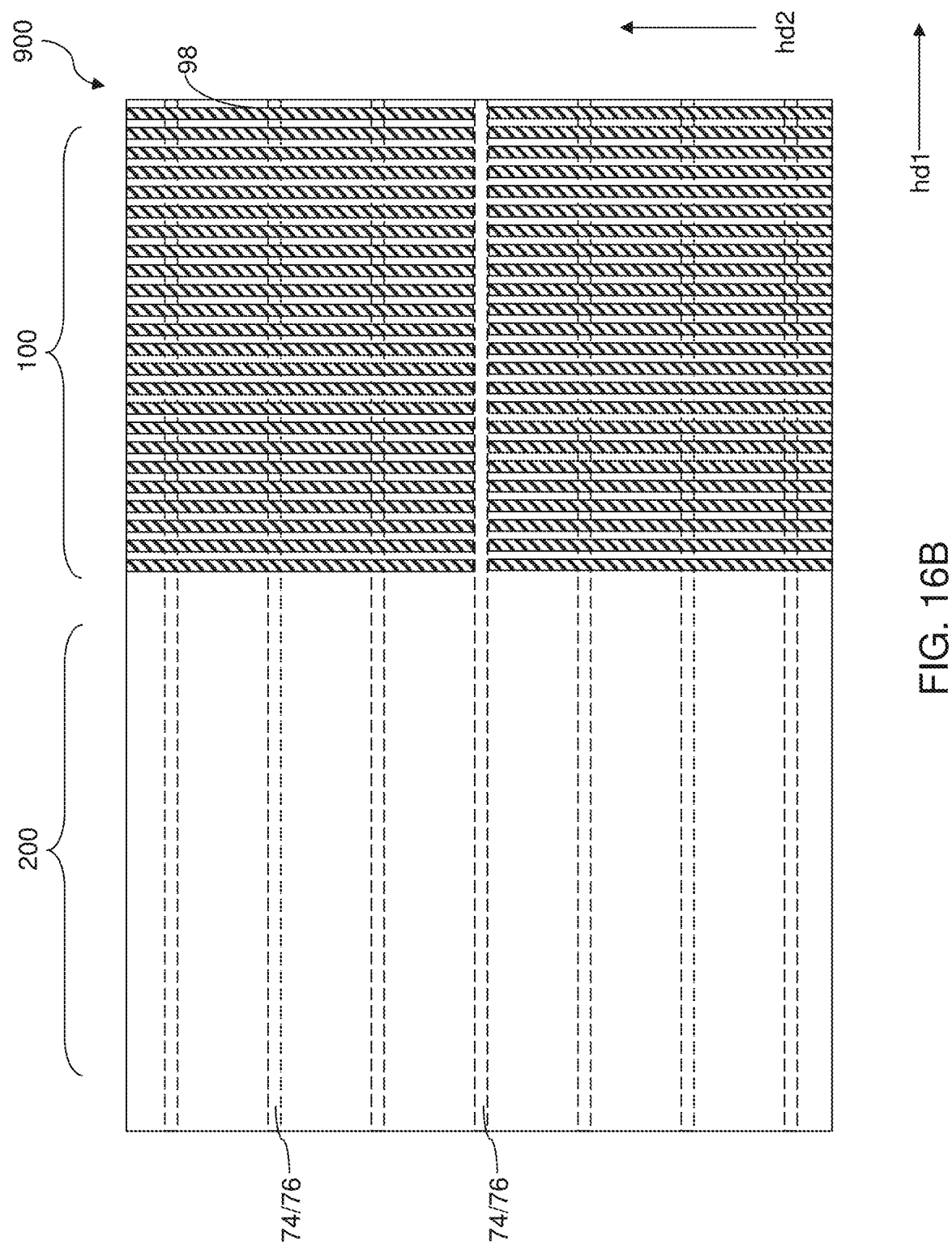
FIG. 16B is a top-down view of the area of the first exemplary structure of FIG. 16A.
Figure 16C:
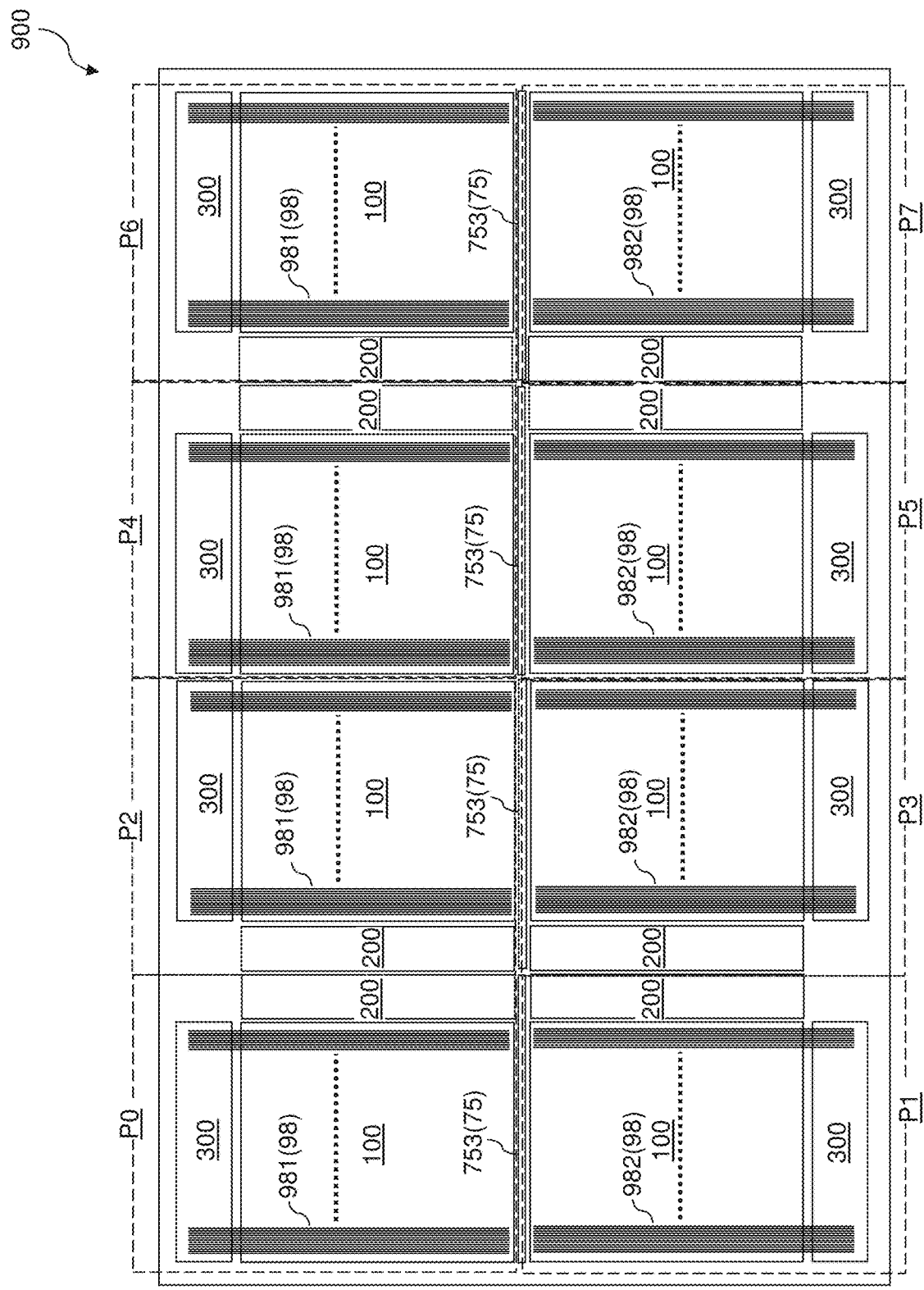
FIG. 16C illustrates a layout of a semiconductor die within the first exemplary structure of FIGS. 16A and 16B in a plan view.

Referring to FIGS. 16A-16C, at least one upper interconnect level dielectric layer 284 can be formed over the contact-level dielectric layers (280, 282). Various upper interconnect level metal structures can be formed in the at least one upper interconnect level dielectric layer 284. For example, the various upper interconnect level metal structures can include line-level metal interconnect structures (96, 98). The line-level metal interconnect structures (96, 98) can include bit lines 98 that contact a respective one of the drain contact via structures 88 and extend along the second horizontal direction (e.g., bit line direction) hd2 and perpendicular to the first horizontal direction (e.g., word line direction) hd1. It is noted that only two subsets of the bit lines 98 are illustrated within each plane (P0-P7), and some bit lines 98 are schematically indicated as dotted lines between two sets of bit lines 98 within each plane (P0-P7). Further, the line-level metal interconnect structures (96, 98) can include upper metal line structures 96 that contact a top surface of a respective one of the layer contact via structures 86 and/or another contact via structure (not shown) that vertically extend through the retro-stepped dielectric material portions (165, 265) or other dielectric material portions (not shown). Additional metal interconnect structures (not shown) and additional dielectric material layers (not shown) may be formed to provide electrical interconnection among the various components of a three-dimensional memory device in the first exemplary structure.

The bit lines 98 include first bit lines 981 formed within even-numbered planes (P0, P2, P4, P6) and second bit lines 982 formed within odd-numbered planes (P1, P3, P5, P7). Generally, the first bit lines 981 and the second bit lines 982 can be formed over the first alternating stacks of first insulating layers (132, 232) and first electrically conductive layers (146, 246) within each even-numbered plane (P0, P2, P4, P6), and over the second alternating stacks of second insulating layers (132, 232) and second electrically conductive layers (146, 246) within each odd-numbered plane (P1, P3, P5, P7). The first bit lines 981 are electrically connected to a respective subset of the first vertical semiconductor channels 60 through drain regions 63 and drain contact via structures 88 within a respective first three-dimensional memory array in a respective one of the even-numbered planes (P0, P2, P4, P6), and are electrically isolated from the second vertical semiconductor channels 60 within any other three-dimensional memory array in other planes. The second bit lines 982 are electrically connected to a respective subset of the second vertical semiconductor channels 60 through drain regions 63 and drain contact via structures 88 within a respective second three-dimensional memory array in a respective one of the odd-numbered planes (P1, P3, P5, P7), and are electrically isolated from the first vertical semiconductor channels 60 within any other three-dimensional memory array in other planes.

At least one additional dielectric layer and bonding pads (e.g., bonding pads 998 shown in FIG. 18) are then formed over the bit lines 98. The bit lines 98 are electrically connected to the bonding pads by one or more contact via structures. This completes formation of the memory die 900.

Figure 17B:
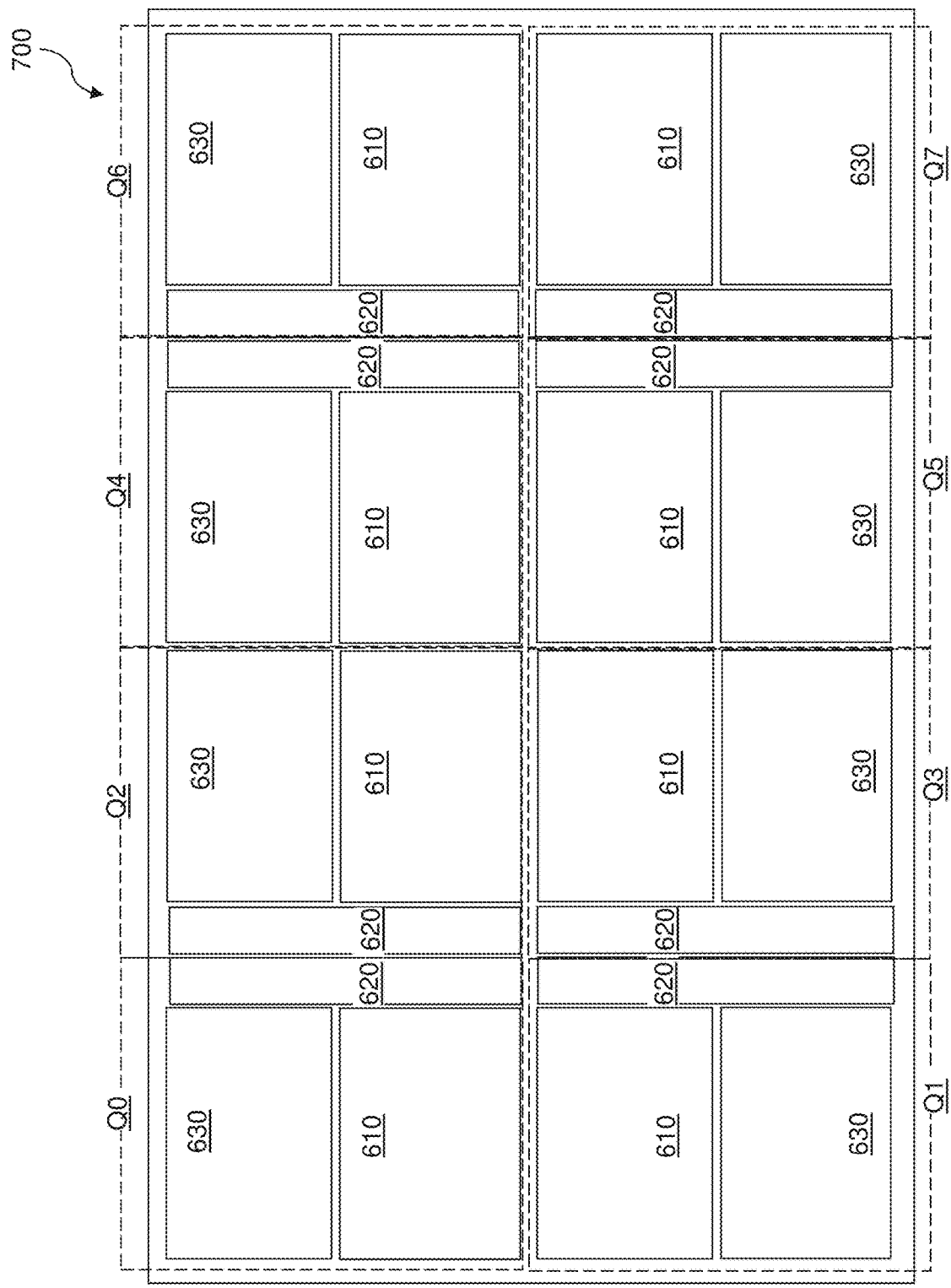
FIG. 17B illustrates a layout of the logic die of FIG. 17A in a plan view.

Referring to FIGS. 17A and 17B, a logic die 700 according to an embodiment of the present disclosure is illustrated. The logic die 700 can include a logic-die substrate 708 and a peripheral circuit 710 formed thereupon. The logic-die substrate 708 includes a logic-die substrate semiconductor layer 709 at least at an upper portion thereof. Shallow trench isolation structures 720 may be formed in an upper portion of the logic-die substrate semiconductor layer 709 to provide electrical isolation from other semiconductor devices. The peripheral circuit 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758.

The logic die 700 can have multiple plane peripheral (i.e., driver or control) circuit (Q0-Q7), each of which can have the same area as a corresponding plane (P0-P7) of the semiconductor die illustrated in FIG. 16C. The logic die 700 may be one of a plurality of logic dies 700 provided over a semiconductor wafer. Each plane peripheral circuit (Q0-Q7) of the logic die 700 includes a peripheral circuit 710 configured to operate a respective three-dimensional memory array within one of the planes (P0-P7) of the semiconductor die illustrated in FIG. 16C. In one embodiment, each plane peripheral circuit (Q0-Q7) of the logic die 700 may include a word line driver circuit 620 that includes word line switching transistors, a bit line driver circuit 630 that includes sense amplifiers, and miscellaneous peripheral circuits 610 that are employed for operation of a respective three-dimensional memory array in the respective plane to be subsequently electrically connected thereto.

Dielectric material layers are formed over the semiconductor devices, which are herein referred to as dielectric material layers 760. The dielectric material layers 760 may include, for example, a dielectric liner 762 (such as a silicon nitride liner that blocks diffusion of mobile ions and/or apply appropriate stress to underlying structures), interconnect dielectric layers 764 that overlie the dielectric liner 762, a silicon nitride layer (e.g., hydrogen diffusion barrier) 766 that overlies the interconnect dielectric layers 764, and a bonding-pad-level dielectric layer 768.

The dielectric material layers 760 function as a matrix for metal interconnect structures 780 that provide electrical connection between the peripheral circuit 710 and logic-side bonding pads 798. The logic-side bonding pads 798 are embedded within the bonding-pad-level dielectric layer 768. Each dielectric material layer within the interconnect dielectric layers 764 may include any of doped silicate glass, undoped silicate glass, organosilicate glass, silicon nitride, silicon oxynitride, and dielectric metal oxides (such as aluminum oxide). In one embodiment, the interconnect dielectric layers 764 may comprise, or consist essentially of, dielectric material layers having dielectric constants that do not exceed the dielectric constant of undoped silicate glass (silicon oxide) of 3.9. The metal interconnect structures 780 are formed within the dielectric layer stack of the lower-level dielectric material layers 760. The metal interconnect structures 780 may include various metal via structures 786 and various metal line structures 788.

Generally, the logic die 700 includes a support circuitry configured to control operation of the memory die 900 containing the three-dimensional memory arrays within the planes (P0-P7) of FIGS. 16A-16C. The logic-side bonding pads 798 can have a mirror image pattern of a pattern of the memory-side bonding pads (e.g., bonding pads 998 shown in FIG. 18).

Figure 18:
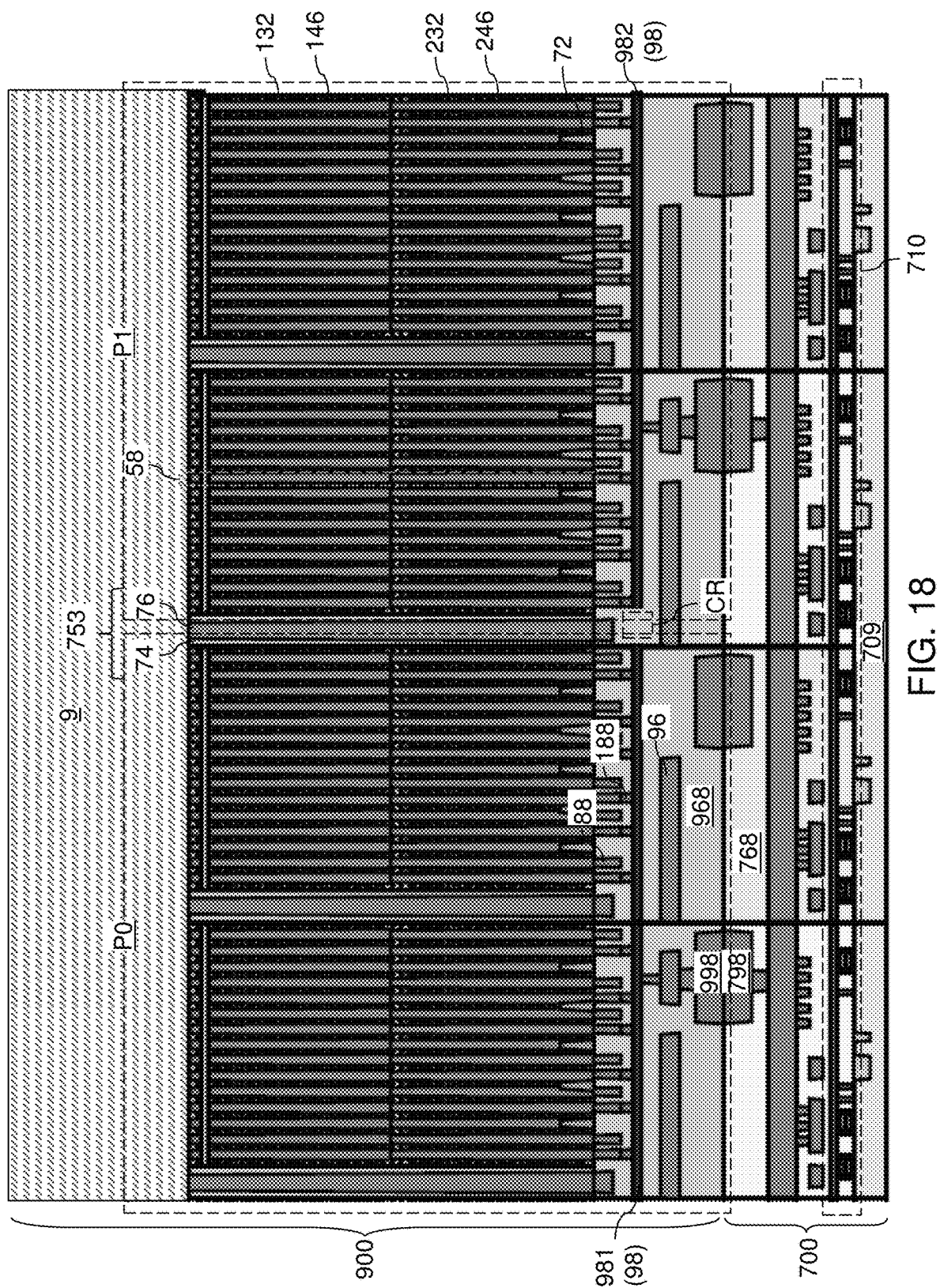
FIG. 18 is a vertical cross-sectional view of the first exemplary structure after bonding the semiconductor die to the logic die according to the first embodiment of the present disclosure.

Referring to FIG. 18, the logic die 700 can be bonded to the memory die 900 of FIGS. 16A-16C. For example, wafer-to-wafer bonding can be employed to bond a first wafer including a plurality of instances of the memory die 900 of FIGS. 16A-16C to a second wafer including a plurality of instances of the logic die 700. The logic-side bonding pads 798 are bonded to a respective one of the memory-side bonding pads 998 through metal-to-metal bonding. In case the bonding-pad-level dielectric layer 768 and the topmost dielectric layer 968 of the memory die 900 include silicon oxide, oxide-to-oxide bonding may be used in addition to or instead of metal-to-metal bonding.

Generally, the logic-side bonding pads 798 can be bonded to a respective one of the memory-side bonding pads 998. The logic die 700 includes a support circuitry (i.e., a peripheral circuit) configured to control operation of the three-dimensional memory device within the memory die 900. A cut region CR can be provided at a bit line level between first bit lines 981 and second bit lines 982 of a neighboring pair of planes (e.g., P0 and P1 shown in FIG. 18). The lateral spacing between the neighboring pair of planes that employ different sets of bit lines 98 can be the same as the width of a backside trench fill structure 75, which may include a backside insulating material portion (such as an backside insulating spacer 74) and optionally a conductive structure, such as a backside conductive via structure 76.

Generally, the bit lines 98 may contact a respective subset of the drain contact via structures 88 directly, or may be electrically connected to a respective subset of the drain contact via structures 88 through additional connection via structures 188.

Figure 19:
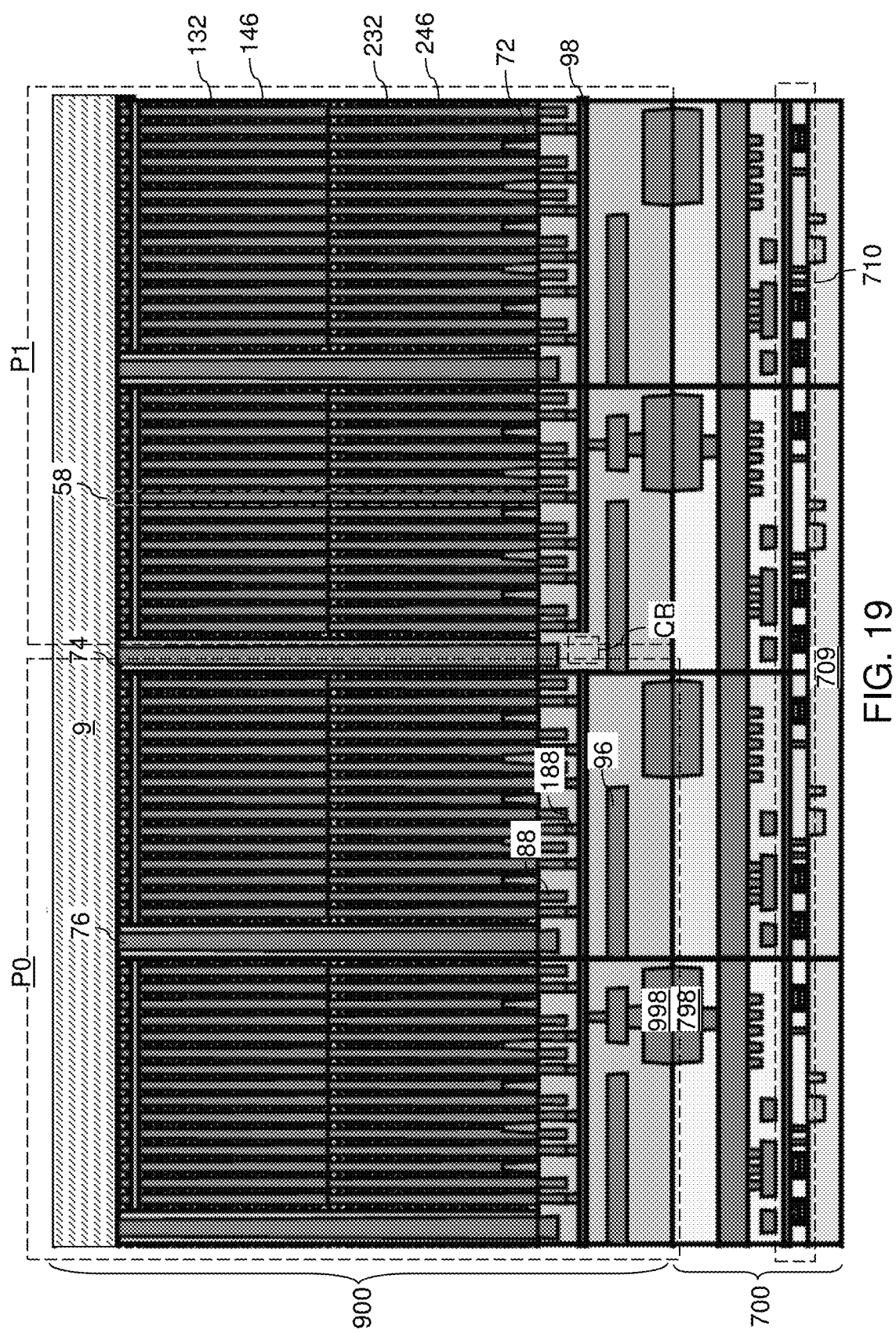
FIG. 19 is a vertical cross-sectional view of the first exemplary structure after thinning the backside of the semiconductor die according to the first embodiment of the present disclosure.

Referring to FIG. 19, the backside of the substrate semiconductor layer 9 may be optionally thinned, for example, by grinding, polishing, an anisotropic etch process, and/or an isotropic etch process. The thickness of the substrate semiconductor layer 9 after thinning may be in a range from 100 nm to 6,000 nm, although lesser and greater thicknesses may also be employed. In one embodiment, the substrate semiconductor layer 9 may be a single crystalline semiconductor material layer such as a single crystalline silicon layer.

Thus, parallel operation of each plane (P0-P7) is available for programming and reading steps. In the embodiment of FIG. 19, there are eight planes and two horizontal source lines in the substrate semiconductor layer 9. The source lines are separated along the second horizontal direction (i.e., bit line direction) between planes P2, P3 and planes P4, P5.

Figure 20A:
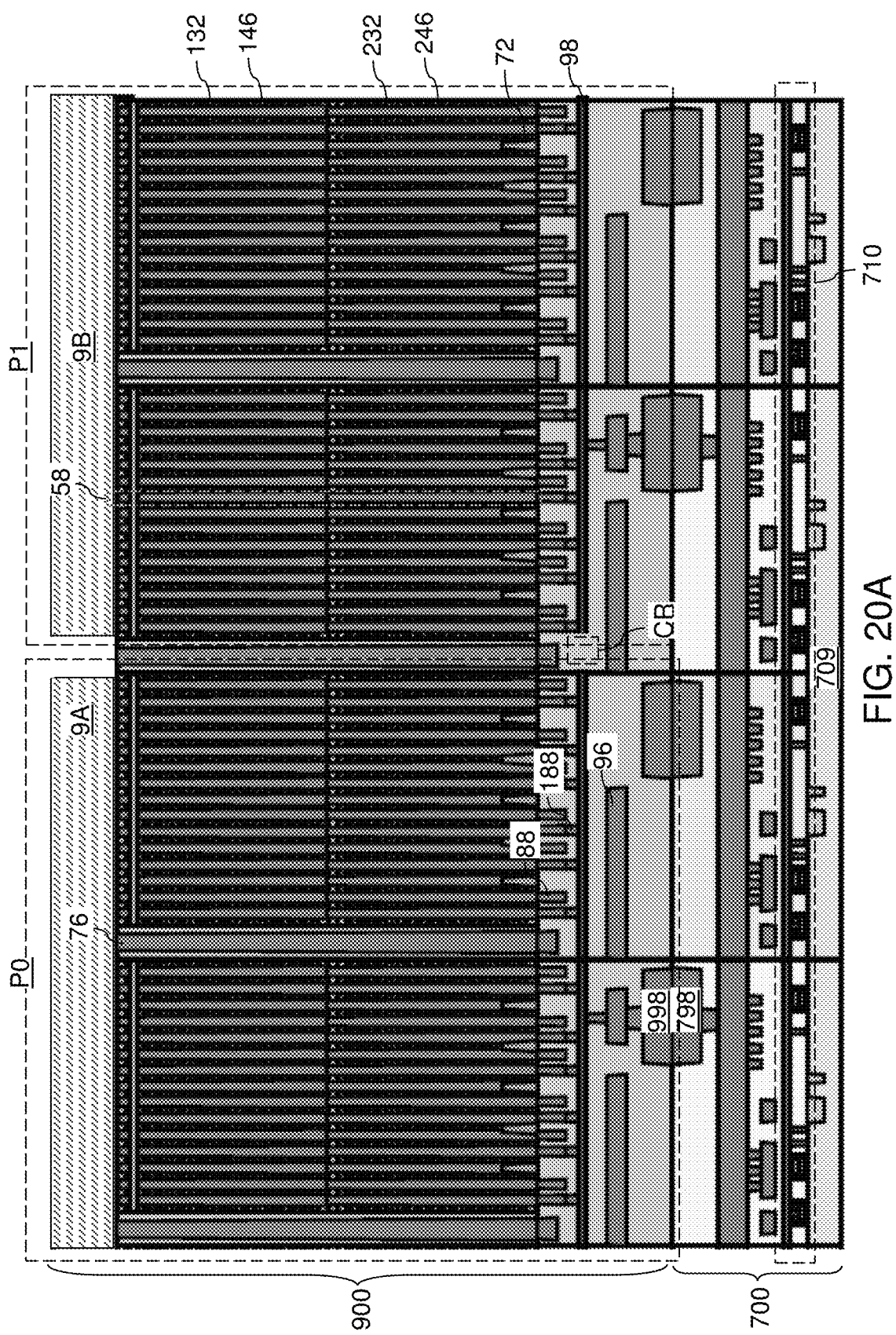
FIG. 20A is a vertical cross-sectional view of a first alternative configuration of the first exemplary structure according to the first embodiment of the present disclosure.
Figure 20B:
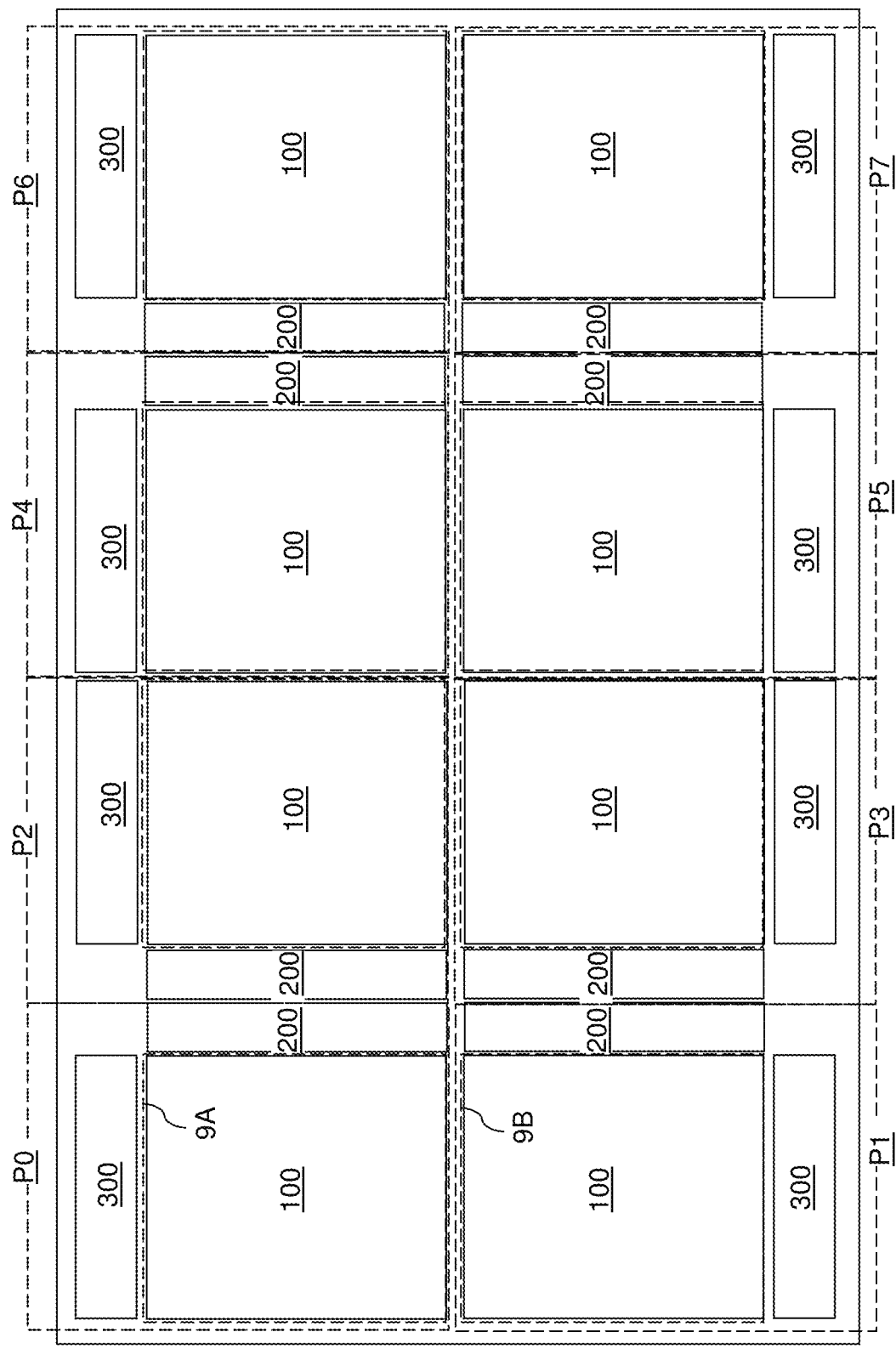
FIG. 20B is a top-down view of a semiconductor chip including the illustrated portion of the first alternative configuration of the first exemplary structure according to the first embodiment of the present disclosure.

Referring to FIGS. 20A and 20B, a first alternative configuration of the first exemplary structure according to the first embodiment of the present disclosure can be derived from the first exemplary structure of FIG. 19 by patterning the substrate semiconductor layer 9. Specifically, the substrate semiconductor layer 9 can be divided into multiple discrete substrate semiconductor layers (9A, 9B) that are located entirely within the area of a respective one of the planes (P0-P7). Thus, the source-side electrical connection of each plane (P0-P7) can be independent from each other, and each plane can be operated independently. The substrate semiconductor layers (9A, 9B) are separated at the inter-array backside trench fill structure 753 along the first horizontal direction (i.e., word line direction) hd1, and over the locations of the contact regions 200 in the memory die 900 (which overlie the word line driver circuit 620 in the logic die) along the second horizontal direction hd2. Thus, parallel operation of each plane (P0-P7) is available for programming, erasing and reading steps. In the embodiment of FIG. 20B, there are eight planes and eight horizontal source lines in the substrate semiconductor layer 9. In some embodiments, a selected subset of the planes (P0-P7) may be powered, while the rest of the planes (P0-P7) are not powered to reduce electrical power consumption.

Figure 21:
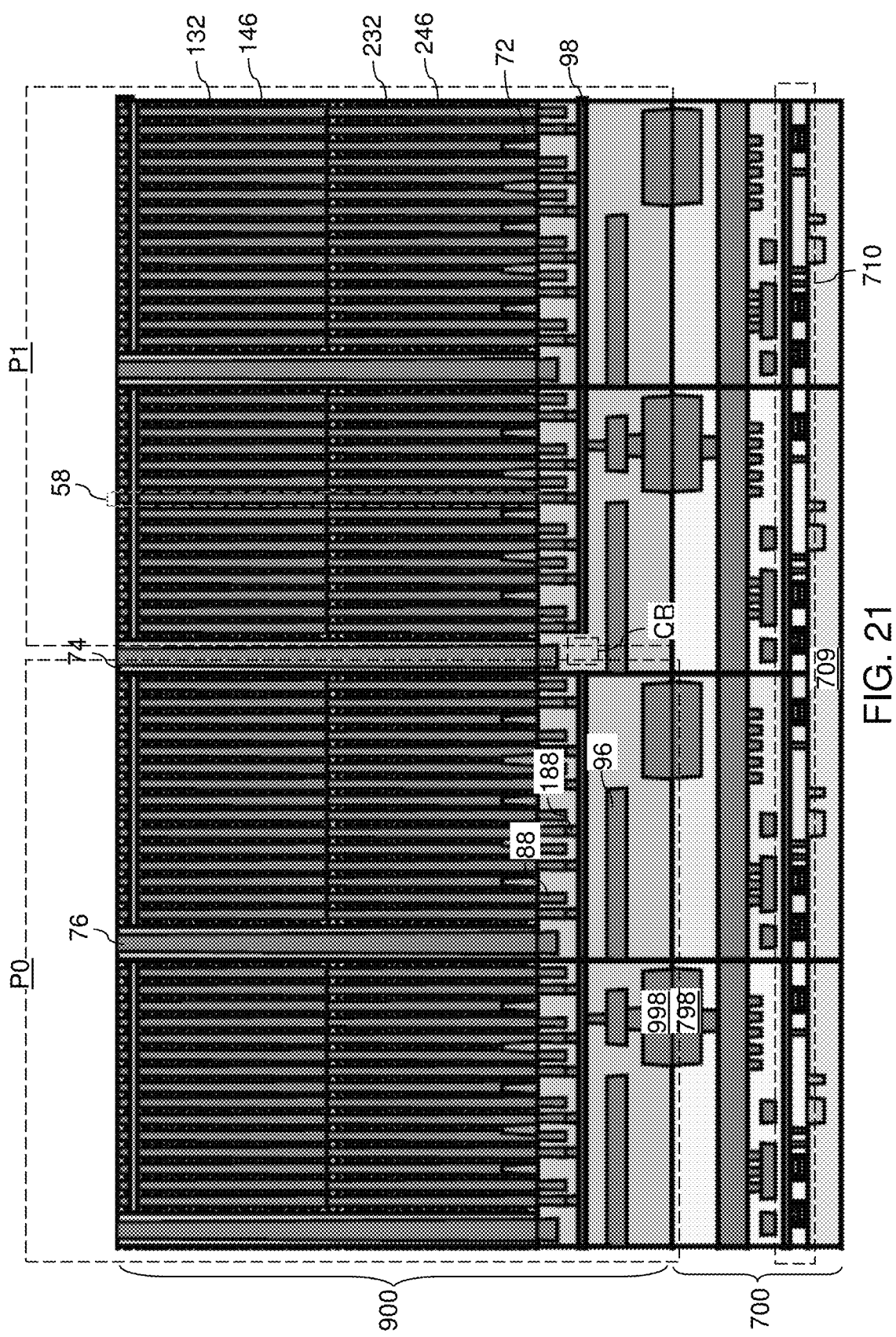
FIG. 21 is a vertical cross-sectional view of a second alternative configuration of the first exemplary structure after removing a semiconductor material layer according to the first embodiment of the present disclosure.

Referring to FIG. 21, a second alternative configuration of the first exemplary structure can be derived from the first exemplary structure of FIG. 19 by removing the substrate semiconductor layer 9 by selective etching, polishing or by using a sacrificial release layer between the substrate semiconductor layer 9 and the alternating stacks (132, 146), as described, for example, in U.S. Pat. No. 10,629,616 B1, incorporated herein by reference in its entirety. Optionally, physically exposed portions of the memory films 50 may be removed, for example, by performing at least one selective etch process to physically expose areas of the vertical semiconductor channels 60. In some embodiments, the pedestal channel portions 11 may be omitted, and the vertical semiconductor channels 60 may be covered with protruding portions of the memory films 50. In such embodiments, top ends of the vertical semiconductor channels 60 may be physically exposed by removing portions of the memory films 50 employing at least one isotropic etch process that removes the materials of the memory films 50 selective to the material of the vertical semiconductor channels 60.

Figure 22:
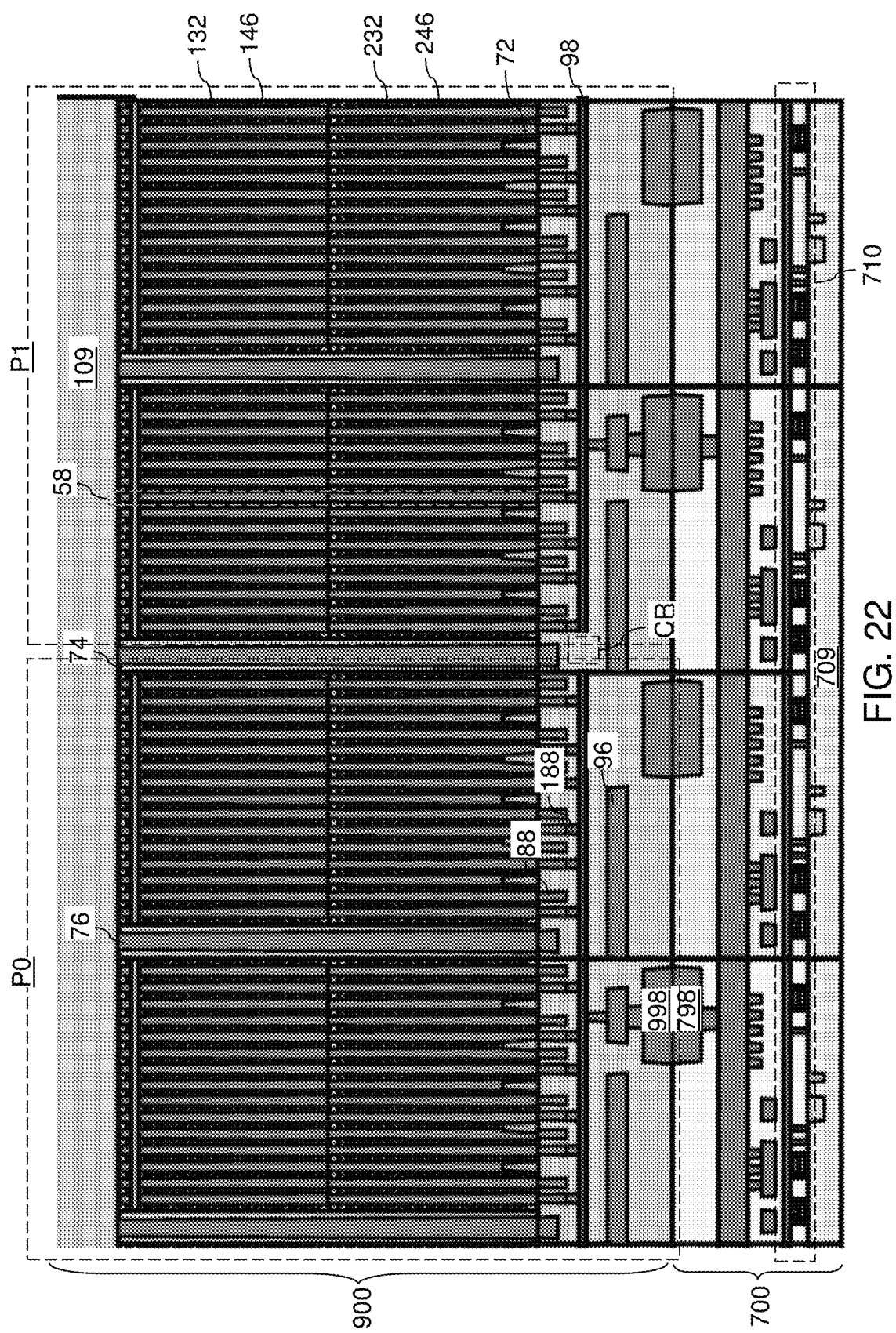
FIG. 22 is a vertical cross-sectional view of the second alternative configuration of the first exemplary structure after formation of a polycrystalline semiconductor material layer according to the first embodiment of the present disclosure.

Referring to FIG. 22, at least one electrically conductive material layer can be deposited on the physically exposed surface of the vertical semiconductor channels 60 and/or the pedestal channel portions 11 to form a source line 109, as described, for example, in U.S. Pat. No. 10,629,616 B1, incorporated herein by reference in its entirety. In one embodiment, the source line 109 may include a doped polycrystalline semiconductor material layer such as a heavily doped polysilicon layer. Optionally, the source line 109 may include a metal layer (not expressly shown) that is formed instead of or on top of the doped polycrystalline semiconductor material layer.

Figure 23:
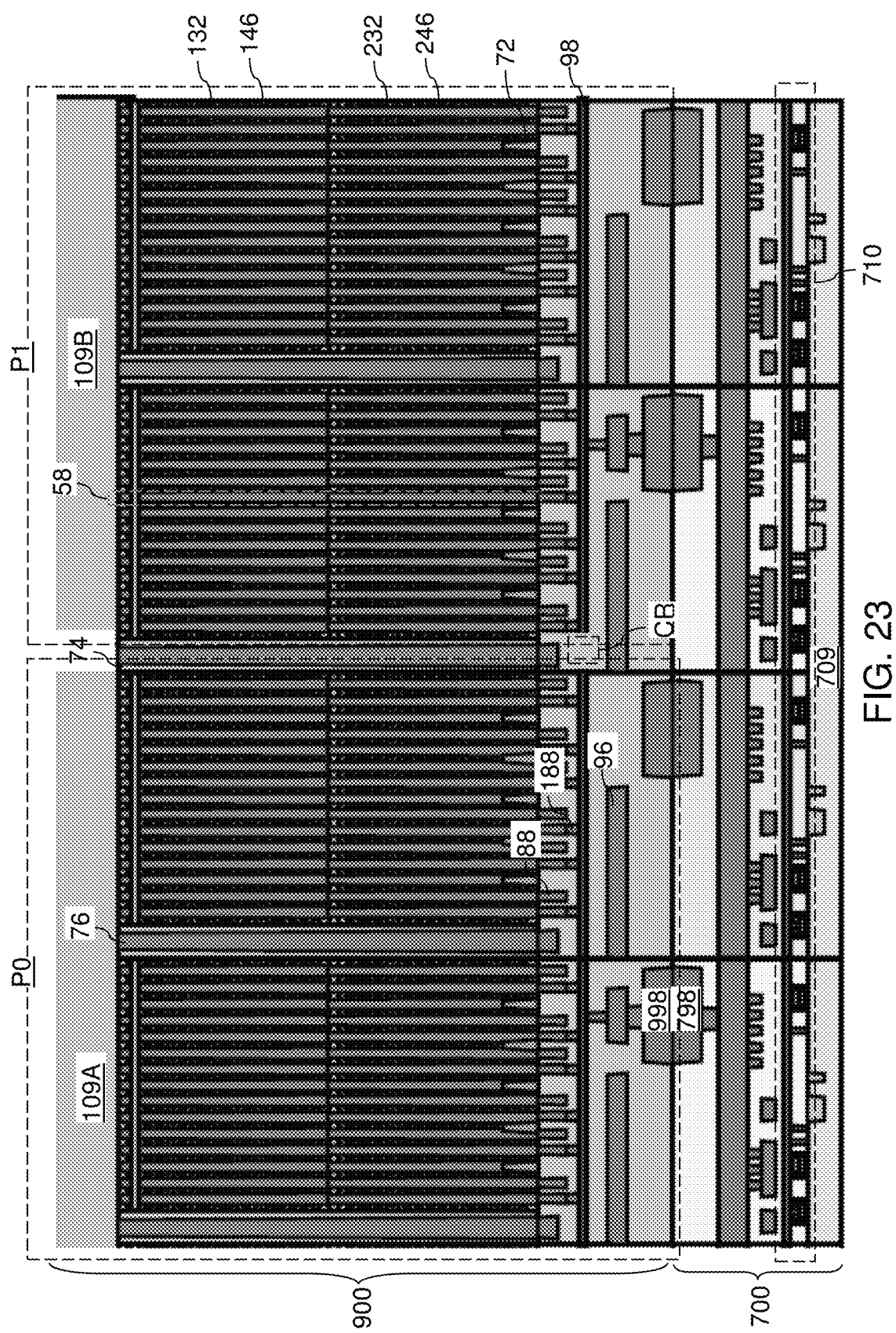
FIG. 23 is a vertical cross-sectional view of a third alternative configuration of the first exemplary structure after patterning of the polycrystalline semiconductor material layer according to the first embodiment of the present disclosure.

Referring to FIG. 23, a third alternative configuration of the first exemplary structure can be derived from the second alternative configuration of the first exemplary structure after patterning of the source line 109. Specifically, the source line 109 can be divided into multiple discrete source lines (109A, 109B) that are located entirely within the area of a respective one of the planes (P0-P7), similar to the configuration shown in FIGS. 20A and 20B. Thus, the source-side electrical connection of each plane (P0-P7) can be independent from each other, and each plane can be operated independently. In some embodiments, a selected subset of the planes (P0-P7) may be powered, while the rest of the planes (P0-P7) are not powered to reduce electrical power consumption.

Generally, a peripheral circuit 710 comprising a first bit line driver circuit 630 and a second bit line driver circuit 630 can be provided on the substrate on which memory planes are present, or on another substrate such as the logic-side substrate semiconductor layer 709. The first bit line driver circuit 630 can be electrically connected to the first bit lines 981 within a first three-dimensional memory array (which may be provided in a first plane), and the second bit line deriver circuit 630 can be electrically connected to the second bit lines 982 within a second three-dimensional memory array (which may be provided in a second plane) by forming metal interconnect structures and/or by metal-to-metal bonding. The first bit lines 981 and the second bit lines 982 do not have any areal overlap with the inter-array backside trench 793. The first bit line driver circuit 630 is electrically isolated from the second bit lines 982, and the second bit line driver circuit 630 is electrically isolated from the first bit lines 981.

Figure 24:
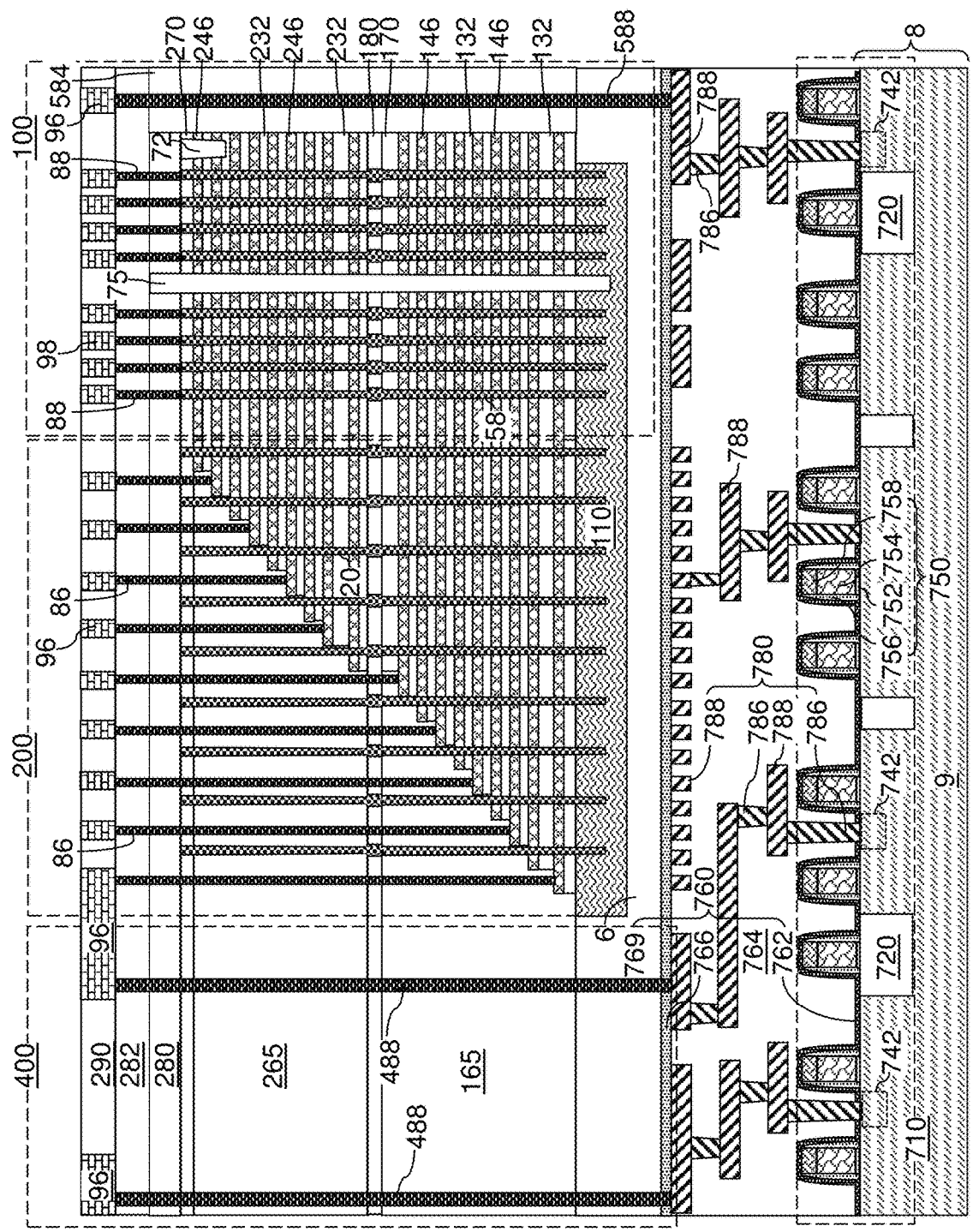
FIG. 24 is a vertical cross-sectional view of a second exemplary structure according to a second embodiment of the present disclosure.

Referring to FIG. 24, a second exemplary structure according to a second embodiment of the present disclosure is illustrated. The second exemplary structure can be derived from the first exemplary structure by forming the peripheral circuit 710 over the same substrate 8 as the three-dimensional memory arrays. Specifically, the peripheral circuit 710 can be formed on a top surface of the substrate semiconductor layer 9. A source contact layer 110 embedded within a source-level dielectric layer 769 can be formed over the silicon nitride liner 766. Optionally, dielectric pillar structures 584 may be formed though the alternating stacks of insulating layers (132, 232) and electrically conductive layers (146, 246). Electrical connection between electrical nodes of the three-dimensional memory arrays and the peripheral circuits 710 can be provided by various through-memory-level connection via structures (488, 588), which may vertically extend through retro-stepped dielectric material portions (165, 265) or the dielectric pillar structures 584. The geometry of the backside trench fill structures 75 can be the same as in the first exemplary structure.

The source contact layer 110 may include a single crystalline semiconductor material layer or a polycrystalline semiconductor material layer. The source contact layer 110 may laterally extend across multiple planes (P0-P7) in the same manner as the substrate semiconductor layer 9 illustrated in FIG. 19 or as the source line 109 illustrated in FIG. 22. Alternatively, each source contact layer 110 may be located entirely within the area of a respective plane (P0-P7) in the same manner as the substrate semiconductor layers 9 illustrated in FIGS. 20A and 20B or as the source lines 109 illustrated in FIG. 23.

Referring to all drawings and according to various embodiments of the present disclosure, a three-dimensional memory device comprises a first three-dimensional memory plane P0 including first alternating stacks of first insulating layers (132, 232) and first word lines (146, 246), first memory openings 49 vertically extending through a respective one of the first alternating stacks (132, 146, 232, 246) and filled with first memory opening fill structures 58 including a respective first vertical semiconductor channel 60 and first memory film 50, and first bit lines 981 overlying the first alternating stacks (132, 146, 232, 246), extending over an area of the first alternating stacks (132, 146, 232, 246), and electrically connected to a respective subset of the first vertical semiconductor channels 60

The memory device also comprises a second three-dimensional memory plane P1 including second alternating stacks of second insulating layers (132, 232) and second word lines (146, 246), second memory openings 49 vertically extending through a respective one of the second alternating stacks (132, 146, 232, 246) and filled with second memory opening fill structures 58 including a respective second vertical semiconductor channel 60 and second memory film 50, and second bit lines 982 overlying the second alternating stacks (132, 146, 232, 246), extending over the area of the second alternating stacks (132, 146, 232, 246) and electrically connected to a respective subset of the second vertical semiconductor channels 60 and electrically isolated from each of the first vertical semiconductor channels 60 and the first bit lines 981. An inter-array backside trench 793 laterally extending along a word line direction hd1 between the first three-dimensional memory plane P0 and the second three-dimensional memory plane P1, and filled with an inter-array backside trench fill structure 753 comprising an inter-array backside insulating material portion (such as a backside insulating spacer 74).

In one embodiment, the first bit lines 981 do not have any areal overlap with the area of the second alternating stacks in plane P1 in a plan view (i.e., a view along a vertical direction), and the second bit lines 982 do not have any areal overlap with the area of the first alternating stacks in plane P0 in plan view.

In one embodiment, the first bit lines 981 and the second bit lines 982 do not have any areal overlap with an area of the inter-array backside trench 793 in a plan view.

In one embodiment, the first alternating stacks (132, 146, 232, 246) comprise first memory blocks which are laterally spaced from each other by first backside trenches 791 laterally extending along the word line direction hd1 and filled with first backside trench fill structures 751; and the second alternating stacks (132, 146, 232, 246) comprise second memory blocks which are laterally spaced from each other by second backside trenches 792 laterally extending along the word line direction hd1 and filled with second backside trench fill structures 752.

In one embodiment, each of the first backside trench fill structures 751 and the second backside trench fill structures 752 comprises a respective backside insulating material portion (such as a respective backside insulating spacer 74) having a same material composition as the inter-array backside insulating material portion (such as the backside insulating spacer 74 of the inter-array backside trench fill structure 753.

In one embodiment, each of the backside insulating material portions (such as a respective backside insulating spacer 74) comprises a respective backside insulating spacer 74; and the inter-array backside insulating material portion comprises an inter-array backside insulating spacer 74. In one embodiment, sidewalls of the backside insulating spacers 74 have a same lateral thickness as a sidewall of the inter-array backside insulating spacer 74.

In one embodiment, each of the first backside trench fill structures 751 and the second backside trench fill structures 752 comprises a respective conductive via structure 76; and the inter-array backside trench fill structure 753 comprises an inter-array conductive via structure 76 having a same material composition as the conductive via structures 76 of the first backside trench fill structures 751 and the second backside trench fill structures 752.

In the first embodiment, the three-dimensional memory device comprises a peripheral circuit 710 that includes: a first bit line driver circuit 630 electrically connected to the first bit lines 981; and a second bit line driver circuit 630 electrically connected to the second bit lines 982. In one embodiment, the first three-dimensional memory plane P0 and the second three-dimensional memory plane P1 are located within a memory die 900 comprising memory-side bonding pads 998; and the peripheral circuit 710 is located within a logic die 700 comprising logic-side bonding pads 798 which are bonded to a respective one of the memory-side bonding pads 998.

In second embodiment of FIG. 24, the peripheral circuit 710 is located between a substrate 9 and a combination of the first three-dimensional memory plane P0 and the second three-dimensional memory plane P1; and the three-dimensional memory device comprises metal interconnect structures 780 embedded within dielectric material layers 760 and providing electrical connection between the peripheral circuit 710 and the first bit lines 981, the second bit lines 982, the first word lines (146, 246), and the second word lines (246, 246).

In one embodiment shown in FIG. 19, the memory device further comprises a substrate 9 containing a source line which is electrically connected to each of the first memory opening fill structures 58 and the second memory opening fill structures 58.

In another embodiment shown in FIGS. 20A and 20B, the memory device further comprises a first substrate portion 9A containing a first source line located in the first memory plane P0 and contacting each of the first memory opening fill structures 58 and not contacting any of the second memory opening fill structures 58; and a second substrate portion 9B containing a second source line located in the second memory plane P1, contacting each of the second memory opening fill structures and not contacting the first substrate portion 9A or any of the first memory opening fill structures 58.

In another embodiment shown in FIG. 22, the memory device further comprises a source line 109 which is electrically connected to each of the first memory opening fill structures and the second memory opening fill structures.

In another embodiment shown in FIG. 23, the memory device further comprises a first source line 109A located in the first memory plane P0 and contacting each of the first memory opening fill structures and not contacting any of the second memory opening fill structures; and a second source line 109B located in the second memory plane P1, contacting each of the second memory opening fill structures and not contacting the first source line 109A or any of the first memory opening fill structures.

The embodiments of the present disclosure improve access speed during programming, reading and erasing operations and improve random access speed during the programming and reading operations due to reduced block size. The reduced block size also permits efficient data management. In some embodiments, the source line area is matched to the memory plane area, which permits reduction of power consumption. Furthermore, the chip size is reduced by avoiding the dummy staircase regions between adjacent memory planes.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a first three-dimensional memory plane including first alternating stacks of first insulating layers and first word lines, first memory openings vertically extending through a respective one of the first alternating stacks and filled with first memory opening fill structures including a respective first vertical semiconductor channel and first memory film, and first bit lines overlying the first alternating stacks, extending in a bit line direction over an area of the first alternating stacks, and electrically connected to a respective subset of the first vertical semiconductor channels;
a second three-dimensional memory plane spaced from the first three-dimensional memory plane along the bit line direction, the second three-dimensional memory plane including second alternating stacks of second insulating layers and second word lines, second memory openings vertically extending through a respective one of the second alternating stacks and filled with second memory opening fill structures including a respective second vertical semiconductor channel and second memory film, and second bit lines overlying the second alternating stacks, extending in the bit line direction over the area of the second alternating stacks and electrically connected to a respective subset of the second vertical semiconductor channels and electrically isolated from each of the first vertical semiconductor channels and the first bit lines;
an inter-array backside trench laterally extending along a word line direction which is perpendicular to the bit line direction between the first three-dimensional memory plane and the second three-dimensional memory plane and filled with an inter-array backside trench fill structure comprising an inter-array backside insulating material portion; and
a cut region extending along the word line direction and located over the inter-array backside trench at the level of the first bit lines and the second bit lines such that the first bit lines and the second bit lines do not cross over the cut region which comprises a boundary between the first and the second three-dimensional memory planes.

2. The three-dimensional memory device of claim 1, wherein:
the first bit lines do not have any areal overlap with the area of the second alternating stacks in a plan view; and
the second bit lines do not have any areal overlap with the area of the first alternating stacks in the plan view.

3. The three-dimensional memory device of claim 1, wherein the first bit lines and the second bit lines do not have any areal overlap with an area of the inter-array backside trench in a plan view.

4. The three-dimensional memory device of claim 1, wherein:
the first alternating stacks comprise first memory blocks which are laterally spaced from each other by first backside trenches laterally extending along the word line direction and filled with first backside trench fill structures; and
the second alternating stacks comprise second memory blocks which are laterally spaced from each other by second backside trenches laterally extending along the word line direction and filled with second backside trench fill structures.

5. The three-dimensional memory device of claim 4, wherein each of the first backside trench fill structures and the second backside trench fill structures comprises a respective backside insulating material portion having a same material composition as the inter-array backside insulating material portion.

6. The three-dimensional memory device of claim 5, wherein:
each of the backside insulating material portions comprises a respective backside insulating spacer; and
the inter-array backside insulating material portion comprises an inter-array backside insulating spacer.

7. The three-dimensional memory device of claim 6, wherein sidewalls of the backside insulating spacers have a same lateral thickness as a sidewall of the inter-array backside insulating spacer.

8. The three-dimensional memory device of claim 5, wherein:
each of the first backside trench fill structures and the second backside trench fill structures comprises a respective conductive via structure; and
the inter-array backside trench fill structure comprises an inter-array conductive via structure having a same material composition as the conductive via structures of the first backside trench fill structures and the second backside trench fill structures.

9. The three-dimensional memory device of claim 1, further comprising a peripheral circuit comprising:
a first bit line driver circuit electrically connected to the first bit lines; and
a second bit line driver circuit electrically connected to the second bit lines.

10. The three-dimensional memory device of claim 1, wherein:
the first three-dimensional memory plane and the second three-dimensional memory plane are located within a memory die comprising memory-side bonding pads;
a peripheral circuit is located within a logic die comprising logic-side bonding pads which are bonded to a respective one of the memory-side bonding pads; and
the logic die overlies the topmost surfaces of the first alternating stacks and the second alternating stacks.

11. The three-dimensional memory device of claim 10, wherein:

the peripheral circuit is located between a substrate of the logic die and a combination of the first three-dimensional memory plane and the second three-dimensional memory plane;
the three-dimensional memory device comprises metal interconnect structures embedded within dielectric material layers and providing electrical connection between the peripheral circuit and the first bit lines, the second bit lines, the first word lines, and the second word lines; and
the substrate of the logic die is more distal from a horizontal plane including a bonding interface between the memory die and the logic die than the peripheral circuit is from the horizontal plane.

12. The three-dimensional memory device of claim 10, wherein the peripheral circuit comprises:
a first word line driver circuit electrically connected to the first word lines of the first three-dimensional memory plane and electrically isolated from the second three-dimensional memory plane; and
a second word line driver circuit electrically connected to the second word lines of the second three-dimensional memory plane and electrically isolated from the first three-dimensional memory plane.

13. The three-dimensional memory device of claim 1, further comprising:
a first semiconductor material layer electrically connected to end portions of the first vertical semiconductor channels, underlying the first alternating stacks, and having an areal overlap with the first alternating stacks in a plan view along a vertical direction and not having any areal overlap with the second alternating stacks in the plan view; and
a second semiconductor material layer electrically connected to end portions of the second vertical semiconductor channels, underlying the second alternating stacks, and having an areal overlap with the second alternating stacks in the plan view and not having any areal overlap with the first alternating stacks in the plan view,
wherein the second semiconductor material layer and the first semiconductor material layer are discrete semiconductor material layers that are not in direct contact with each other, are laterally spaced apart from each other by a gap in which a bottom surface of the inter-array backside trench fill structure is exposed, and are electrically isolated from each other, wherein the gap laterally extends along the word line direction.

14. The three-dimensional memory device of claim 13, wherein:
the first semiconductor material layer comprises a first source line located in the first three-dimensional memory plane and contacting each of the first memory opening fill structures and not contacting any of the second memory opening fill structures; and
the second semiconductor material layer comprises a second source line located in the second three-dimensional memory plane, contacting each of the second memory opening fill structures and not contacting the first substrate portion or any of the first memory opening fill structures.

15. The three-dimensional memory device of claim 13, wherein a width of the gap between the first semiconductor material layer and the second semiconductor material layer is not less than a lateral distance between the first three-dimensional memory plane and the second three-dimensional memory plane.

16. The three-dimensional memory device of claim 13, wherein a surface of the inter-array backside trench fill structure is physically exposed in the gap between the first three-dimensional memory plane and the second three-dimensional memory plane.

17. The three-dimensional memory device of claim 13, wherein the inter-array backside trench fill structure does not have any areal overlap with any portion of the first semiconductor material layer in the plan view, and does not have any areal overlap with any portion of the second semiconductor material layer in the plan view.

18. The three-dimensional memory device of claim 1, wherein:
the first alternating stacks within the first three-dimensional memory plane are laterally spaced apart from each other by first backside trench fill structures that laterally extend along the word line direction in the first three-dimensional memory plane;
the second alternating stacks within the second three-dimensional memory plane are laterally spaced apart from each other by second backside trench fill structures that laterally extend along the word line direction in the second three-dimensional plane and comprising a same set of at least one material as the first backside trench fill structures; and
the inter-array backside trench fill structure laterally extends along the word line direction and comprises the same set of at least one material as the first backside trench fill structures.

19. The three-dimensional memory device of claim 18, wherein the inter-array backside trench fill structure further comprises a conductive via structure that is laterally surrounded by the inter-array backside insulating material portion, and is electrically isolated from the first alternating stacks, the second alternating stacks, the first semiconductor material layers, and the second semiconductor material layers.

20. The three-dimensional memory device of claim 1, wherein the first bit lines are located entirely within an area of the first three-dimensional memory plane, and the second bit lines are located entirely within an area of the second three-dimensional memory plane.

* * * * *